(12) United States Patent
Sasaki

(10) Patent No.: US 7,579,131 B2
(45) Date of Patent: Aug. 25, 2009

(54) POSITIVE RESIST COMPOSITION AND METHOD OF FORMING RESIST PATTERN USING THE SAME

(75) Inventor: Tomoya Sasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/897,112

(22) Filed: Jul. 23, 2004

(65) Prior Publication Data

US 2005/0026073 A1    Feb. 3, 2005

(30) Foreign Application Priority Data

Jul. 30, 2003    (JP) .............................. 2003-282916

(51) Int. Cl.
*G03F 7/039*    (2006.01)
*G03F 7/20*    (2006.01)
*G03F 7/30*    (2006.01)

(52) U.S. Cl. .................... 430/270.1; 430/326; 430/907; 430/914

(58) Field of Classification Search .............. 430/270.1, 430/907, 326, 910, 909, 921, 923, 925
See application file for complete search history.

(56) References Cited

U.S. PATENT DOCUMENTS

| | | | | |
|---|---|---|---|---|
| 6,503,686 | B1 * | 1/2003 | Fryd et al. ................ | 430/270.1 |
| 6,506,535 | B1 * | 1/2003 | Mizutani et al. .......... | 430/270.1 |
| 6,815,143 | B2 * | 11/2004 | Watanabe ................. | 430/270.1 |
| 2001/0041300 | A1 * | 11/2001 | Kodama et al. ............ | 430/170 |
| 2003/0232277 | A1 * | 12/2003 | Sasaki et al. ............. | 430/270.1 |
| 2003/0235781 | A1 * | 12/2003 | Shida et al. .............. | 430/270.1 |
| 2004/0005512 | A1 * | 1/2004 | Mizutani et al. .......... | 430/270.1 |
| 2005/0260519 | A1 * | 11/2005 | Berger et al. ............. | 430/270.1 |

FOREIGN PATENT DOCUMENTS

| | | | |
|---|---|---|---|
| EP | 1319981 A2 * | 6/2003 | |
| WO | WO 00/17712 A1 | 3/2000 | |
| WO | WO 02/31595 A2 | 4/2002 | |

OTHER PUBLICATIONS

Chambers et al, "Dissolution Inhibitors for 157 nm Photolithography", Proceedings of SPIE, vol. 5039 (2003).*
Outlook for 157-nm resist design, R.R. Kunz, et al., Lincoln, Massachusetts Institute of Technology, Part of the SPIE Conference on advances in Resist Technology and Processing XVI, Proceedings of SPIE, vol. 3678, (1999).
Design Strategies for 157 nm Single-Layer Photoresists: Lithographic Evaluation of a Poly (α-trifluoromethyl vinyl alcohol) Copolymer, Dirk Schmalijohann, et al.., Department of Materials Science and Engineering, Cornell University, Advances in Resist Technology and Processing XVII, Proceedings of SPIE, vol. 3999, (2000).
New Materials for 157 nm Photoresists: Characterization and Properties, Michael K. Crawford, et al.., Advances in Resist Technology and Processing XVII, Proceedings of SPIE, vol. 3999, (2000).
Polymers for 157 nm Photoresist Applications: A Progress Report, Kyle Patterson, et al. in Advances in Resist Technology and Processing XVII, Proceedings of SPIE, vol. 3999, (2000).
Moitreyee Mukherjee-Roy et al., "Evaluation of Alignment Target Designs for Cu and Low K Dual Damascene Processes" Proc. of SPIE, (2003) vol. 5038, No. 1, pp. 93-102.
European Search Report dated Jan. 10, 2005.

* cited by examiner

*Primary Examiner*—Sin J. Lee
(74) *Attorney, Agent, or Firm*—Sughrue Mion, PLLC

(57)    ABSTRACT

A positive resist composition comprising:
(A) a fluorine atom-containing resin;
(B) a compound generating an acid upon irradiation with an actinic ray; and
(C) a non-polymer dissolution inhibitor having a specific structure.

21 Claims, No Drawings

POSITIVE RESIST COMPOSITION AND METHOD OF FORMING RESIST PATTERN USING THE SAME

BACKGROUND OF THE INVENTION

1. Field of the Invention

The present invention relates to a positive resist composition suitably used in the microlithography process at the production of VLSI or high-capacity microchip or in other photo-fabrication processes. More specifically, the present invention relates to a positive resist composition capable of forming a highly refined pattern by using vacuum ultraviolet light of 160 nm or less.

2. Description of the Related Art

The integration degree of integrated circuits is more and more increasing and in the production of a semiconductor substrate of VLSI or the like, an ultrafine pattern comprising lines having a width of quarter-micron or less must be processed. One known method for attaining the refinement of pattern is to use an exposure light source having a short wavelength at the formation of a resist pattern.

For example, in the production of a semiconductor device having an integration degree up to 64 M bits, the i-line (365 nm) of a high-pressure mercury lamp has been used as a light source until today. As the positive resist capable of responding to this light source, a large number of compositions containing a novolak resin and a naphtho-quinonediazide compound as a photosensitive material have been developed and these are sufficiently effective in the processing of lines in a width up to about 0.3 μm. Also, in the production of a semiconductor device having an integration degree of 256 M bits or more, a KrF excimer laser (248 nm) has been used as a light source in place of the i-line.

Furthermore, for the purpose of producing a semiconductor having an integration degree of 1 G bits or more, studies are being recently made on use of a light source having a further shorter wavelength, that is, an ArF excimer laser (193 nm) or in order to form a pattern of 0.1 μm or less, an $F_2$ excimer laser (157 nm).

To cope with this tendency to shorter wavelength of the light source, the constituent components of the resist material and the compound structure thereof are also greatly changing.

As a resist composition for exposure by a KrF excimer laser, there has been developed a so-called chemical amplification-type resist composition where a resin having a basic skeleton of poly(hydroxystyrene) which shows small absorption in the region of 248 nm, and protected with an acid decomposable group is used as the main component and this is combined with a compound capable of generating an acid upon irradiation with far ultraviolet ray.

Also, as the resist composition for exposure by an ArF excimer laser (193 nm), there has been developed a chemical amplification-type resist using an acid-decomposable resin where an alicyclic structure having no absorption at 193 nm is introduced into the main or side chain of the polymer.

However, for the $F_2$ excimer laser ray (157 nm), this alicyclic resin is found to show large absorption in the region of 157 nm and be insufficient for obtaining the objective pattern of 0.1 μm or less. On the other hand, a resin having introduced thereinto a fluorine atom (perfluoro structure) has been reported to have sufficiently high transparency to light at 157 nm in *Proc. SPIE.*, Vol. 3678, page 13 (1999) and effective fluororesin structures have been proposed, for example, in *Proc. SPIE.*, Vol. 3999, page 330 (2000), *Proc. SPIE.*, Vol. 3999, page 357 (2000), *Proc. SPIE.*, Vol. 3999, page 365 (2000) and International Publication WO-00/17712, pamphlet. Thus, studies on the resist composition using a fluorine-containing resin are being made.

However, the fluororesin-containing resist composition for exposure with $F_2$ excimer laser light has a problem in the sensitivity or in that at the formation of a line-and-space pattern, the top end of line is rounded (round top) or a large amount of development residue (scum) remains in the bottom of space. Improvements of these points are demanded.

SUMMARY OF THE INVENTION

Accordingly, an object of the present invention is to provide a positive resist composition suitable for use with an exposure light source of emitting light of 160 nm or less, particularly, $F_2$ excimer laser light (157 nm). More specifically, the object of the present invention is to provide a positive resist composition exhibiting sufficiently high transmittance on use of a light source of 157 nm and satisfying the requirements regarding coatability and development defect.

As a result of intensive investigations by taking account of the above-described various properties, the present inventors have found that the object of the present invention can be successfully attained by use of the following specific composition. The present invention has been accomplished based on this finding.

That is, the present invention has the following constitution.

(1) A positive resist composition comprising:

(A) a fluorine atom-containing resin;

(B) a compound generating an acid upon irradiation with an actinic ray; and (C) a non-polymer dissolution inhibitor represented by one of formula (XA) and formula (XB):

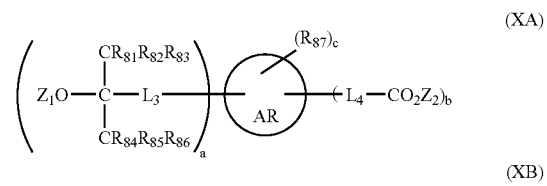

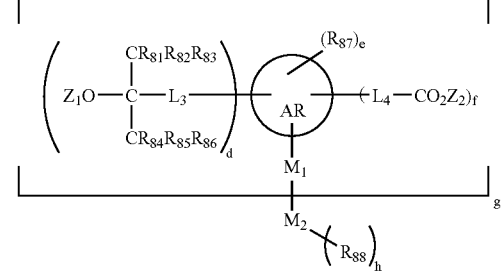

wherein

AR each independently represents an alicyclic hydrocarbon group having 7 or more carbon atoms, $R_{81}$ to $R_{86}$ each independently represents a hydrogen atom, a fluorine atom or an alkyl group, provided that at least one of $R_{81}$ to $R_{86}$ is a fluorine atom, $R_{87}$ and $R_{88}$ each independently represents a halogen atom, a hydroxy group, an alkoxy group, a cyano group or an alkyl group, $L_3$ and $L_4$ each independently represents a single bond or a divalent linking group, $Z_1$ and $Z_2$ each independently represents a hydrogen atom, an acid-decomposable group or a non-acid-decomposable group, provided that the compounds represented by formulae (XA) and (XB) each contains two or more acid-decomposable groups, $M_1$ represents a single bond or a divalent linking group, $M_2$ represents a (g+h)-valent linking group, a and b each independently represents an integer of 0 to 5, provided that a and b satisfy $2 \leq a+b \leq 10$, c represents an integer of 0 to 5, d and e each independently represents an integer of 0 to 5, provided that d and e satisfy $1 \leq d+e \leq 10$, f each independently represents an integer of 0 to 5, g represents an integer of 2 to 6, and h represents an integer of 0 to 5.

(2) The positive resist composition as described in (1) above, wherein the resin (A) is soluble in an alkaline developer.

(3) The positive resist composition as described in (1) or (2) above, wherein the resin (A) is a resin which decomposes under the action of an acid to increase a solubility of the resin (A) in an alkali developer.

(4) The positive resist composition as described in any one of (1) to (3) above, wherein the resin (A) comprises a repeating unit containing a group represented by formula (a):

$$\begin{array}{c} CR_{31}R_{32}R_{33} \\ | \\ -C-OY_0 \\ | \\ CR_{34}R_{35}R_{36} \end{array} \quad (a)$$

wherein $R_{31}$ to $R_{36}$ each independently represents a hydrogen atom, a fluorine atom or an alkyl group, provided that at least one of $R_{31}$ to $R_{36}$ is a fluorine atom or an alkyl group in which at least one of the hydrogen atoms has been substituted by a fluorine atom, and one of $R_{31}$ to $R_{36}$ may form a single bond or a carbon chain to be connected to a main chain of the resin (A); and $Y_0$ represents a hydrogen atom or an organic group.

(5) The positive resist composition as described in any one of (1) to (4) above, wherein the resin (A) has a repeating unit containing one of (a) a carboxyl group and (b) a group where a carboxyl group is protected by an acid-decomposable group.

(6) The positive resist composition as described in (1) above, wherein the resin (A) comprises at least one repeating unit selected from the group consisting of repeating units represented by the formulae (I) to (XII):

(I)

(II)

(III)

wherein $R_0$ and $R_1$ are the same or different and each represents a hydrogen atom, a fluorine atom, an alkyl group, a cycloalkyl group or an aryl group;

$R_2$ to $R_4$ are the same or different and each represents an alkyl group, a cycloalkyl group or an aryl group; and $R_0$ and $R_1$, $R_0$ and $R_2$, or $R_3$ and $R_4$ may combine to form a ring, (IV)

(V)

wherein $R_5$ represents a hydrogen atom, an alkyl group, a cycloalkyl group, an acyl group, an alkoxycarbonyl group or an acid-decomposable group;

$R_6$ represents a hydrogen atom, an alkyl group, a cycloalkyl group, an acyl group, an alkoxycarbonyl group or an acid-decomposable group;

$R_7$ each independently represents a halogen atom, an alkyl group, a cycloalkyl group or an alkoxy group;

n represents 0 or 1;

n' represents an integer of 0 to 7;

m' represents an integer of 1 to 5;

$A_1$ represents a single bond, a divalent alkylene, alkenylene, cycloalkylene or arylene group, —O—CO—$R_{22}$—, —CO—O—$R_{23}$— or —CO—N($R_{24}$)—$R_{25}$—;

$R_{22}$, $R_{23}$ and $R_{25}$ each represents a single bond or a divalent alkylene, alkenylene, cycloalkylene or arylene group which may have an ether group, an ester group, an amido group, a urethane group or a ureido group; and $R_{24}$ represents a hydrogen atom, an alkyl group, a cycloalkyl group, an aralkyl group or an aryl group,

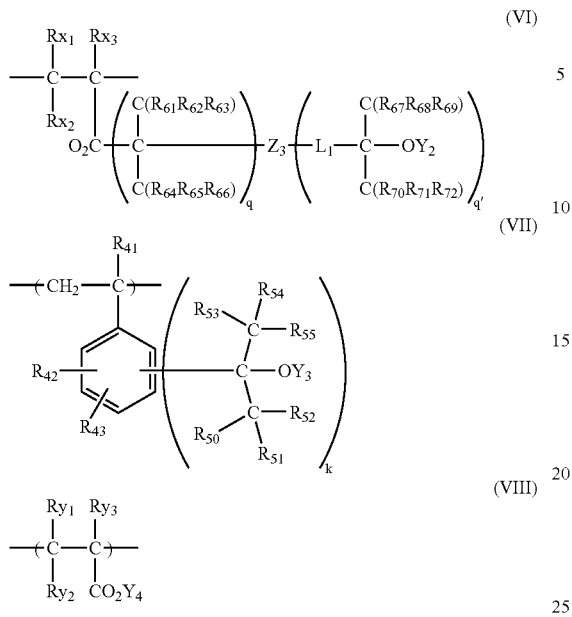

(VI)

(VII)

(VIII)

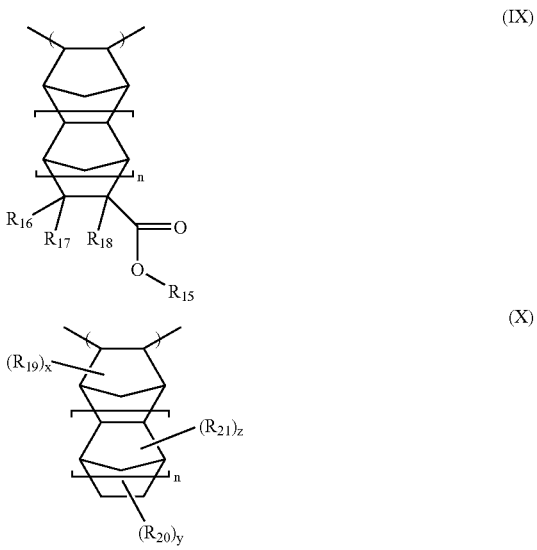

(IX)

(X)

wherein in formula (VI),

Rx$_1$ to Rx$_3$ each independently represents a hydrogen atom, a fluorine atom, a chlorine atom, a cyano group or an alkyl group where at least one hydrogen atom is substituted by a fluorine atom;

R$_{61}$ to R$_{66}$ each independently represents a hydrogen atom, a fluorine atom or an alkyl group, provided that at least one of R$_{61}$ to R$_{66}$ is a fluorine atom;

R$_{67}$ to R$_{72}$ each independently represents a hydrogen atom, a fluorine atom or an alkyl group, provided that at least one of R$_{67}$ to R$_{72}$ is a fluorine atom;

Z$_3$ represents a benzene residue, a cyclohexane residue, an adamantane residue or a norbornane residue;

L$_1$ represents a single bond or a divalent linking group;

q represents 0 or 1;

q' represents an integer of 1 to 5; and

Y$_2$ represents a hydrogen atom or an organic group, in formula (VII),

R$_{41}$ represents a hydrogen atom, a halogen atom, a cyano group or an alkyl group;

R$_{42}$ and R$_{43}$ each independently represents a hydrogen atom, a halogen atom, a hydroxyl group, a cyano group, an alkoxy group, an acyl group, an alkyl group, an alkenyl group, an aralkyl group or an aryl group;

R$_{50}$ to R$_{55}$ each independently represents a hydrogen atom, a fluorine atom or an alkyl group, provided that at least one of R$_{50}$ to R$_{55}$ is a fluorine atom or an alkyl group where at least one hydrogen atom is substituted by a fluorine atom;

k represents an integer of 1 to 5; and

Y$_3$ represents a hydrogen atom or an organic group, and in formula (VIII),

Ry$_1$ to Ry$_3$ each independently represents a hydrogen atom, a fluorine atom, a chlorine atom, a cyano group or an alkyl group where at least one hydrogen atom is substituted by a fluorine atom;

wherein

R$_{15}$ represents a hydrogen atom, a hydroxyalkyl group, an alkyl group having a fluorine atom, a cycloalkyl group having a fluorine atom, an alkenyl group having a fluorine atom, an aralkyl group having a fluorine atom, an aryl group having a fluorine atom, or an acid-decomposable group;

R$_{16}$, R$_{17}$ and R$_{18}$ are the same or different and each represents a hydrogen atom, a halogen atom, a cyano group, an alkyl group, an alkoxy group or —CO—O—R$_{15}$;

R$_{19}$, R$_{20}$ and R$_{21}$ are the same or different and each represents a hydrogen atom, a fluorine atom, an alkyl group having a fluorine atom, a cycloalkyl group having a fluorine atom, an alkenyl group having a fluorine atom, an aralkyl group having a fluorine atom, an aryl group having a fluorine atom, an alkoxy group having a fluorine atom, or a hydroxyalkyl group, provided that at least one of R$_{19}$, R$_{20}$ and R$_{21}$ is a group except for a hydrogen atom;

n represents 0 or 1; and x, y and z each represents an integer of 0 to 4;

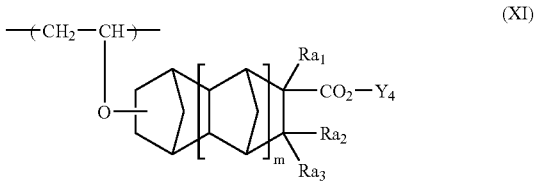

(XI)

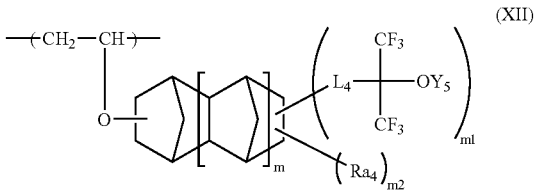

(XII)

wherein in formula (XI),

Ra$_1$ to Ra$_3$ each independently represents a hydrogen atom, a halogen atom, a hydroxyl group, a cyano group, an alkyl group, an aryl group, an alkoxy group or an aralkyl group;

$Y_4$ represents a hydrogen atom or an organic group; and m represents 1 or 2; and in formula (XII), $Ra_4$ each independently represents a hydrogen atom, a halogen atom, a hydroxyl group, a cyano group, an alkyl group, an aryl group, an alkoxy group or an aralkyl group, $Y_5$ represents a hydrogen atom or an organic group;

$L_4$ represents a single bond or a divalent linking group;

m represents 1 or 2;

m1 represents an integer of 1 to 5; and m2 represents an integer of 0 to 7.

(7) The positive resist composition as described in any one of (1) to (6) above, wherein AR in formula (XA) or (XB) of the non-polymer dissolution inhibitor (C) has a structure represented by the (a), (b), (c) or (d):

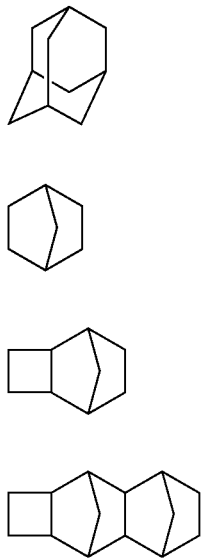

(8) The positive resist composition as described in any one of (1) to (7) above, further comprising (E) a basic compound.

(9) The positive resist composition as described in any one of (1) to (8) above, wherein the compound (B) comprises (B1) a compound generating an organic sulfonic acid under the action of an actinic ray.

(10) The positive resist composition as descried in (9) above, wherein the compound (B1) comprises (a) a compound generating an organic sulfonic acid containing at least one fluorine atom under the action of an actinic ray and (b) a compound cgenerating an organic sulfonic acid containing no fluorine atom under the action of an actinic ray.

(11) The positive resist composition as described in (9) or (10) above, wherein the component (B) comprises (B2) a compound generating a carboxylic acid under the action of an actinic ray.

(12) The positive resist composition as described in (1) to (11) above, further comprising a surfactant.

(13) The positive resist composition as described in (1) to (12) above, further comprising a solvent.

(14) The positive resist composition as described in (13) above, wherein the solvent comprises propylene glycol monomethyl ether acetate.

(15) The positive resist composition as described in (14) above, wherein the solvent comprises propylene glycol monomethyl ether.

(16) A method of forming a resist pattern comprising:

coating the positive resist composition as described in (1) above, on a substrate, to form a resultant coating;

irradiating a resultant coating with an actinic ray, to form a irradiated coating; and developing the irradiated coating.

DETAILED DESCRIPTION OF THE INVENTION

The present invention is described in detail below.

In the present invention, when a group (atomic group) is denoted without specifying whether substituted or unsubstituted, the group includes a group having no substituent and a group having a substituent. For example, an "alkyl group" includes not only an alkyl group having no substituent (unsubstituted alkyl group) but also an alkyl group having a substituent (substituted alkyl group).

[1] Fluorine Atom-containing Resin (A)

The fluorine atom-containing resin as the component (A) for use in the present invention is a resin having a fluorine atom-substituted structure in the main chain and/or the side chain of a polymer. Hereinafter, this is referred to also as the resin (A) or the component (A). This resin is preferably a resin soluble in an alkali developer (alkali-soluble resin), more preferably a resin having a group which decomposes under the action of an acid to increase the solubility in an alkali developer (acid-decomposable resin).

This resin is still more preferably a fluorine atom-containing resin having at least one moiety selected from a perfluoroalkylene group and a perfluoroarylene group in the main chain of the polymer skeleton, or having at least one moiety selected from a perfluoroalkyl group, a perfluoroaryl group, a hexafluoro-2-propanol group and a hexafluoro-2-propanol group with the OH group being protected, in the side chain of the polymer skeleton.

The fluorine atom-containing resin for use in the present invention is preferably a resin having a repeating unit containing a group represented by formula (a):

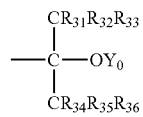

wherein $R_{31}$ to $R_{36}$ each independently represents a hydrogen atom, a fluorine atom or an alkyl group, provided that at least one of $R_{31}$ to $R_{36}$ is a fluorine atom or an alkyl group in which at least one of the hydrogen atoms has been substituted by a fluorine atom, and one of $R_{31}$ to $R_{36}$ may form a single bond or a carbon chain and be connected to the main chain of the resin as the component (A), and $Y_0$ represents a hydrogen atom or an organic group.

In formula (a), the alkyl group represented by $R_{31}$ to $R_{36}$ may have a substituent and is, for example, an alkyl group having from 1 to 8 carbon atoms and specific preferred examples thereof include a methyl group, an ethyl group, a propyl group, an n-butyl group, a sec-butyl group, a tert-butyl group, a hexyl group, a 2-ethylhexyl group and an octyl group.

One of $R_{31}$ to $R_{36}$ may be connected to the main chain of the fluorine atom-containing resin through a carbon chain. This carbon chain is preferably an alkylene group having from 1 to 10 carbon atoms and examples thereof include a methylene group, an ethylene group, a propylene group, a butylene group, a hexylene group and an octylene group.

$Y_0$ represents a hydrogen atom or an organic group and the organic group may be an acid-decomposable organic group (acid-decomposable group) or a non-acid-decomposable organic group (non-acid-decomposable group).

The acid-decomposable group is not particularly limited as long as it decomposes under the action of an acid to form a hydrophilic group such as hydroxyl group and carboxyl group and thereby increase the solubility in an alkali developer, but the acid-decomposable group is preferably a group represented by —C($R_{11a}$)($R_{12a}$)($R_{13a}$), —C($R_{14a}$)($R_{15a}$)(O$R_{16a}$) or —CO—O C ($R_{11a}$)($R_{12a}$)($R_{13a}$)

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$ or two of $R_{14a}$, $R_{15a}$ and $R_{16a}$ may combine to form a ring.

The alkyl group represented by $R_{11a}$ to $R_{13a}$, $R_{14a}$, $R_{15a}$ and $R_{16a}$ may have a substituent and is preferably an alkyl group having from 1 to 8 carbon atoms and examples thereof include a methyl group, an ethyl group, a propyl group, a n-butyl group, a sec-butyl group, a hexyl group and a 2-ethylhexyl group and an octyl group.

The cycloalkyl group represented by $R_{11a}$ to $R_{13a}$ and $R_{16a}$ may be monocyclic or polycyclic. The monocyclic cycloalkyl group is preferably a cycloalkyl group having from 3 to 8 carbon atoms and examples thereof include a cyclopropyl group, a cyclopentyl group, a cyclohexyl group, a cyclobutyl group and a cyclooctyl group. The polycyclic cycloalkyl group is preferably a cycloalkyl group having from 6 to 20 carbon atom and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. In the cycloalkyl group, a part of carbon atoms may be substituted by a heteroatom such as oxygen atom.

The aryl group represented by $R_{11a}$ to $R_{13a}$ and $R_{16a}$ is preferably an aryl group having from 6 to 10 carbon atoms and examples thereof include a phenyl group, a tolyl group, a dimethylphenyl group, a 2,4,6-trimethylphenyl group, a naphthyl group, an anthryl group and a 9,10-dimethoxy-anthryl group.

The aralkyl group represented by $R_{11a}$ to $R_{13a}$ and $R_{16a}$ is preferably an aralkyl group having from 7 to 12 carbon atoms and examples thereof include a benzyl group, a phenethyl group and a naphthylmethyl group.

The alkenyl group represented by $R_{11a}$ to $R_{13a}$ and $R_{16a}$ is preferably an alkenyl group having from 2 to 8 carbon atoms and examples thereof include a vinyl group, an allyl group, a butenyl group and a cyclohexenyl group.

Examples of the substituent which $R_{11a}$ to $R_{13a}$, $R_{14a}$, $R_{15a}$ and $R_{16a}$ may have include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group.

Specific preferred examples of the acid-decomposable group include a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal group such as 1-alkoxy-1-ethoxy group, 1-alkoxy-1-methoxy group and tetrahydropyranyl group, a tert-alkylcarbonyl group and a tert-alkylcarbonylmethyl group.

The non-acid-decomposable organic group is an organic group which does not decompose under the action of an acid and examples thereof include an alkyl group, an aryl group, an aralkyl group, an alkoxy group, an alkoxycarbonyl group, an amido group and a cyano group, which groups each does not decompose under the action of an acid. The alkyl group is preferably a linear, branched or cyclic alkyl group having from 1 to 10 carbon atoms and examples thereof include a methyl group, an ethyl group, a propyl group, a n-butyl group, a sec-butyl group, a hexyl group, a 2-ethylhexyl group, an octyl group a cyclopropyl group, a cyclobutyl group, a cyclohexyl group and an adamantyl group. The aryl group is preferably an aryl group having 6 to 14 carbon atoms and examples thereof include a phenyl group, a naphthyl group and an anthracenyl group. The aralkyl group is preferably an aralkyl group having from 6 to 12 carbon atoms and examples thereof include a benzyl group, a phenethyl group and a cumyl group. The alkoxy group and the alkoxy group in the alkoxycarbonyl group are preferably an alkoxy group having from 1 to 5 carbon atoms and examples thereof include a methoxy group, an ethoxy group, a propoxy group, a n-butoxy group and isobutoxy group. The alkyl group, aryl group, aralkyl group, alkoxy group and alkoxycarbonyl group represented by Za each may have a substituent such as hydroxyl group.

The group represented by formula (a) may be introduced, for example, into the repeating unit represented by formulae (IV) to (VII).

The fluorine atom-containing resin for use in the present invention preferably further has a repeating unit containing a carboxyl group or a group where a carboxyl group is protected by an acid-decomposable group.

Examples of the group where a carboxyl group is protected by an acid-decomposable group, which is used in the present invention, include —COO—C($R_{36}$)($R_{37}$)($R_{38}$), —COO—C($R_{39}$)($R_{40}$)(O$R_{41}$), —O—COO—C($R_{36}$)($R_{37}$)($R_{38}$) and —O—C($R_{10}$)($R_{02}$)COO—C($R_{36}$)($R_{37}$)($R_{38}$).

The group where a carboxyl group is protected by an acid-decomposable group can be introduced, for example, in the repeating unit represented by formulae (IV) to (IX).

$R_{36}$, $R_{37}$ and $R_{38}$ each is the same as those described above for $R_{11a}$, $R_{12a}$ and $R_{13a}$, respectively. $R_{39}$ and $R_{40}$ each is same as those described above for $R_{14a}$ and $R_{15a}$, respectively. $R_{41}$ is same as those described above for $R_{16}$a. $R_{01}$ and $R_{02}$ each is same as those described above for $R_{14a}$ and $R_{15a}$, respectively. Two of $R_{36}$, $R_{37}$ and $R_{38}$ or two of $R_{39}$, $R_{40}$ and $R_{41}$ may combine to form a ring.

The fluorine atom-containing resin for use in the present invention is more preferably a resin having at least one repeating unit selected from the group consisting of repeating units represented by formulae (I) to (XII):

(I)

(II)

-continued

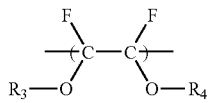
(III)

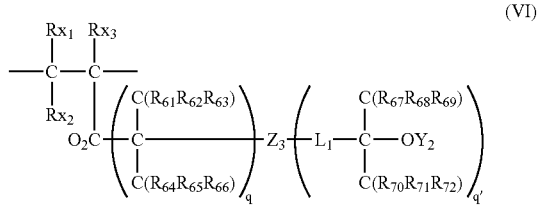
(VI)

wherein $R_0$ and $R_1$ may be the same or different and each represents a hydrogen atom, a fluorine atom, an alkyl group, a cycloalkyl group or an aryl group, $R_2$ to $R_4$ may be the same or different and each represents an alkyl group, a cycloalkyl group or an aryl group, and $R_0$ and $R_1$, $R_0$ and $R_2$, or $R_3$ and $R_4$ may combine to form a ring;

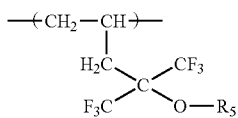
(IV)

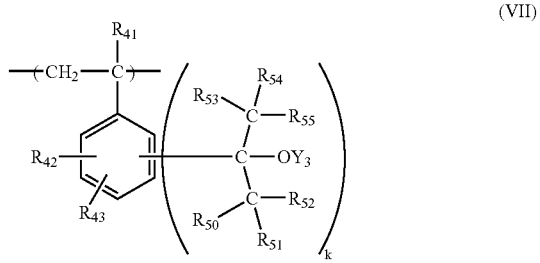
(VII)

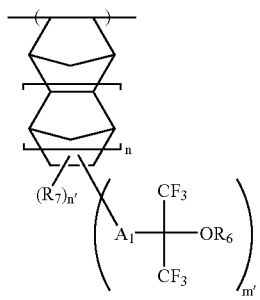
(V)

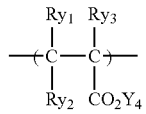
(VIII)

wherein $R_5$ represents a hydrogen atom, an alkyl group, a cycloalkyl group, an acyl group, an alkoxycarbonyl group or an acid-decomposable group, $R_6$ represents a hydrogen atom, an alkyl group, a cycloalkyl group, an acyl group, an alkoxycarbonyl group or an acid-decomposable group, $R_7$ each independently represents a halogen atom, an alkyl group, a cycloalkyl group or an alkoxy group, n represents 0 or 1, n' represents an integer of 0 to 7, m' represents an integer of 1 to 5, $A_1$ represents a single bond, a divalent alkylene, alkenylene, cycloalkylene or arylene group, —O—CO—$R_{22}$—, —CO—O—$R_{23}$— or —CO—N($R_{24}$)—$R_{25}$—, $R_{22}$, $R_{23}$ and $R_{25}$ each represents a single bond or a divalent alkylene, alkenylene, cycloalkylene or arylene group which may have an ether group, an ester group, an amido group, a urethane group or a ureido group, and $R_{24}$ represents a hydrogen atom, an alkyl group, a cycloalkyl group, an aralkyl group or an aryl group provided that in formula (V), the group represented by $R_7$ and the group represented by $A_1(CF_3)_2OR_6$ may be substituted at any position of the carbon ring structure;

wherein in formula (VI), $Rx_1$ to $Rx_3$ each independently represents a hydrogen atom, a fluorine atom, a chlorine atom, a cyano group or an alkyl group in which at least one of the hydrogen atoms has been substituted by a fluorine atom, $R_{61}$ to $R_{66}$ each independently represents a hydrogen atom, a fluorine atom or an alkyl group, provided that at least one of $R_{61}$ to $R_{66}$ is a fluorine atom, $R_{67}$ to $R_{72}$ each independently represents a hydrogen atom, a fluorine atom or an alkyl group, provided that at least one of $R_{67}$ to $R_{72}$ is a fluorine atom, $Z_3$ represents a benzene residue, a cyclohexane residue, an adamantane residue or a norbornane residue, $L_1$ represents a single bond or a divalent linking group, q represents 0 or 1, q' represents an integer of 1 to 5, and $Y_2$ represents a hydrogen atom or an organic group, in formula (VII), $R_{41}$ represents a hydrogen atom, a halogen atom, a cyano group or an alkyl group, $R_{42}$ and $R_{43}$ each independently represents a hydrogen atom, a halogen atom, a hydroxyl group, a cyano group, an alkoxy group, an acyl group, an alkyl group, an alkenyl group, an aralkyl group or an aryl group, $R_{50}$ to $R_{55}$ each independently represents a hydrogen atom, a fluorine atom or an alkyl group, provided that at least one of $R_{50}$ to $R_{55}$ is a fluorine atom or an alkyl group in which at least one of the hydrogen atoms has been substituted by a fluorine atom, k represents an integer of 1 to 5, and $Y_3$ represents a hydrogen atom or an organic group, and in formula (VIII), $Ry_1$ to $Ry_3$ each independently represents a hydrogen atom, a fluorine atom, a chlorine atom, a cyano group or an alkyl group in which at least one of the hydrogen atoms has been substituted by a fluorine atom, and $Y_4$ represents a hydrogen atom or an organic group;

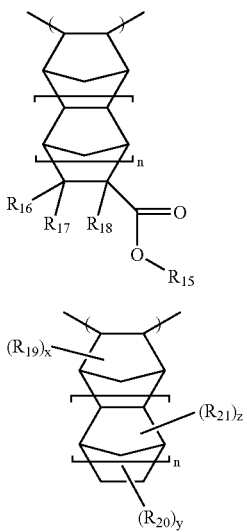

wherein $R_{15}$ represents a hydrogen atom, a hydroxyalkyl group, an alkyl group having a fluorine atom, a cycloalkyl group having a fluorine atom, an alkenyl group having a fluorine atom, an aralkyl group having a fluorine atom, an aryl group having a fluorine atom, or an acid-decomposable group, $R_{16}$, $R_{17}$ and $R_{18}$ may be the same or different and each represents a hydrogen atom, a halogen atom, a cyano group, an alkyl group, an alkoxy group or —CO—O—$R_{15}$, $R_{19}$, $R_{20}$ and $R_{21}$ may be the same or different and each represents a hydrogen atom, a fluorine atom, an alkyl group having a fluorine atom, a cycloalkyl group having a fluorine atom, an alkenyl group having a fluorine atom, an aralkyl group having a fluorine atom, an aryl group having a fluorine atom, an alkoxy group having a fluorine atom, or a hydroxyalkyl group, provided that at least one of $R_{19}$, $R_{20}$ and $R_{21}$ is a group except for a hydrogen atom, n represents 0 or 1, and x, y and z each represents an integer of 0 to 4;

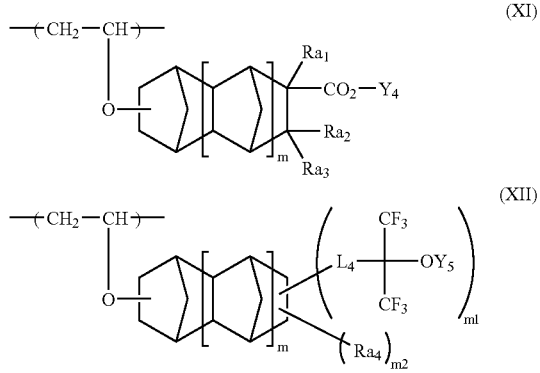

wherein in formula (XI), $Ra_1$ to $Ra_3$ each independently represents a hydrogen atom, a halogen atom, a hydroxyl group, a cyano group, an alkyl group, an aryl group, an alkoxy group or an aralkyl group ($Ra_1$ to $Ra_3$ each is preferably a hydrogen atom or a halogen atom and the halogen atom is preferably a fluorine atom; particularly, $Ra_1$ is preferably a fluorine atom), $Y_4$ represents a hydrogen atom or an organic group, and m represents 1 or 2, and in formula (XII), $Ra_4$ each independently represents a hydrogen atom, a halogen atom, a hydroxyl group, a cyano group, an alkyl group, an aryl group, an alkoxy group or an aralkyl group, $Y_5$ represents a hydrogen atom or an organic group, $L_4$ represents a single bond or a divalent linking group, m represents 1 or 2, m1 represents an integer of 1 to 5, and m2 represents an integer of 0 to 7, provided that in formula (XII), the group represented by $Ra_4$ or the group represented by $L_4(CF_3)_2OY_5$ may be substituted at any position of the carbon ring structure.

In formulae (I) to (XII), the alkyl group may have a substituent and is, for example, an alkyl group having from 1 to 8 carbon atoms and specific preferred examples thereof include a methyl group, an ethyl group, a propyl group, an n-butyl group, a sec-butyl group, a tert-butyl group, a hexyl group, a 2-ethylhexyl group, an octyl group and a haloalkyl group. The haloalkyl group is, for example, a haloalkyl group having from 1 to 4 carbon atoms and specific preferred examples thereof include a chloromethyl group, a chloroethyl group, a chloropropyl group, a chlorobutyl group, a bromomethyl group, a bromoethyl group and a perfluoroalkyl group. Among these, a perfluoroalkyl group is more preferred. The perfluoroalkyl group is, for example, a perfluoroalkyl group having from 4 to 12 carbon atoms and specific preferred examples thereof include a perfluorooctyl group, a perfluorooctylethyl group and a perfluorododecyl group.

The cycloalkyl group may be monocyclic or polycyclic. The monocyclic cycloalkyl group is a cycloalkyl group having from 3 to 8 carbon atoms and preferred examples thereof include a cyclopropyl group, a cyclopentyl group, a cyclohexyl group, a cyclobutyl group and a cyclooctyl group. The polycyclic cycloalkyl group is a cycloalkyl group having from 6 to 20 carbon atom and preferred examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. In the monocyclic or polycyclic cycloalkyl group, a carbon atom may be substituted by a heteroatom such as oxygen atom.

The aryl group is, for example, an aryl group having from 6 to 15 carbon atoms and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The aralkyl group is, for example, an aralkyl group having from 7 to 12 carbon atoms and specific preferred examples thereof include a benzyl group, a phenethyl group and a naphthylmethyl group.

The alkenyl group is, for example, an alkenyl group having from 2 to 8 carbon atoms and specific preferred examples thereof include a vinyl group, an allyl group, a butenyl group and a cyclohexenyl group.

The alkoxy group is, for example, an alkoxy group having from 1 to 8 carbon atoms and specific preferred examples thereof include a methoxy group, an ethoxy group, a n-propoxy group, an iso-propoxy group, a butoxy group, a pentoxy group, an allyloxy group and an octoxy group.

The acyl group is, for example, an acyl group having from 1 to 10 carbon atoms and specific preferred examples thereof include a formyl group, an acetyl group, a propanoyl group, a butanoyl group, a pivaloyl group, an octanoyl group and a benzoyl group.

The alkynyl group is preferably an alkynyl group having from 2 to 5 carbon atoms and examples thereof include an ethynyl group, a propynyl group and a butynyl group.

The alkoxycarbonyl group is preferably a secondary, more preferably tertiary, alkoxycarbonyl group and examples thereof include an i-propoxycarbonyl group, a tert-butoxycarbonyl group, a tert-amyloxycarbonyl group and a 1-methyl-1-cyclohexyloxycarbonyl group.

The halogen atom includes, for example, a fluorine atom, a chlorine atom, a bromine atom and an iodine atom.

The alkylene group is preferably an alkylene group having from 1 to 8 carbon atoms, which may have a substituent, and examples thereof include a methylene group, an ethylene group, a propylene group, a butylene group, a hexylene group and an octylene group.

The alkenylene group is preferably an alkenylene group having from 2 to 6 carbon atoms, which may have a substituent, and examples thereof include an ethenylene group, a propenylene group and a butenylene group.

The cycloalkylene group is preferably a cycloalkylene group having from 5 to 8 carbon atoms, which may have a substituent, and examples thereof include a cyclopentylene group and a cyclohexylene group.

The arylene group is preferably an arylene group having from 6 to 15 carbon atoms, which may have a substituent, and examples thereof include a phenylene group, a tolylene group and a naphthylene group.

The divalent linking group is a sole group selected from the group consisting of an alkylene group, an arylene group, an ether group, a thioether group, a carbonyl group, an ester group, an amido group, a sulfonamido group, a urethane group and a urea group, or a combination of two or more groups thereof. The alkylene group in A above include a group represented by the following formula:

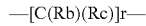

—[C(Rb)(Rc)]r— wherein Rb and Rc, which may be the same or different, each represents a hydrogen atom, an alkyl group, a halogen atom, a hydroxyl group or an alkoxy group, the alkyl group is preferably a lower alkyl group such as methyl group, ethyl group, propyl group, isopropyl group and butyl group, more preferably a methyl group, an ethyl group, a propyl group or an isopropyl group, examples of the substituent of the alkyl group include a hydroxyl group, a halogen atom and an alkoxy group (preferably having from 1 to 4 carbon atoms), examples of the alkoxy group include an alkoxy group having from 1 to 4 carbon atoms, such as methoxy group, ethoxy group, propoxy group and butoxy group, and examples of the halogen atom include a chlorine atom, a bromine atom, a fluorine atom and an iodine atom; and r represents an integer of 1 to 10.

The divalent linking group is preferably a single bond or a methylene group.

The organic group may be an acid-decomposable organic group (acid-decomposable group) or a non-acid-decomposable organic group, and examples thereof are the same as those described above for Yo in formula (a).

The ring formed when $R_0$ and $R_1$, $R_0$ and $R_2$, or $R_3$ and $R_4$ are combined is, for example, a 5-, 6- or 7-membered ring and specific examples thereof include a fluorine-substituted pentane ring, a hexane ring, a furan ring, a dioxonol ring and a 1,3-dioxolane ring.

The ring formed when two of $R_{36}$ to $R_{38}$ or two of $R_{36}$ to $R_{37}$ and $R_{39}$ are combined is, for example, a 3-, 4-, 5-, 6-, 7- or 8-membered ring and specific preferred examples thereof include a cyclopropane ring, a cyclopentane ring, a cyclohexane ring, a furan ring and a pyran ring.

The alkyl group, the cycloalkyl group, the aryl group, the aralkyl group, the alkenyl group, the alkoxy group, the acyl group, the alkynyl group, the alkoxycarbonyl group, the alkylene group, the alkenylene group, the cycloalkylene group, the arylene group and the like described above each may or may not have a substituent. Examples of the substituent which may be substituted to the alkyl group, the cycloalkyl group, the aryl group, the aralkyl group, the alkenyl group, the alkoxy group, the acyl group, the alkynyl group, the alkoxycarbonyl group, the alkylene group, the alkenylene group, the cycloalkylene group, the arylene group and the like include those having an active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

The alkyl group, the cycloalkyl group and the aryl group include those described above, but the alkyl group may be further substituted by a fluorine atom or a cycloalkyl group.

$Z_3$ represents a benzene residue, a cyclohexane residue, an adamantane residue or a norbornane residue. These residues each may have a substituent and preferred examples of the substituent include a halogen atom, a hydroxyl group, an alkoxy group and a cyano group. When these residues as $Z_3$ have a substituent, the substituent is more preferably a fluorine atom or a hydroxyl group, still more preferably a fluorine atom. When $Z_3$ has fluorine as the substituent, the number of fluorine atoms in each repeating unit is preferably from 1 to 5, more preferably from 1 to 3.

q' represents an integer of 1 to 5, preferably 1 to 4, more preferably 1 or 2.

Specific examples of the repeating units represented by formulae (I) to (III) are set forth below, however, the present invention is not limited thereto.

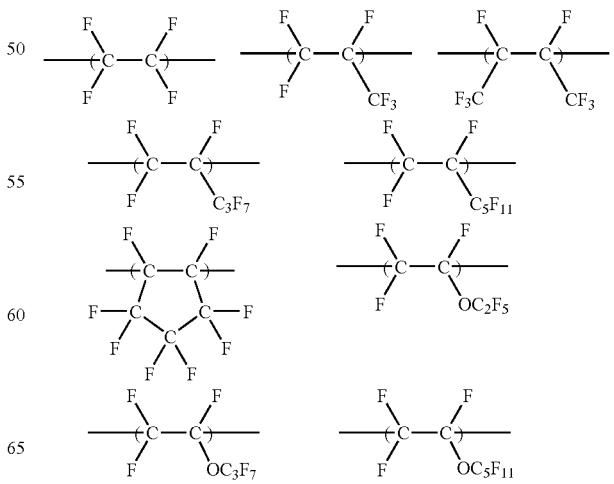

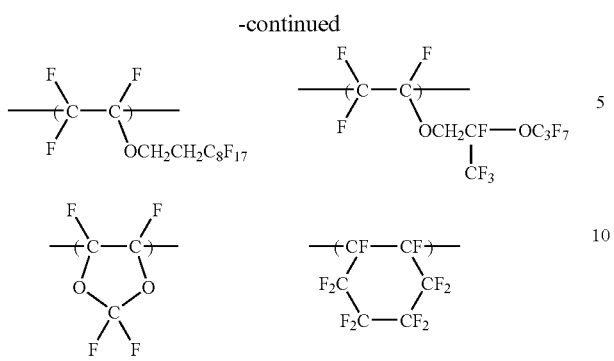
Specific examples of the repeating structural units represented by formulae (IV) to (X) are set forth below, however, the present invention is not limited thereto.
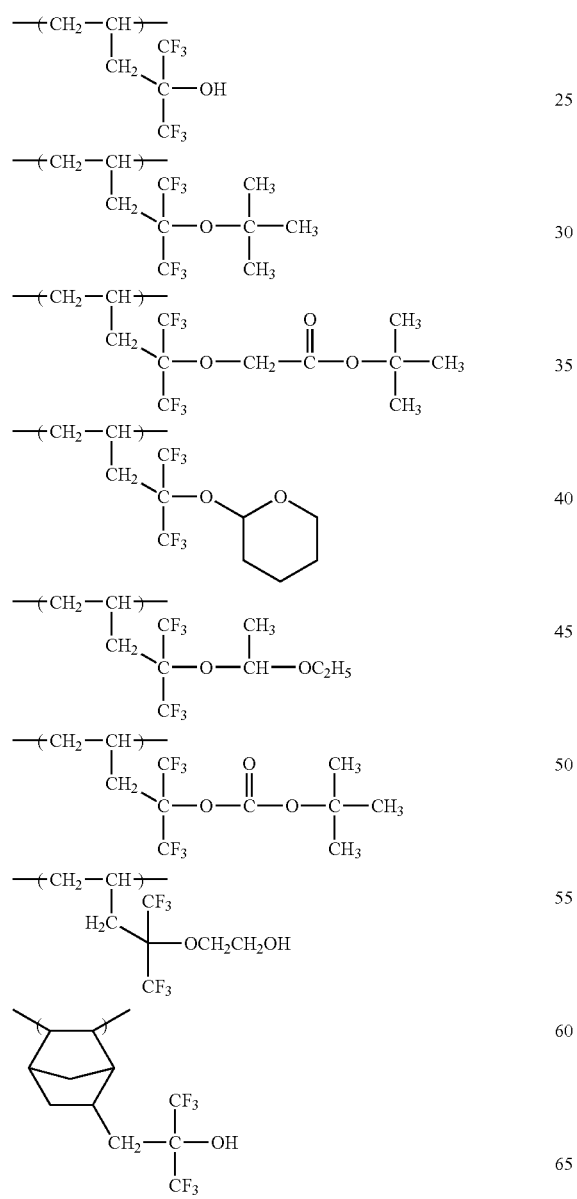
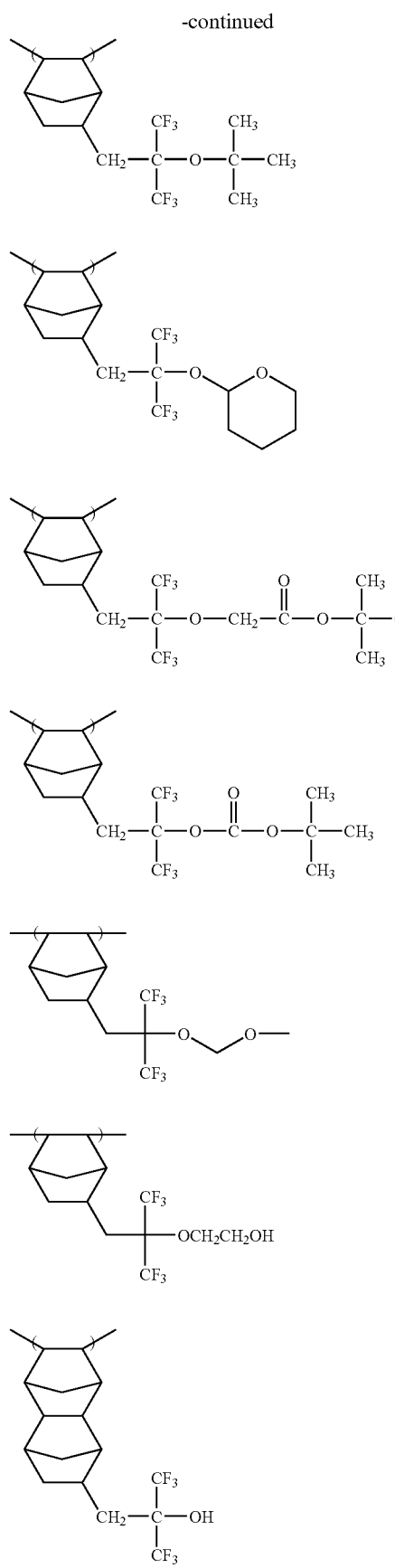

-continued
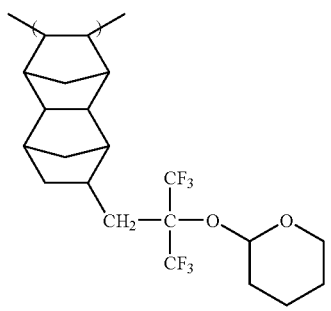
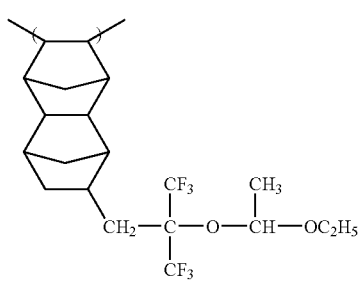
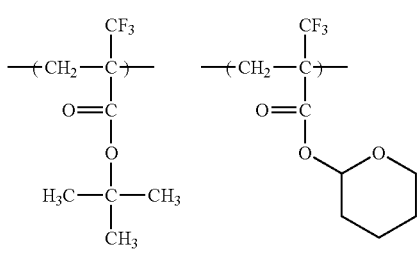
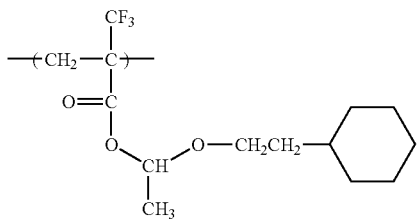
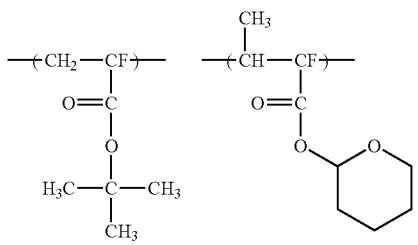
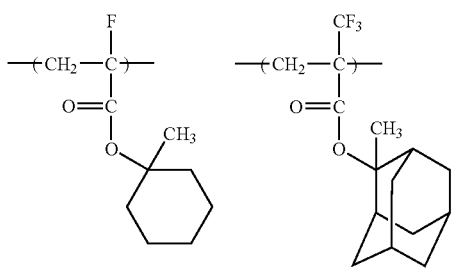
-continued
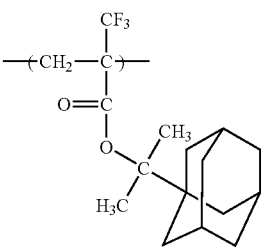 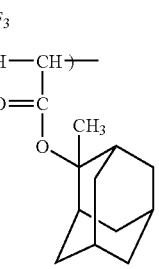
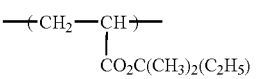 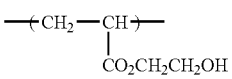
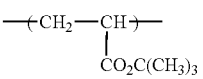 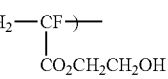
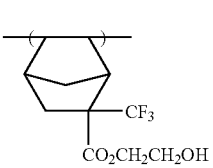 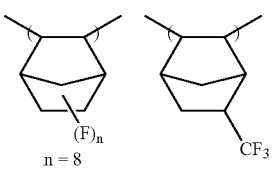
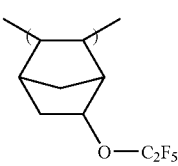 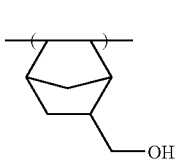 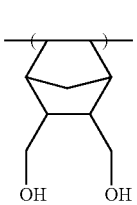
Preferred examples of the repeating unit represented by formula (V) also include the followings.
 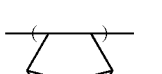
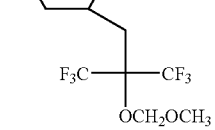 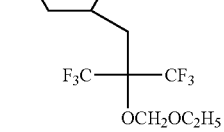
 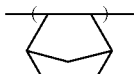
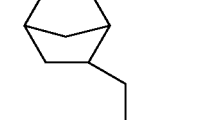 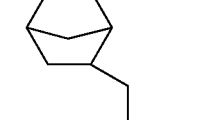
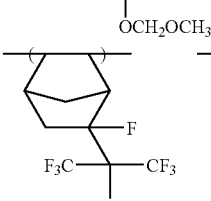 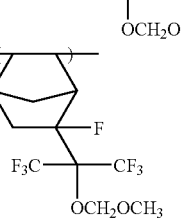

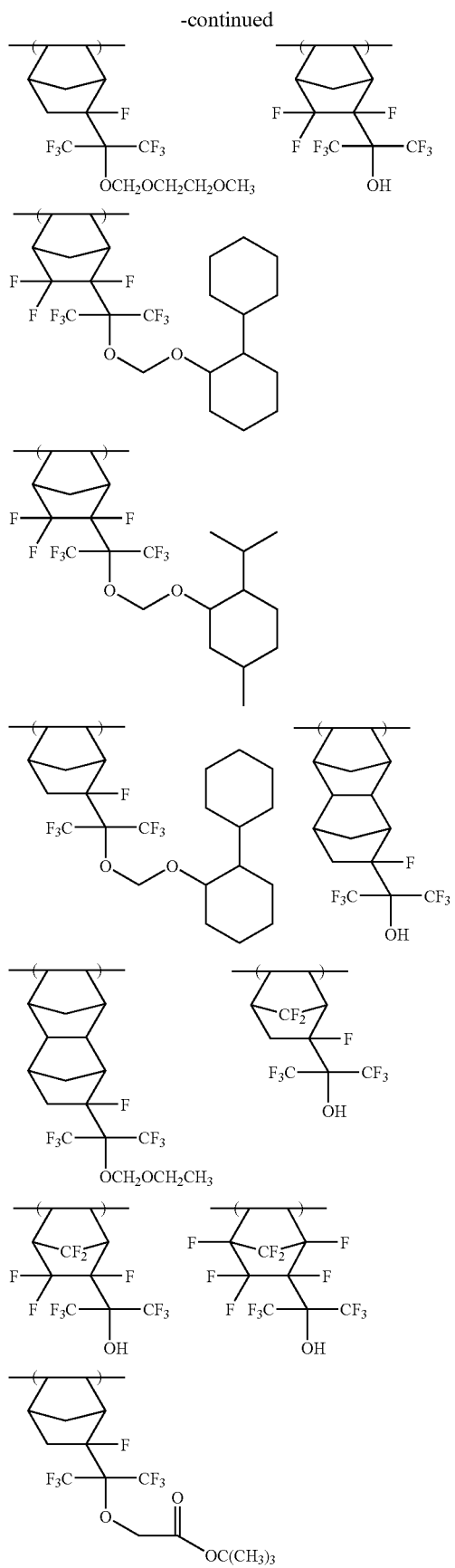
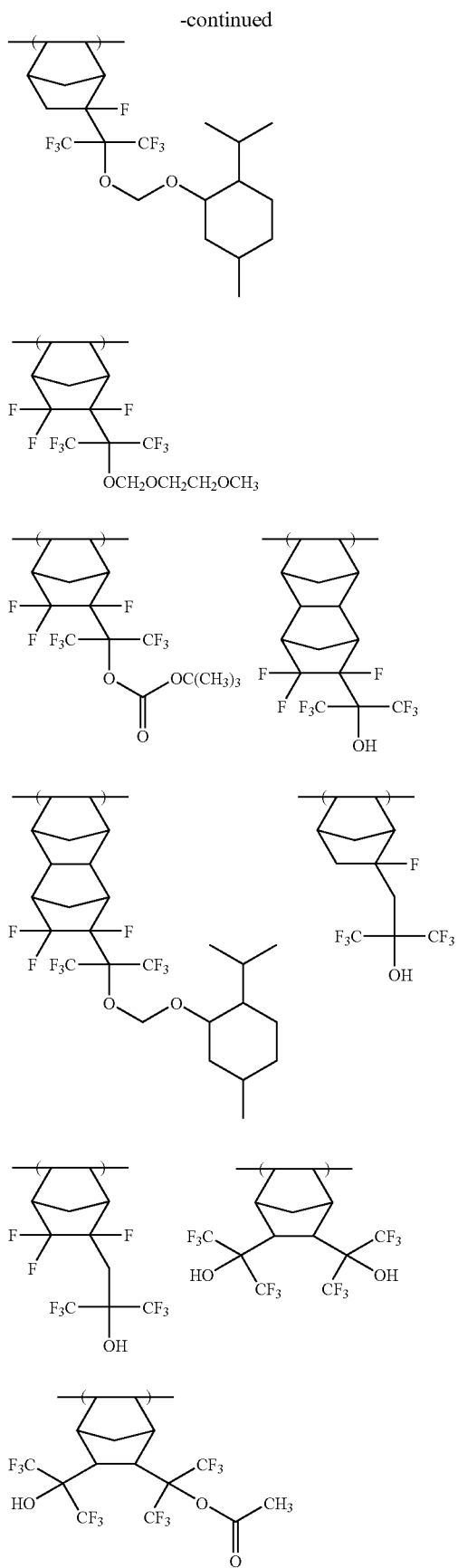

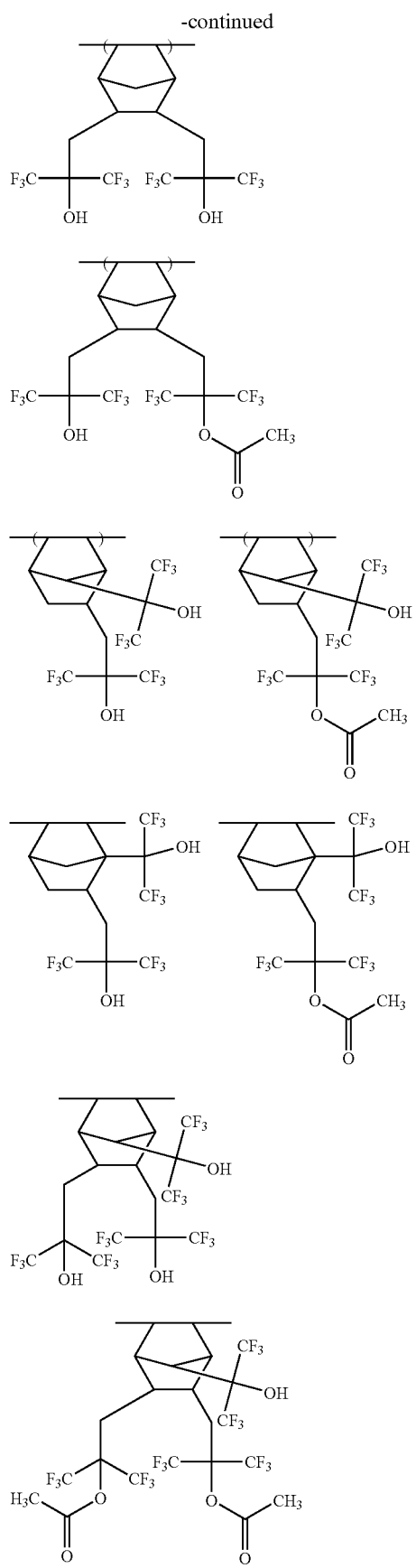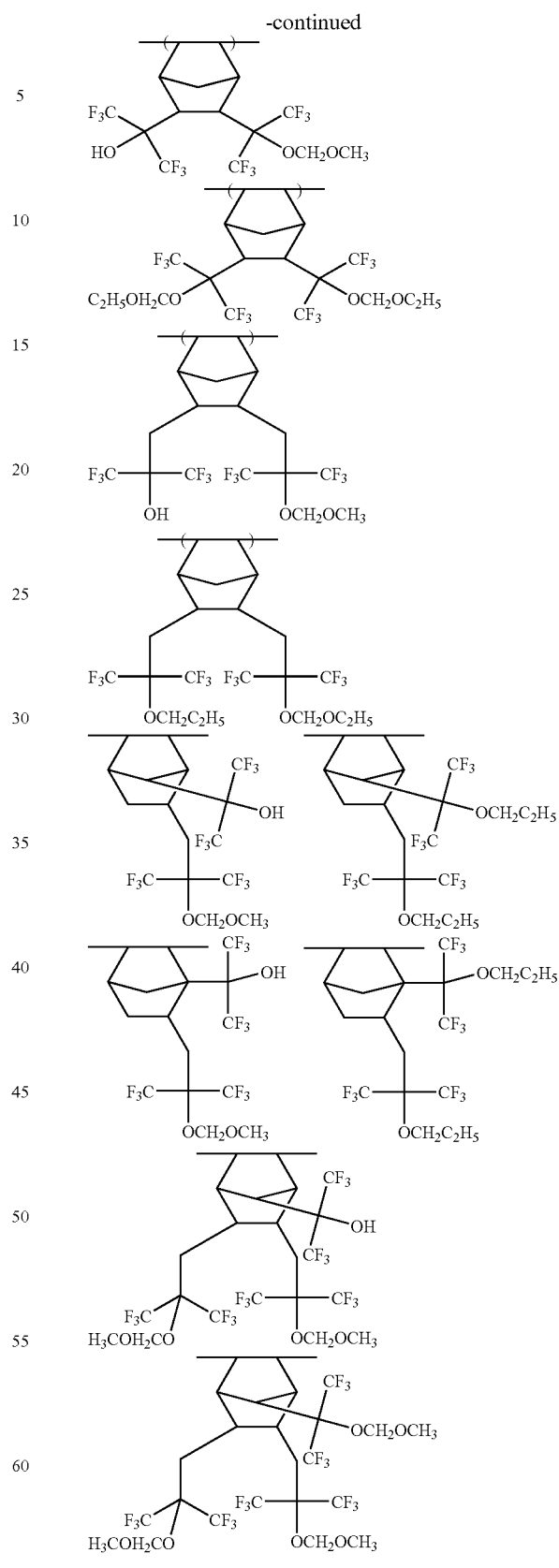
Preferred examples of the repeating unit represented by formula (VI) also include the followings.

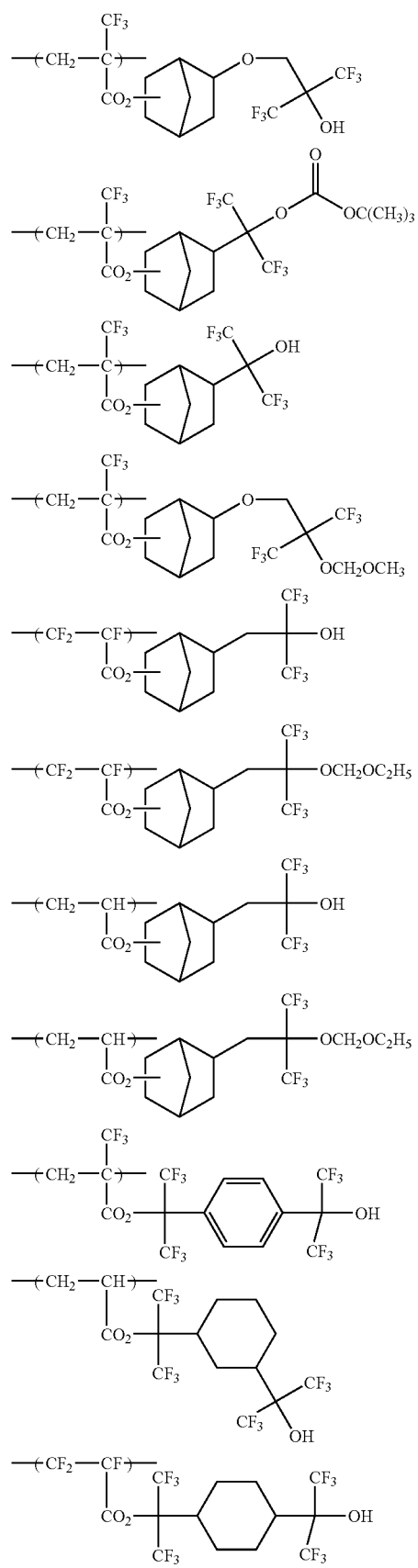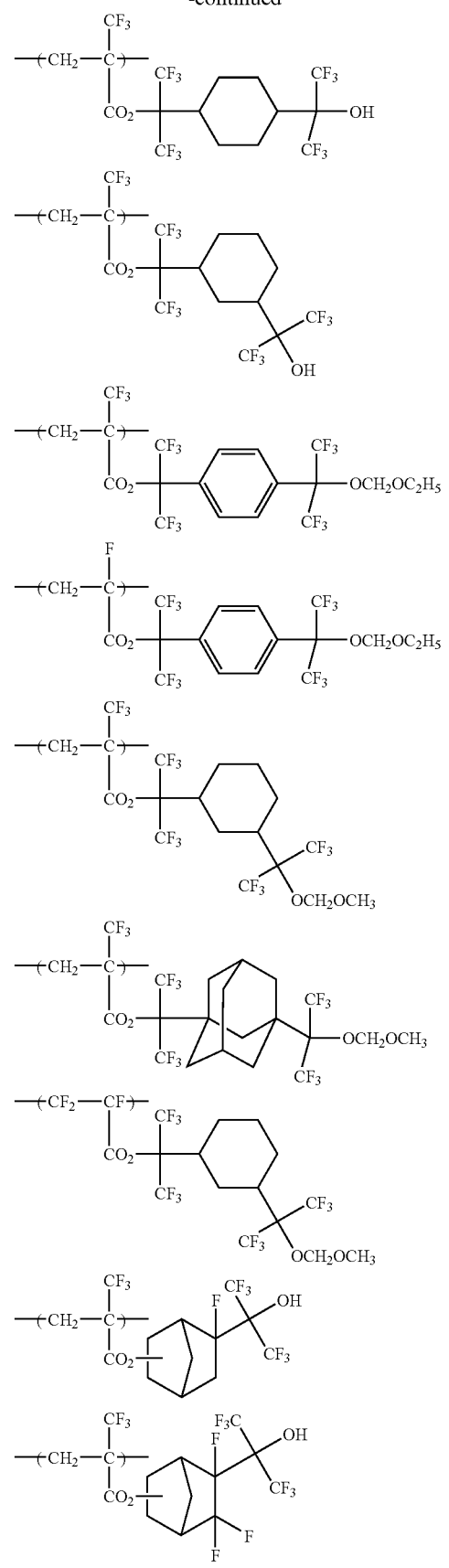

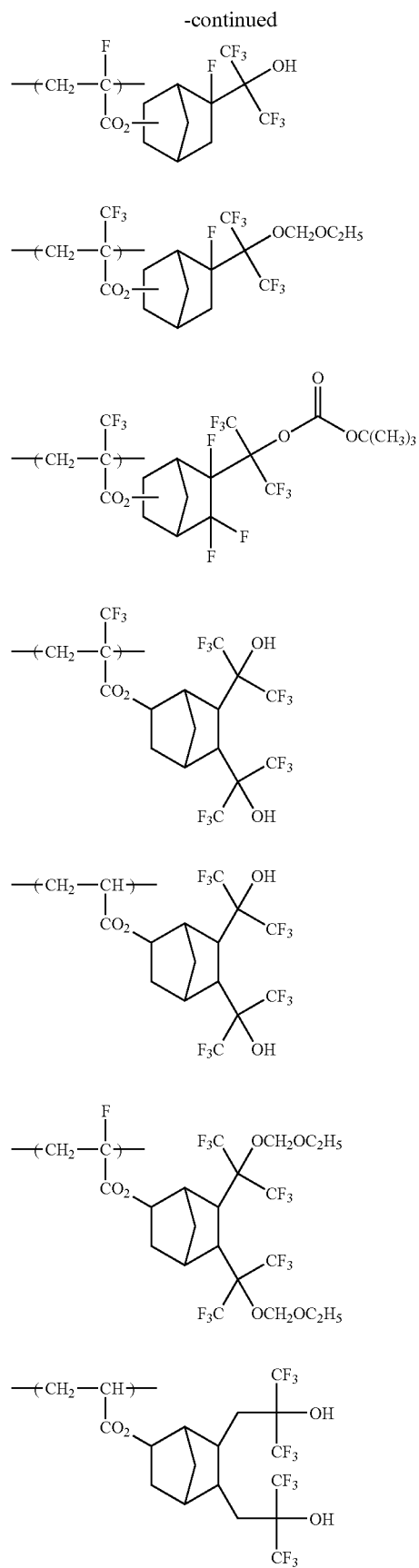
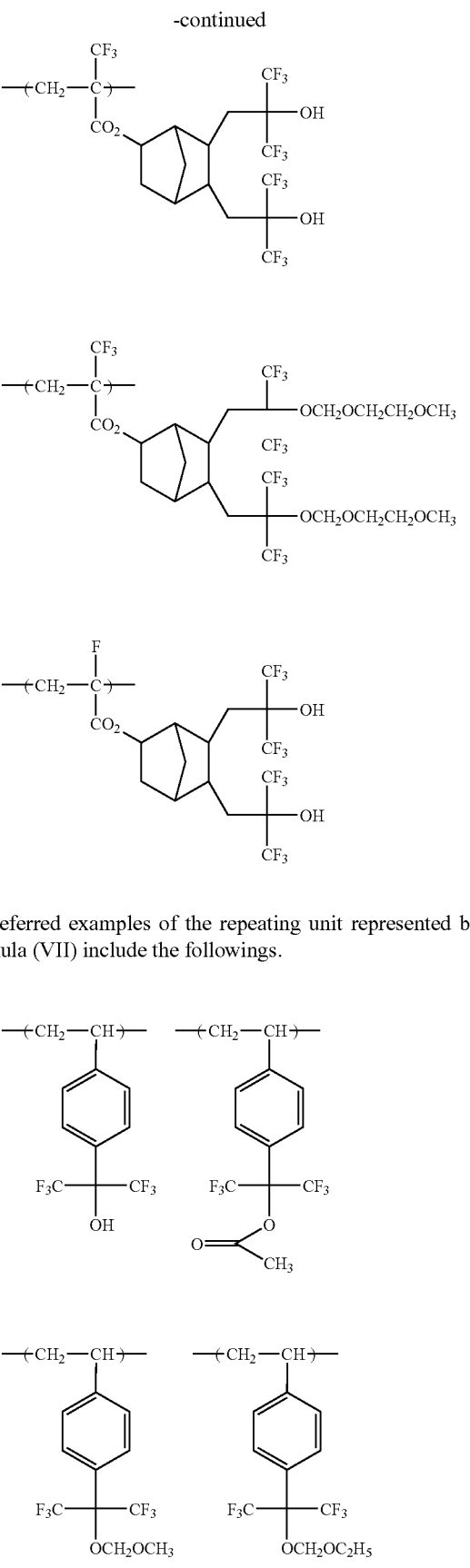
Preferred examples of the repeating unit represented by formula (VII) include the followings.

-continued
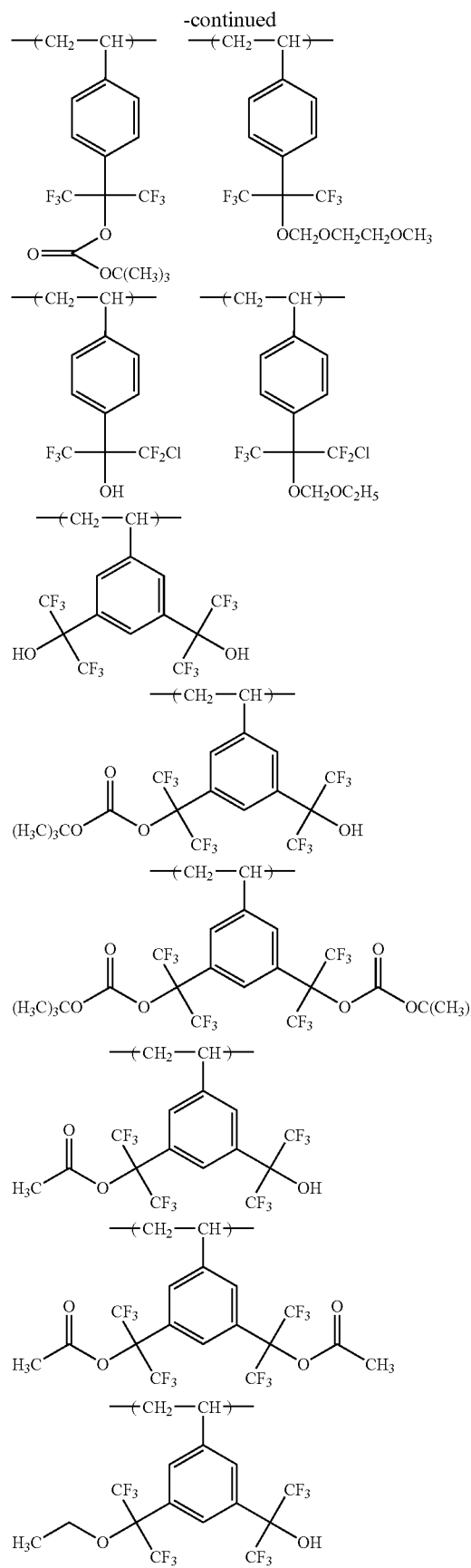
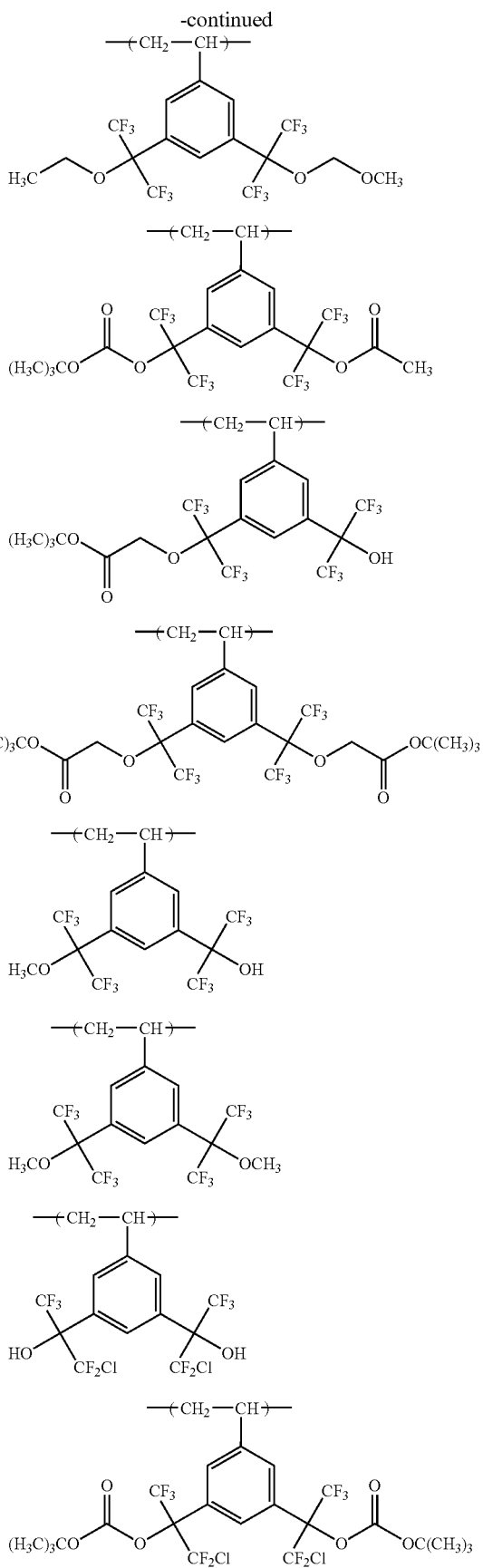

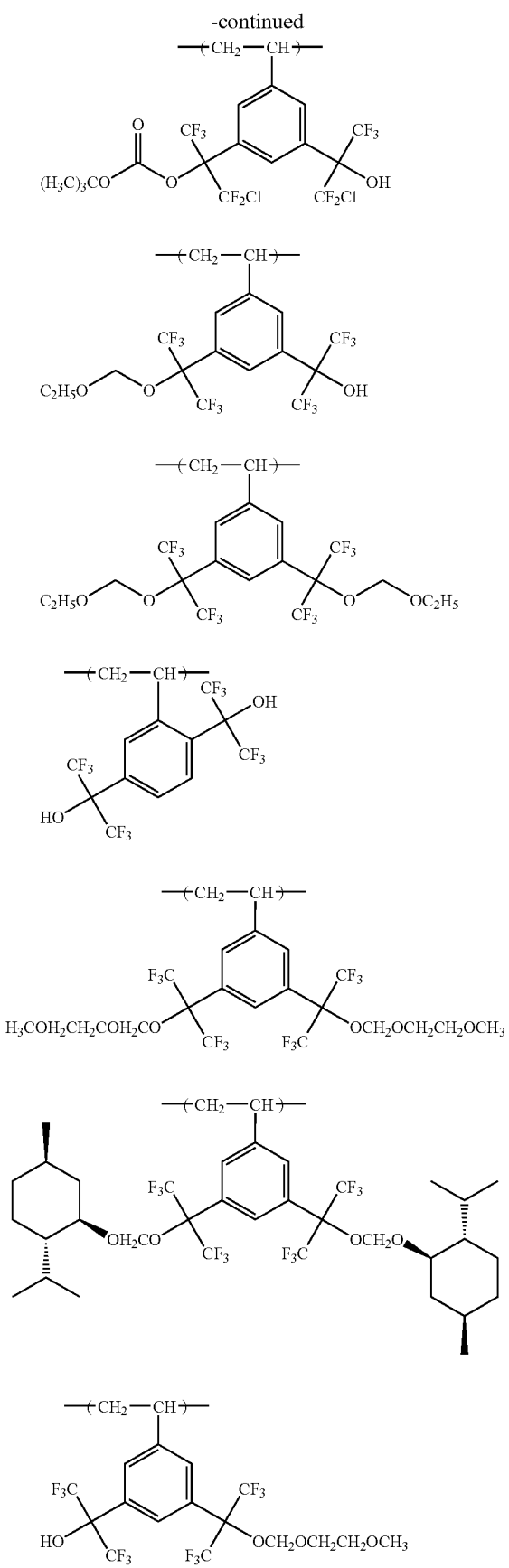
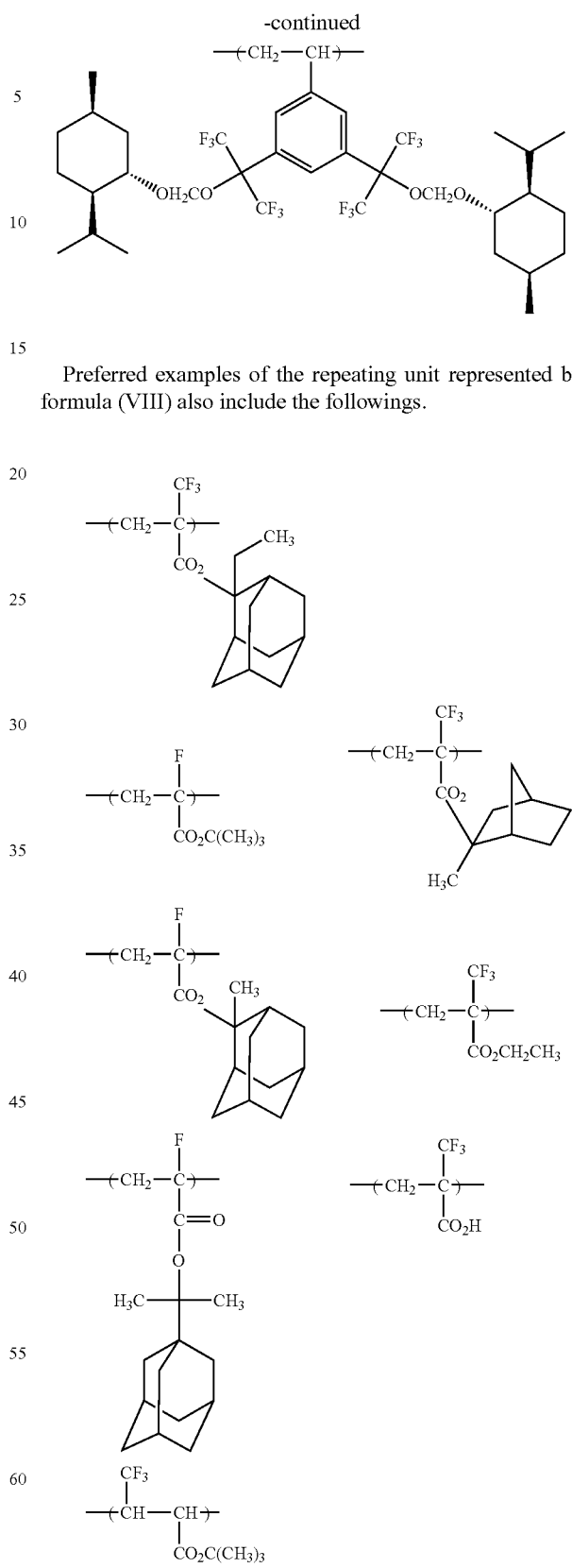
Preferred examples of the repeating unit represented by formula (VIII) also include the followings.
Preferred examples of the repeating unit represented by formula (IX) also include the followings.

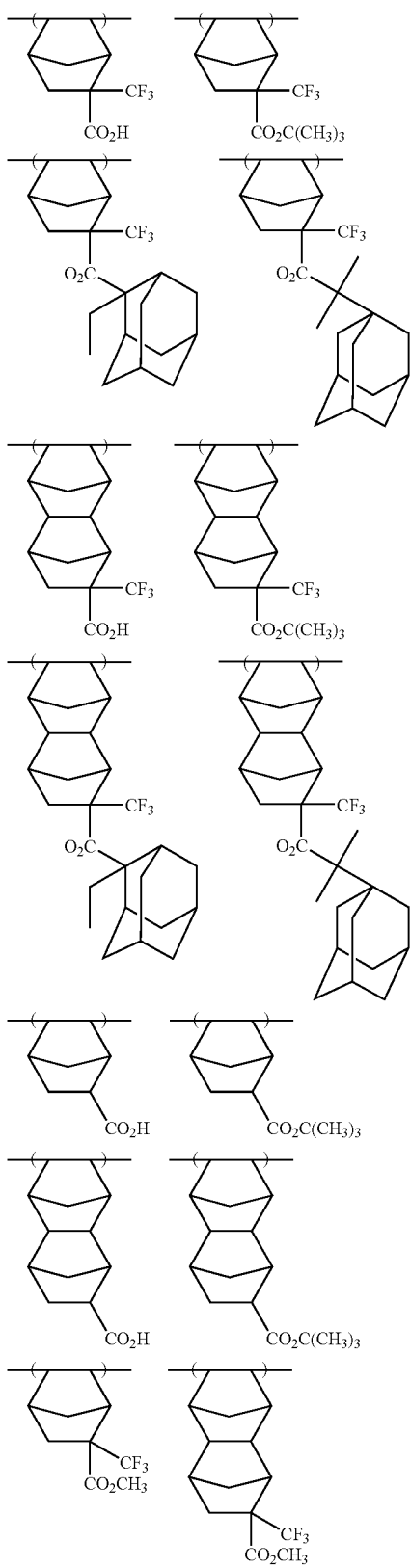
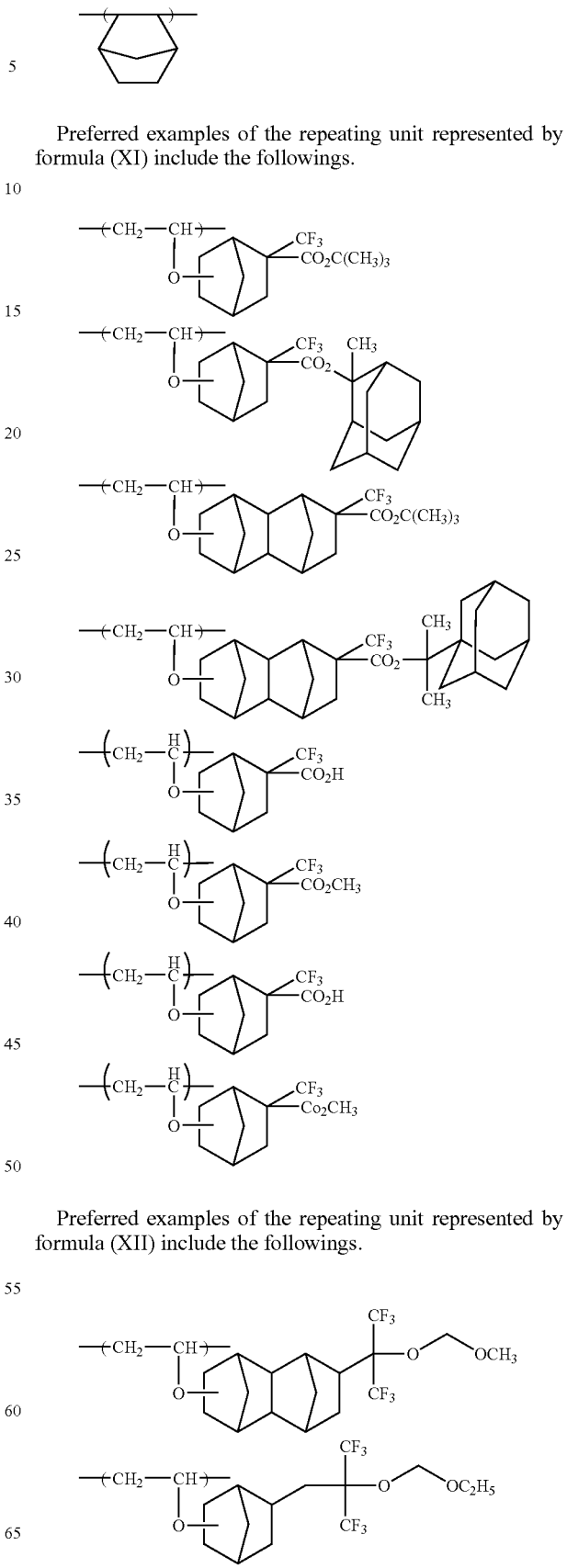
Preferred examples of the repeating unit represented by formula (XI) include the followings.
Preferred examples of the repeating unit represented by formula (XII) include the followings.
Preferred examples of the repeating unit represented by formula (X) also include the following.

-continued

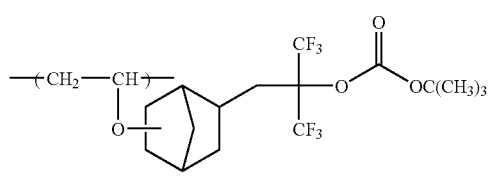
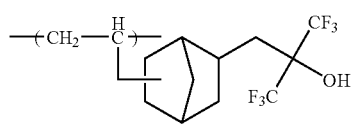
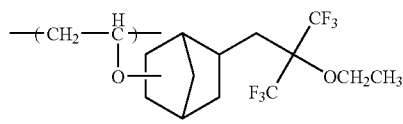
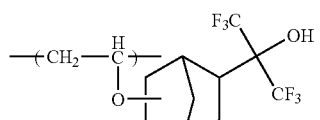
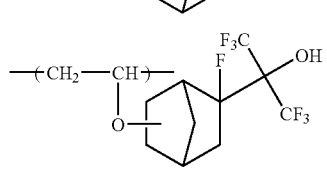
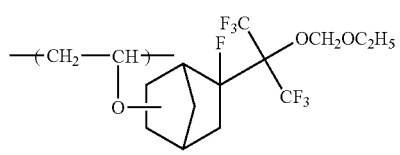
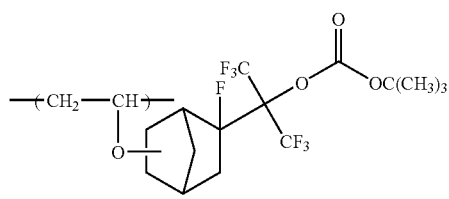
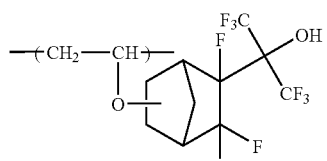
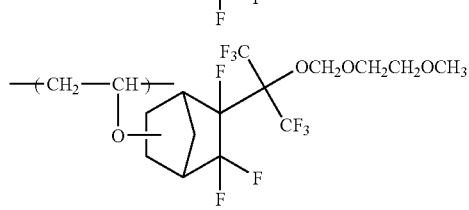
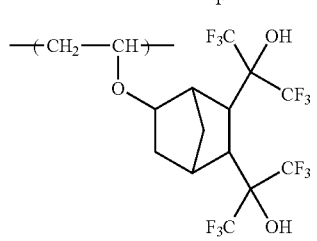

-continued

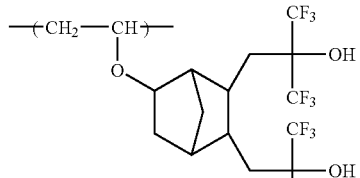
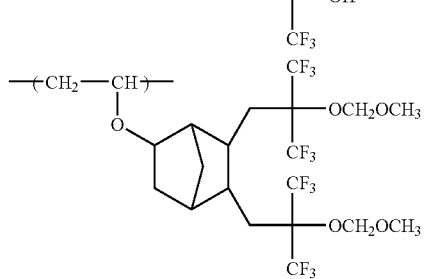

In the present invention, the resin (A) may further contain other repeating unit. The repeating unit which can be contained is not particularly limited but is preferably a repeating unit represented by the following formula (D), (E) or (F):

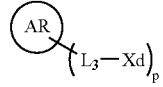

(D)

wherein

AR represents a monocyclic or polycyclic alicyclic hydrocarbon group, $L_3$ represents a single bond or a divalent linking group, Xd represents or when a plurality of Xd's are present, each independently represents a hydroxyl group, a cyano group, an alkoxy group, a cycloalkyl group or an alkyl group, provided that at least one Xd is a hydroxyl group, a cyano group or an alkoxy group, and p represents an integer of 1 to 4;

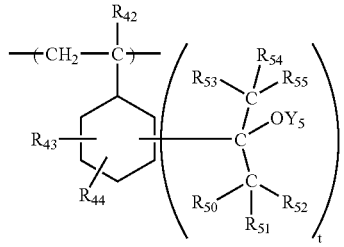

(E)

wherein $R_{42}$ represents a hydrogen atom, a halogen atom, a cyano group or an alkyl group, $R_{43}$ and $R_{44}$ each independently represents a hydrogen atom, a halogen atom, a hydroxyl group, a cyano group, an alkoxy group, an acyl group, an alkyl group, an alkenyl group, an aralkyl group or an aryl group, $R_{50}$ to $R_{55}$ each independently represents a hydrogen atom, a fluorine atom or an alkyl group, provided that at least one of $R_{50}$ to $R_{55}$ represents a fluorine atom or an alkyl group in which at least one of the hydrogen atoms has been substituted by a fluorine atom, $Y_5$ represents a hydrogen atom or an organic group, when a plurality of $Y_5$s, $R_{50}$s, $R_{51}$s, $R_{52}$s, $R_{53}$s, $R_{54}$s or $R_{55}$s are present, these may be the same or different, and t represents an integer of 1 to 5;

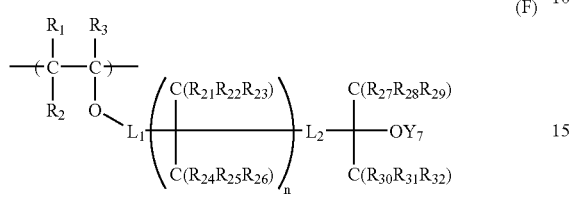

(F)

wherein $R_1$ to $R_3$ each independently represents a hydrogen atom, a halogen atom, a cyano group or an alkyl group, $R_{21}$ to $R_{26}$ each independently represents a hydrogen atom, a fluorine atom or an alkyl group, provided that at least one of $R_{21}$ to $R_{26}$ is a fluorine atom, $R_{27}$ to $R_{32}$ each independently represents a hydrogen atom, a fluorine atom or an alkyl group, provided that at least one of $R_{27}$ to $R_{32}$ is a fluorine atom, $L_{f1}$ and $L_{f2}$ each independently represents a single bond or a divalent linking group, $Y_7$ represents a hydrogen atom or an organic group, and n represents 0 or 1.

In formula (D), AR represents an alicyclic hydrocarbon group. The alicyclic hydrocarbon group is bonded by the main chain of resin through a linking group, or a carbon atom itself, which is constituting the ring of the alicyclic hydrocarbon, forms the main chain of resin.

$L_2$ represents a single bond or a divalent linking group,

Xd represents or when a plurality of Xd's are present, each independently represents a hydroxyl group, a cyano group, an alkoxy group, a cycloalkyl group or an alkyl group, provided that at least one Xd is not an alkyl group.

p represents an integer of 1 to 4.

The alicyclic hydrocarbon group represented by AR may be monocyclic or polycyclic and specific examples thereof include those having an alicyclic structure containing 5 or more carbon atoms, such as monocyclo-, bicyclo-, tricyclo- or tetracyclo-structure. The number of carbon atoms is preferably from 6 to 30, more preferably from 7 to 25.

Specific examples of the alicyclic structure are set forth below.

(1)

(2)

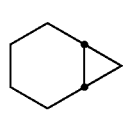

(3)

-continued

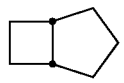

(4)

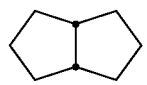

(5)

(6)

(7)

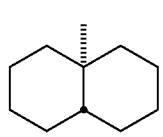

(8)

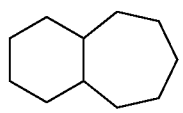

(9)

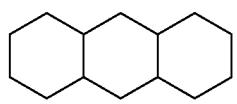

(10)

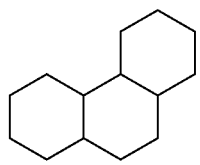

(11)

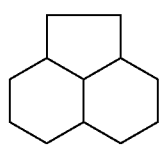

(12)

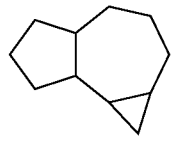

(13)

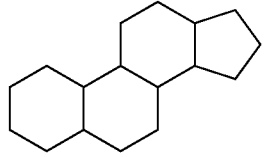

(14)

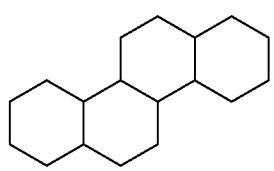

-continued
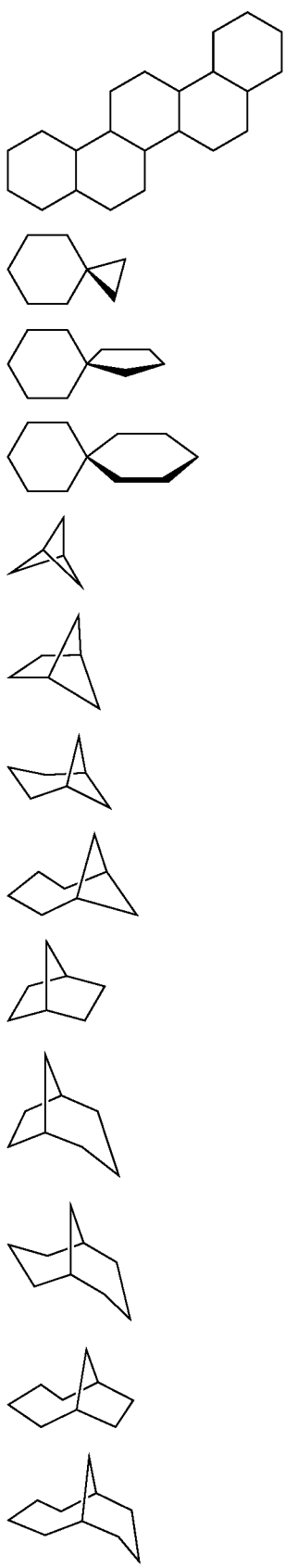
(15)
(16)
(17)
(18)
(19)
(20)
(21)
(22)
(23)
(24)
(25)
(26)
(27)
-continued
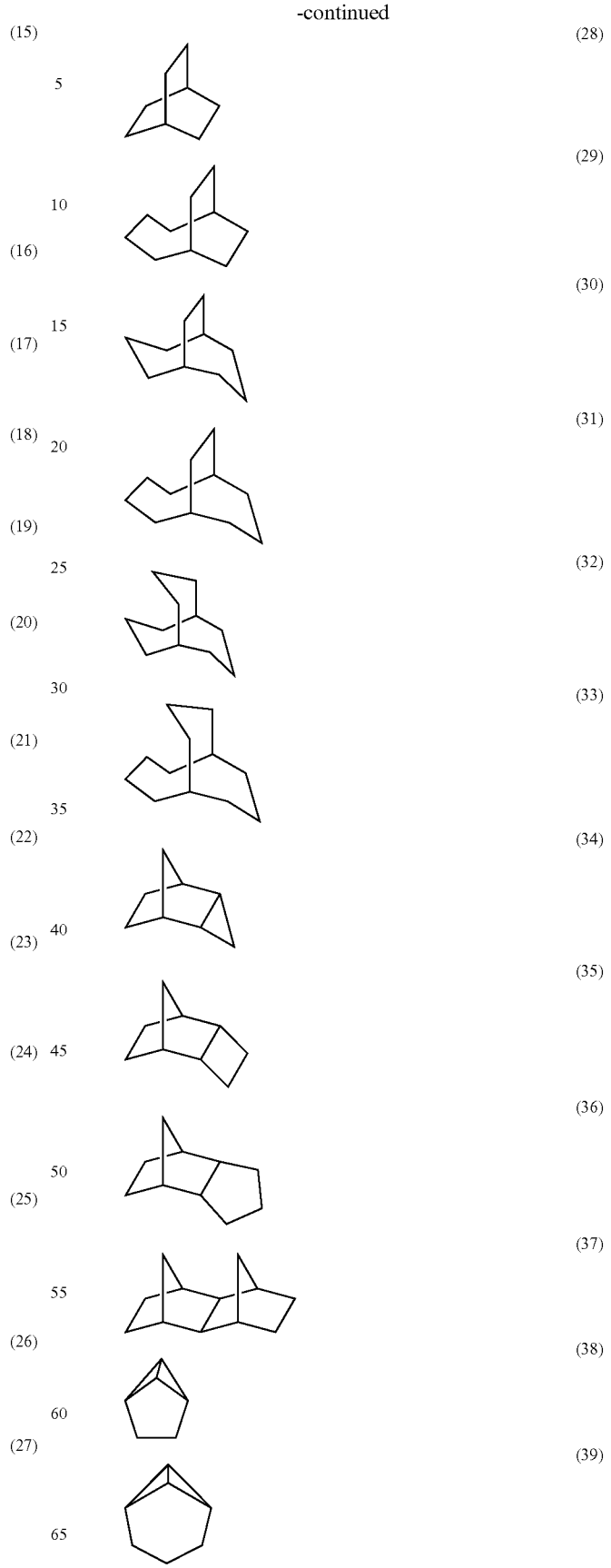
(28)
(29)
(30)
(31)
(32)
(33)
(34)
(35)
(36)
(37)
(38)
(39)

-continued

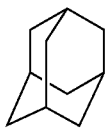
(40)

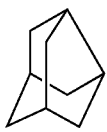
(41)

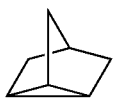
(42)

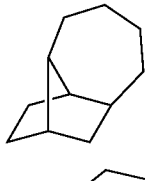
(43)

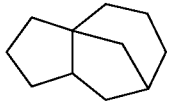
(44)

(45)

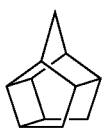
(46)

(47)

(48)

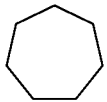
(49)

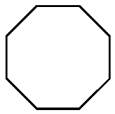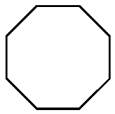
(50)

Examples of the alicyclic hydrocarbon group represented by AR include residues resulting from further removing several hydrogen atoms from an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group. Among these, preferred are a norbornane residue, an adamantane residue, a tricyclodecane residue and a tetracyclododecane residue, more preferred is an adamantane residue.

The alicyclic hydrocarbon group represented by AR may have another substituent such as carboxyl group and alkoxycarbonyl group.

The alkyl group represented by Xd is preferably an alkyl group having from 1 to 8 carbon atoms and specific examples thereof include a methyl group, an ethyl group, a propyl group, an n-butyl group, a sec-butyl group, a hexyl group, a 2-ethylhexyl group and an octyl group. The alkyl group is more preferably an alkyl group having from 1 to 5 carbon atoms (e.g., methyl, ethyl, propyl, isopropyl, butyl), still more preferably an alkyl group having from 1 to 3 carbon atoms (e.g., methyl, ethyl, propyl, isopropyl).

The cycloalkyl group may be monocyclic or polycyclic. The monocyclic cycloalkyl group is a cycloalkyl group having from 3 to 8 carbon atoms and preferred examples thereof include a cyclopropyl group, a cyclopentyl group, a cyclohexyl group, a cycloheptyl group and a cyclooctyl group. The polycyclic cycloalkyl group is a cycloalkyl group having from 6 to 20 carbon atom and preferred examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. The cycloalkyl group includes those where a part of carbon atoms constituting the ring is substituted by a heteroatom such as oxygen atom, sulfur atom and nitrogen atom.

The alkoxy group represented by Xd is preferably an alkoxy group having from 1 to 8 carbon atoms and specific examples thereof include a methoxy group, an ethoxy group, a n-propoxy group, an iso-propoxy group, a butoxy group, a pentoxy group, an allyloxy group and an octoxy group. The alkoxy group is more preferably an alkoxy group having from 1 to 4 carbon atoms (e.g., methoxy, ethoxy, propoxy, butoxy).

The alkyl group and alkoxy group represented by Xd each may further have a substituent such as a hydroxyl group, a halogen atom and an alkoxy group (preferably having from 1 to 5 carbon atoms).

In view of developability and sensitivity, Xd is preferably a hydroxyl group, an alkoxy group or a cyano group, more preferably a hydroxyl group or a cyano group, still more preferably a hydroxyl group.

Xd may be bonded on a carbon forming the alicyclic hydrocarbon group of AR or may be bonded on a carbon of a substituent bonded to the alicyclic hydrocarbon group of AR.

$L_2$ represents a single bond or a divalent linking group and the divalent linking group is a sole group selected from the group consisting of a substituted or unsubstituted alkylene group, a substituted or unsubstituted arylene group, an ether group, a thioether group, a carbonyl group, an ester group, an amido group, a sulfonamido group, a urethane group and a urea group, or a combination of two or more groups thereof. The alkylene group above include a group represented by the following formula:

—[C($R_b$)($R_c$)]r— wherein $R_b$ and $R_c$, which may be the same or different, each represents a hydrogen atom, an alkyl group, a substituted alkyl group, a halogen atom, a hydroxyl group or an alkoxy group, the alkyl group is preferably a lower alkyl group such as methyl group, ethyl group, propyl group, isopropyl group and butyl group, more preferably a methyl group, an ethyl group, a propyl group or an isopropyl group, examples of the substituent of the substituted alkyl group include a hydroxyl group, a halogen atom and an alkoxy group (preferably having from 1 to 4 carbon atoms), examples of the alkoxy group include an alkoxy group having from 1 to 4 carbon atoms, such as methoxy group, ethoxy group, propoxy group and butoxy group, and examples of the halogen atom include a chlorine atom, a bromine atom, a fluorine atom and an iodine atom; and r represents an integer of 1 to 10.

L$_2$ is preferably a single bond or a methylene group.

p represents an integer of 1 to 4, preferably 2 or 3.

In the present invention, the repeating unit having a partial structure represented by formula (D) is not particularly limited but is preferably a repeating unit represented by the following formula (A-1), (A-2), (A-3), (A-4) or (A-5):

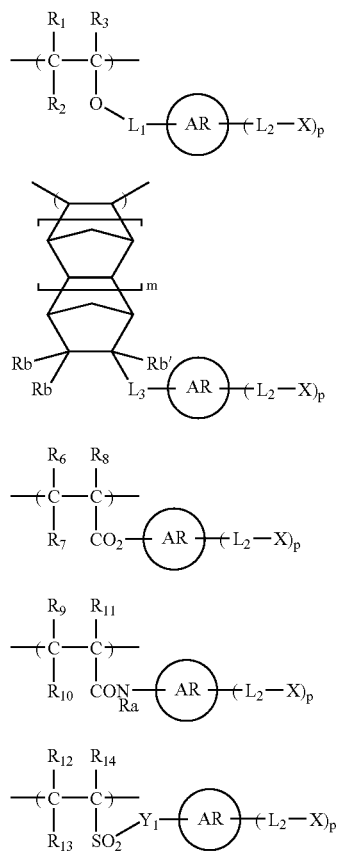

wherein

R$_1$ to R$_{14}$ each independently represents a hydrogen atom, a fluorine atom, a chlorine atom, a cyano group or an alkyl group, L$_1$ represents a single bond or a linking group, Rb and Rb' each independently represents a hydrogen atom, a halogen atom or an organic group, L$_3$ represents a single bond or a divalent linking group, m represents 0 or 1, Y$_1$ represents a single bond, —O— or —N(Ra)— (wherein Ra represents a hydrogen atom, an aralkyl group, a cycloalkyl group, an aryl group or an aralkyl group), and Ra represents a hydrogen atom, an alkyl group, a cycloalkyl group, an aryl group or an aralkyl group.

Examples of the divalent linking group represented by L$_3$ are the same as those described above for L$_2$.

Examples of the alkyl group, cycloalkyl group and aryl group are the same as those described above regarding formulae (I) to (III).

The aralkyl group is preferably an aralkyl group having from 7 to 12 carbon atoms and examples thereof include a benzyl group, a phenethyl group and a naphthyl group.

Specific preferred examples of the repeating unit containing the partial structure represented by formula (D) are set forth below, however, the present invention is not limited thereto.

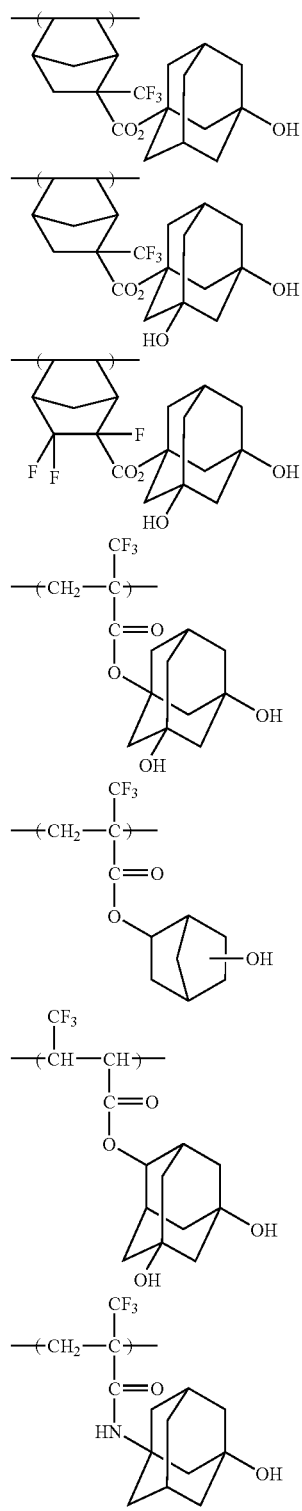

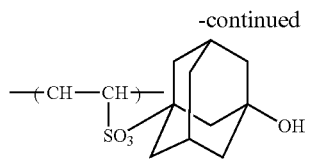

In formula (E), the alkyl group may have a substituent and may be linear or branched but is preferably an alkyl group having from 1 to 5 carbon atoms (e.g., methyl, ethyl, propyl, isopropyl, butyl), more preferably an alkyl group having from 1 to 3 carbon atoms (e.g., methyl, ethyl, propyl, isopropyl). Examples of the substituent include a halogen atom such as fluorine atom, a hydroxyl group, a carboxyl group and a cyano group.

$Y_5$ represents a hydrogen atom or an organic group. The organic group may be an acid-decomposable organic group (acid-decomposable group) or a non-acid-decomposable organic group. Examples of the acid-decomposable group and non-acid-decomposable group are the same as those described above for $Y_0$ in formula (a).

Specific examples of the repeating unit represented by formula (E) are set forth below, however, the present invention is not limited thereto.

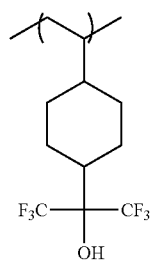

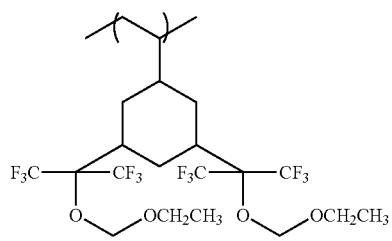

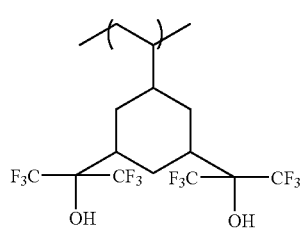

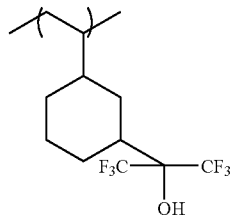

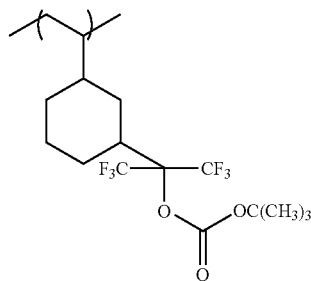

In Formula (F), the halogen atom represented by $R_1$ to $R_3$ includes a fluorine atom, a chlorine atom, a bromine atom and a iodine atom.

The alkyl group represented by $R_1$ to $R_3$, $R_{21}$ to $R_{26}$ and $R_{27}$ to $R_{32}$ is preferably a linear or branched alkyl group having from 1 to 4 carbon atoms and examples thereof include a methyl group, an ethyl group, a propyl group, an n-butyl group and a sec-butyl group.

The alkyl group represented by $R_1$ to $R_3$, $R_{21}$ to $R_{26}$ and $R_{27}$ to $R_{32}$ may further have a substituent such as a halogen atom.

$R_{21}$ to $R_{26}$ and $R_{27}$ to $R_{32}$ each is preferably a fluorine atom.

The divalent linking group represented by $L_1$ and $L_2$ includes, for example, an alkylene group, a cycloalkylene group, an arylene group, and a combination of such a group with an ether group, a thioether group, a carbonyl group, an ester group, an amido group, a sulfonamido group, a urethane group or a urea group. The alkylene group is preferably an alkylene group having from 1 to 8 carbon atoms and examples thereof include a methylene group, an ethylene group, a propylene group, a butylene group, a hexylene group and an octylene group. The cycloalkylene group is preferably a cycloalkylene group having from 5 to 15 carbon atoms and examples thereof include a cyclopentylene group, a cyclohexylene group, a norbornane residue, an adamantane residue, a tricyclodecane residue and a tetracyclododecane residue. The arylene group is preferably an arylene group having from 6 to 15 carbon atoms and examples thereof include a phenylene group, a tolylene group and a naphthylene group.

$L_1$ is preferably a single bond or an alkylene group such as ethylene group.

$L_2$ is preferably a cyclohexylene group, a norbornane residue or an adamantane residue, more preferably a cyclohexylene group or an adamantane residue.

$Y_7$ represents a hydrogen atom or an organic group. The organic group may be an acid-decomposable organic group (acid-decomposable group) or a non-acid-decomposable organic group. Examples of the acid-decomposable group and non-acid-decomposable group are the same as those described above for $Y_0$ in formula (a).

Formula (F) is preferably represented by the following formula (F-1):

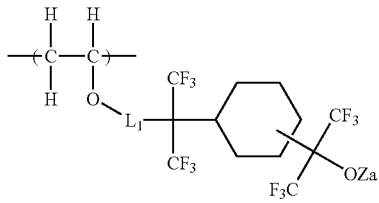

(F-1)

wherein $L_1$ represents a single bond or a divalent linking group, and Za represents a hydrogen atom or an organic group. The organic group may be an acid-decomposable organic group (acid-decomposable group) or a non-acid-decomposable organic group. Examples of the acid-decomposable group and non-acid-decomposable group are the same as those described above for Yo in formula (a) or $Y_5$ in formula (E).

That is, $L_1$ and Za have the same meanings as $L_1$ and $Y_7$ in formula (F).

The monomer (vinyl ether) corresponding to the repeating unit represented by formula (F) can be synthesized, for example, by a condensation reaction of a commercially available chloroethyl vinyl ether with an alcohol of various types, or by an exchange reaction of an easily available vinyl ether and an alcohol of various types by using a catalyst such as Hg, Pd and Ir.

Specific examples of the repeating unit represented by formula (F) are set forth below, however, the present invention is not limited thereto.

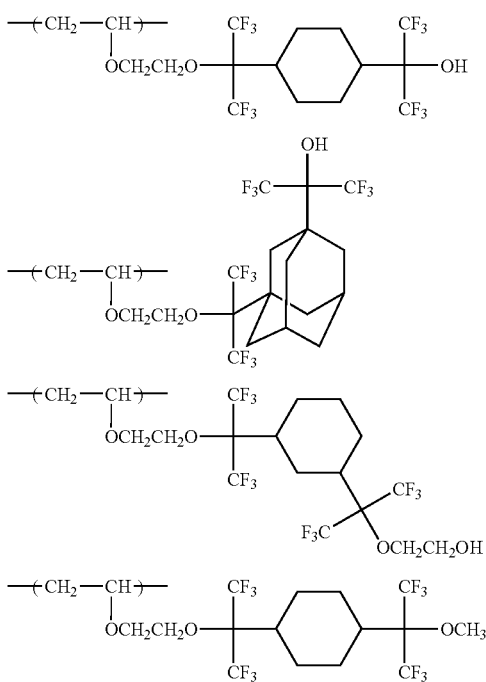

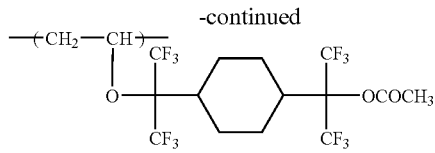

-continued

In the resin (A) for use in the present invention, a polymerizable monomer other than the above-described repeating structural units may also be copolymerized so as to enhance the performance of the positive resist of the present invention.

The copolymerization monomer which can be used is, for example, a compound having one addition-polymerizable unsaturated bond, selected from acrylic acid esters, acrylamides, methacrylic acid esters, methacrylamides, allyl compounds, vinyl ethers, vinyl esters, styrenes and crotonic acid esters.

Specific examples thereof include acrylic acid esters such as alkyl (the alkyl group is preferably an alkyl group having from 1 to 10 carbon atoms) acrylate (e.g., methyl acrylate, ethyl acrylate, propyl acrylate, tert-butyl acrylate, amyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, furfuryl acrylate, tetrahydrofurfuryl acrylate) and aryl acrylate (e.g., phenyl acrylate);

methacrylic acid esters such as alkyl (the alkyl group is preferably an alkyl group having from 1 to 10 carbon atoms) methacrylate (e.g., methyl methacrylate, ethyl methacrylate, propyl methacrylate, isopropyl methacrylate, tert-butyl methacrylate, amyl methacrylate, hexyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, cresyl methacrylate, naphthyl methacrylate);

acrylamides such as acrylamide, N-alkylacrylamide (the alkyl group is an alkyl group having from 1 to 10 carbon atoms, such as methyl group, ethyl group, propyl group, butyl group, tert-butyl group, heptyl group, octyl group, cyclohexyl group, benzyl group, hydroxyethyl group and benzyl group), N-arylacrylamide (the aryl group is, for example, a phenyl group, a tolyl group, a nitrophenyl group, a naphthyl group, a cyanophenyl group, a hydroxyphenyl group or a carboxyphenyl group), N,N-dialkylacrylamide (the alkyl group is an alkyl group having from 1 to 10 carbon atoms, such as methyl group, ethyl group, butyl group, isobutyl group, ethylhexyl group and cyclohexyl group), N,N-diarylacrylamide (the aryl group is, for example, a phenyl group), N-methyl-N-phenylacrylamide, N-hydroxyethyl-N-methylacrylamide and N-2-acetamidoethyl-N-acetylacrylamide;

methacrylamides such as methacrylamide, N-alkylmethacrylamide (the alkyl group is an alkyl group having from 1 to 10 carbon atoms, such as methyl group, ethyl group, tert-butyl group, ethylhexyl group, hydroxyethyl group and cyclohexyl group), N-arylmethacrylamide (the aryl group is, for example, a phenyl group), N,N-dialkylmethacrylamide (the alkyl group is, for example, an ethyl group, a propyl group or a butyl group), N,N-diarylmethacrylamide (the aryl group is, for example, a phenyl group), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, allyl lactate) and allyloxy ethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), vinyl aryl ether (e.g., vinyl phenyl ether, vinyl tolyl ether, vinyl chlorophenyl ether, vinyl-2,4-dichlorophenyl ether, vinyl naphthyl ether, vinyl anthranyl ether);

vinyl esters such as vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl phenyl acetate, vinyl acetoacetate, vinyl lactate, vinyl-β-phenyl butyrate, vinyl chlorohexylcarboxylate, vinyl benzoate, vinyl salicylate, vinyl chlorobenzoate, vinyl tetrachlorobenzoate and vinyl naphthoate;

styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrenei trifluoromethylstyrene, ethoxymethylstyrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrene and vinylnaphthalene;

crotonic acid esters such as alkyl crotonate (e.g., butyl crotonate, hexyl crotonate, glycerin monocrotonate); dialkyl itaconates (e.g., dimethyl itaconate, diethyl itaconate, dibutyl itaconate); and dialkyl esters of maleic acid or fumaric acid (e.g., dimethyl maleate, dibutyl fumarate), maleic acid anhydride, maleimide, acrylonitrile, methacrylonitrile, maleylonitrile. Other than these, addition-polymerizable unsaturated compounds which can be copolymerized may be generally used.

The resin (A) is generally used in an amount of 50 to 99.5 mass %, preferably from 60 to 98 mass %, more preferably from 65 to 95 mass %, based on the entire solid content.

In the resin (A), the content of the repeating unit having an acid-decomposable group is usually from 3 to 95 mol %, preferably from 5 to 80 mol %, more preferably from 7 to 70 mol %.

In the resin (A), the content of the repeating unit containing the partial structure represented by formula (a) is usually from 3 to 95 mol %, preferably from 5 to 80 mol %, more preferably from 7 to 70 mol %.

In the resin (A), the content of the repeating unit represented by formulae (I) to (III) is usually from 3 to 90 mol %, preferably from 5 to 80 mol %, more preferably from 7 to 70 mol %.

In the resin (A), the content of the repeating unit represented by formulae (IV) to (XII) is usually from 1 to 80 mol %, preferably from 3 to 65 mol %, more preferably from 5 to 50 mol %.

The molecular weight of the resin (A) is, in terms of the weight average molecular weight, preferably from 1,000 to 200,000, more preferably from 3,000 to 200,000, and most preferably from 3,000 to 50,000. The molecular weight distribution (dispersity: Mw/Mn) is usually from 1 to 10, preferably from 1 to 3, more preferably from 1 to 2, and most preferably from 1 to 1.7. A resin having a smaller molecular weight distribution is more excellent in the coatability, sensitivity and contrast. In the present invention, the percentage of the resin having a molecular weight of 1,000 or less is preferably 20% or less, more preferably 15% or less, still more preferably 10% or less. Also, the percentage of the residual monomer in the resin (A) is preferably 10% or less, more preferably 7% or less, still more preferably 5% or less.

The acid-decomposable resin for use in the present invention can be synthesized by a conventional method (for example, radical polymerization). For example, as a general synthesis method, the monomer species are charged into a reaction vessel en bloc or in the middle of reaction, the reaction solution is, if desired, dissolved in a reaction medium, for example, ethers such as tetrahydrofuran, 1,4-dioxane and diisopropyl ether, ketones such as methyl ethyl ketone and methyl isobutyl ketone, ester solvents such as ethyl acetate, and solvents capable dissolving various monomers, such as propylene glycol monomethyl ether acetate which is described later, the obtained uniform solution is, if desired, heated in an inert gas atmosphere such as nitrogen and argon, and then, the polymerization is initiated by using a commercially available radical initiator (e.g., azo-type initiator, peroxide). If desired, the initiator is additionally added or added in parts and after the completion of reaction, the reactant is poured in a solvent and the desired polymer is recovered by a method such as powder or solid recovery. The reaction concentration is 20 mass % or more, preferably 30 mass % or more, more preferably 40 mass % or more. The reaction temperature is from 10 to 150° C., preferably from 30 to 120° C., more preferably from 50 to 100° C. Depending on the monomer, the synthesis can be more suitably performed by utilizing anion polymerization. The polymerization method is described in Nippon Kagaku Kai (compiler), *Jikken Kagaku Koza* 28, *Kobunshi Gosei* (*Lecture* 28 *of Experimental Chemistry, Synthesis of Polymer*), Maruzene, and Nippon Kagaku Kai (compiler), *Shin Jikken Kagaku Koza* 19, *Kobunshi Kagaku* (*New Lecture* 19 *of Experimental Chemistry, Polymer Chemistry*), Maruzene.

In the resin (A), the metal component such as Na, K, Ca, Fe and Mg is preferably contained in a small amount. More specifically, the content of each metal species contained in the resin is preferably 300 ppb or less, more preferably 200 ppb or less, still more preferably 100 ppb or less.

Specific examples of the resin (A) for use in the present invention are set forth below, however, the present invention is not limited thereto.

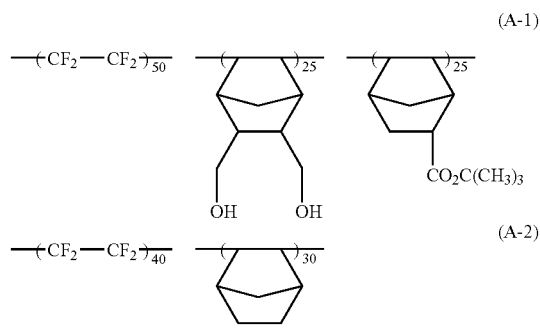

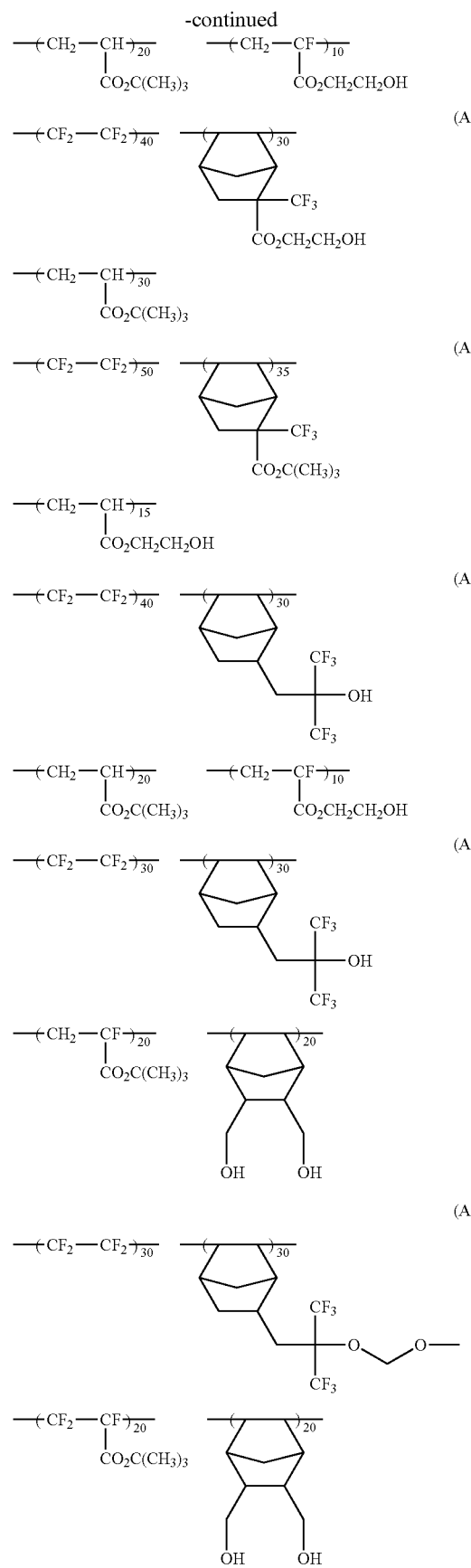
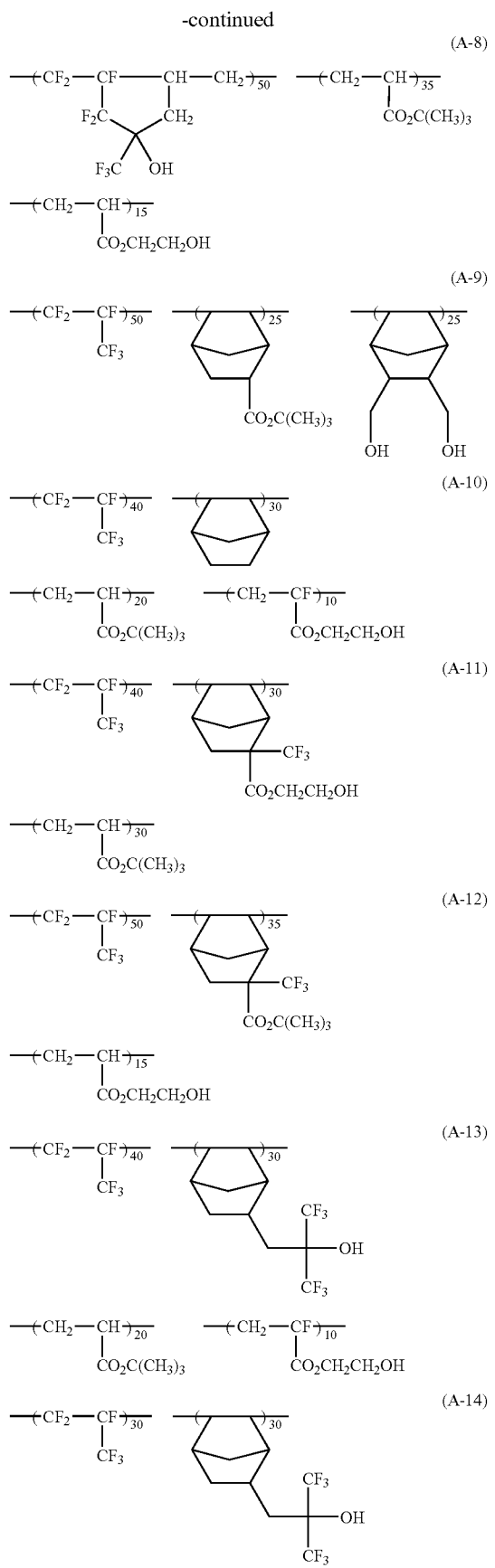

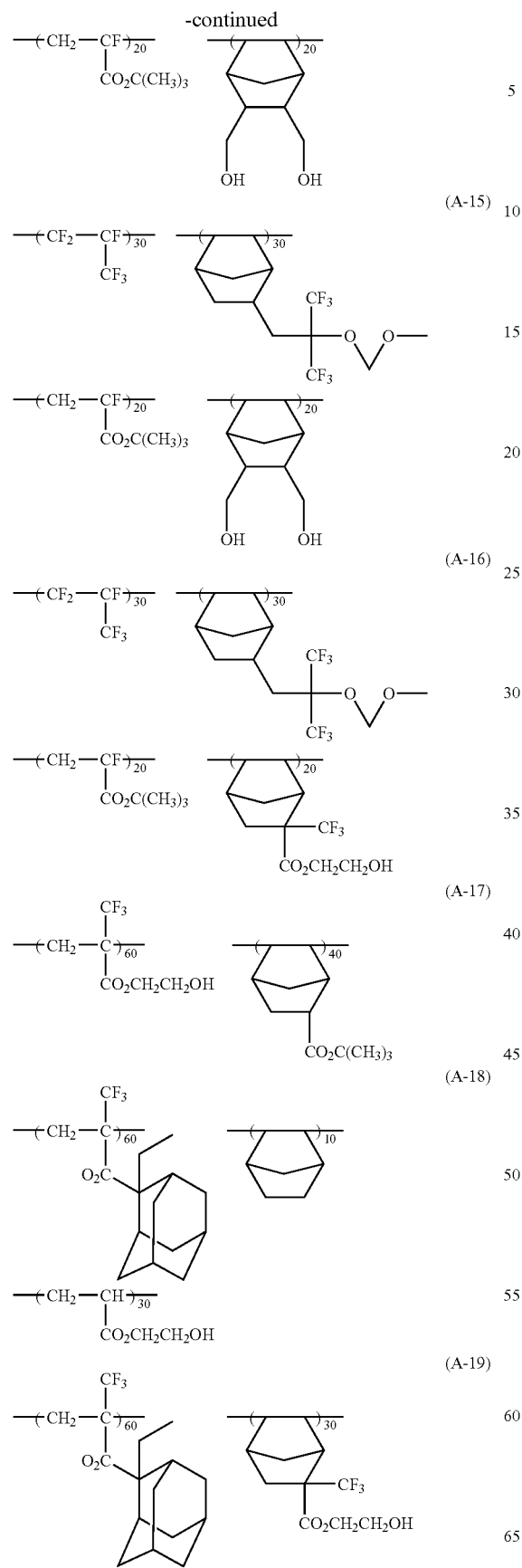

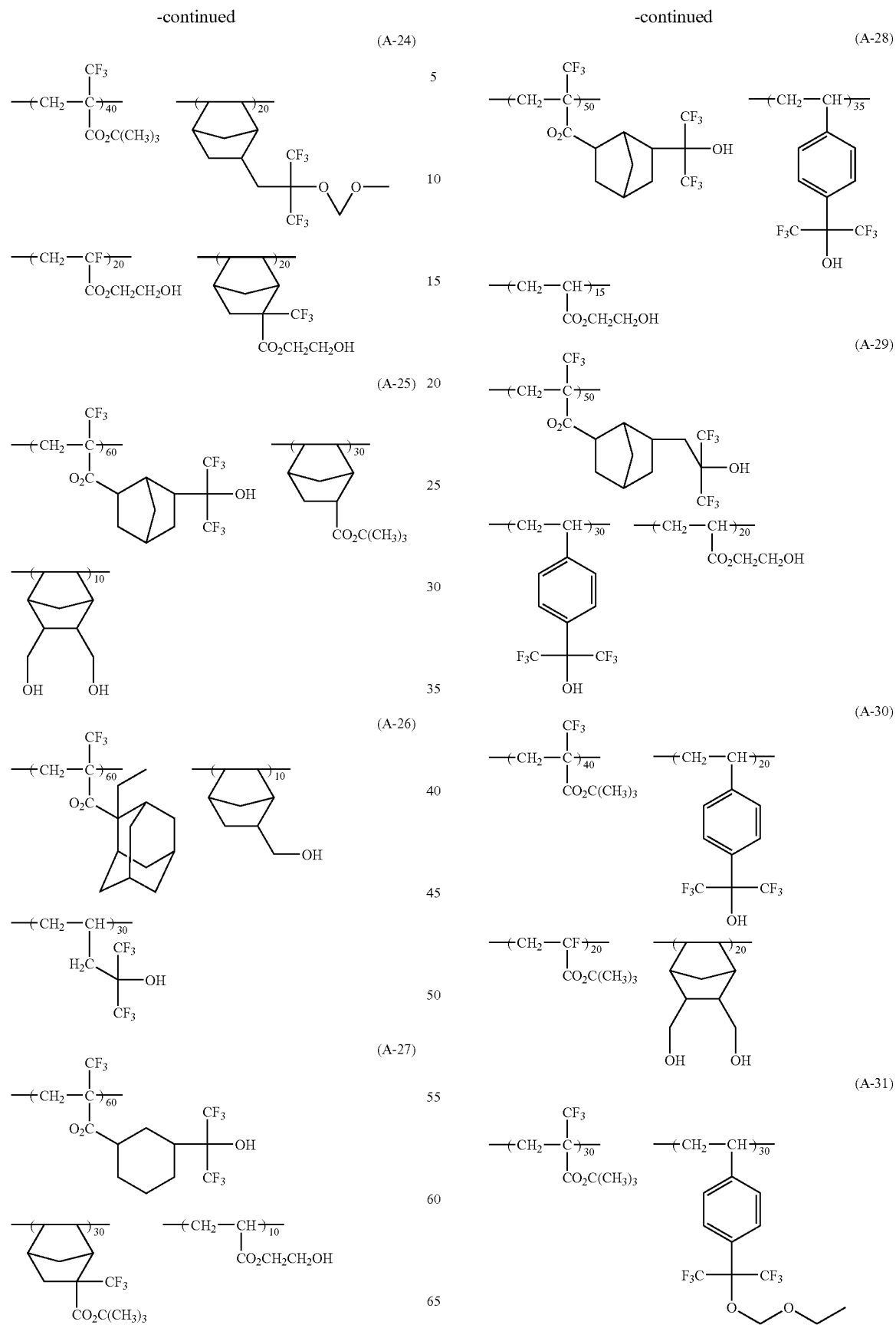

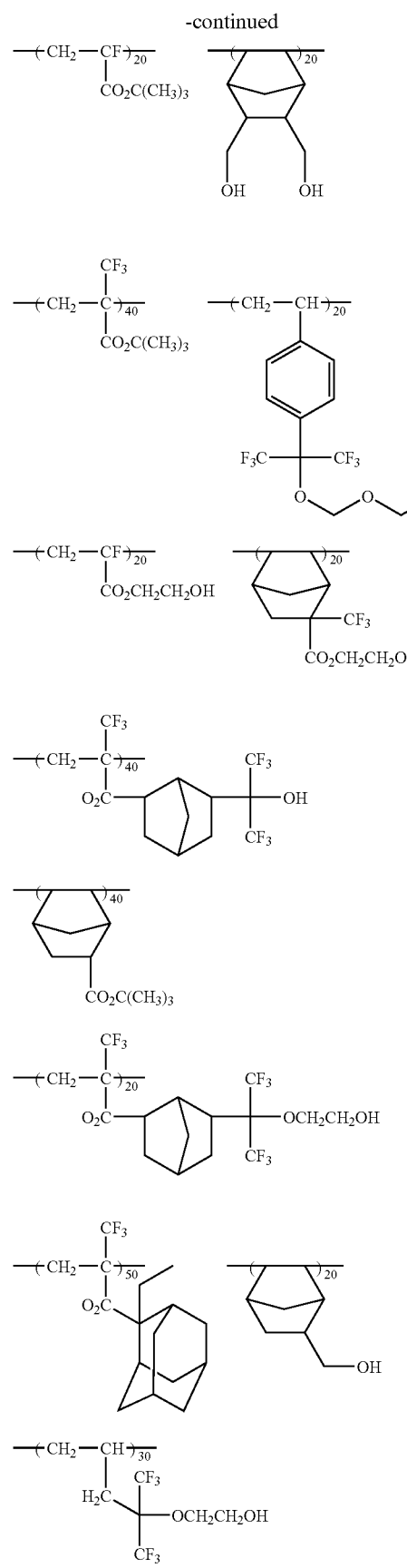
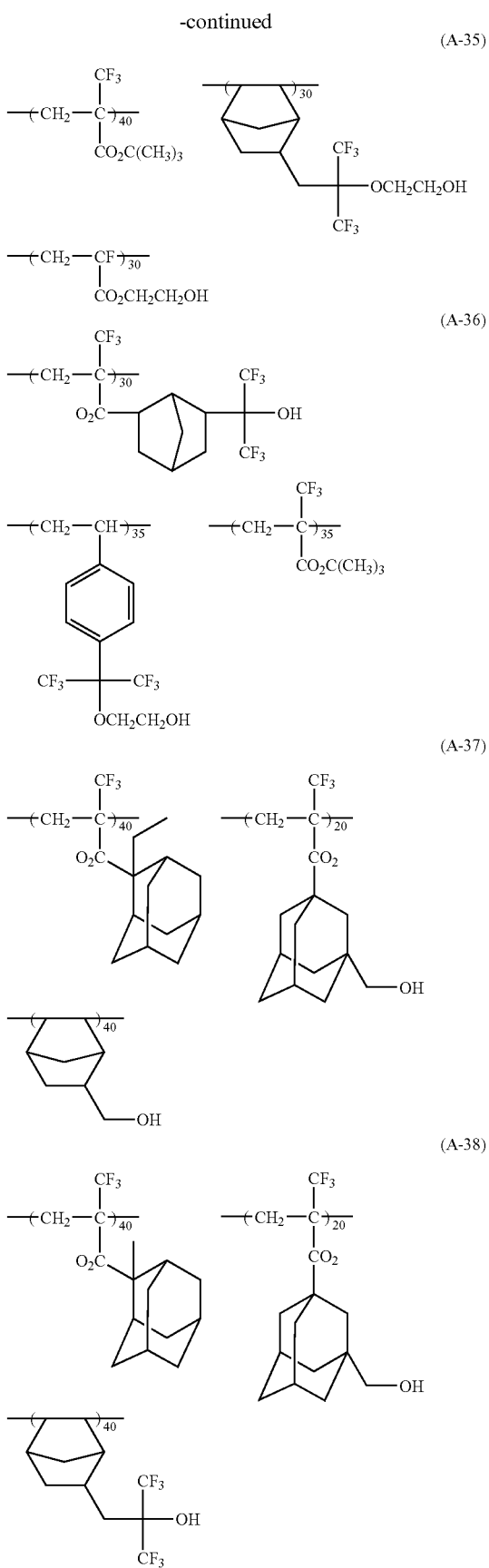

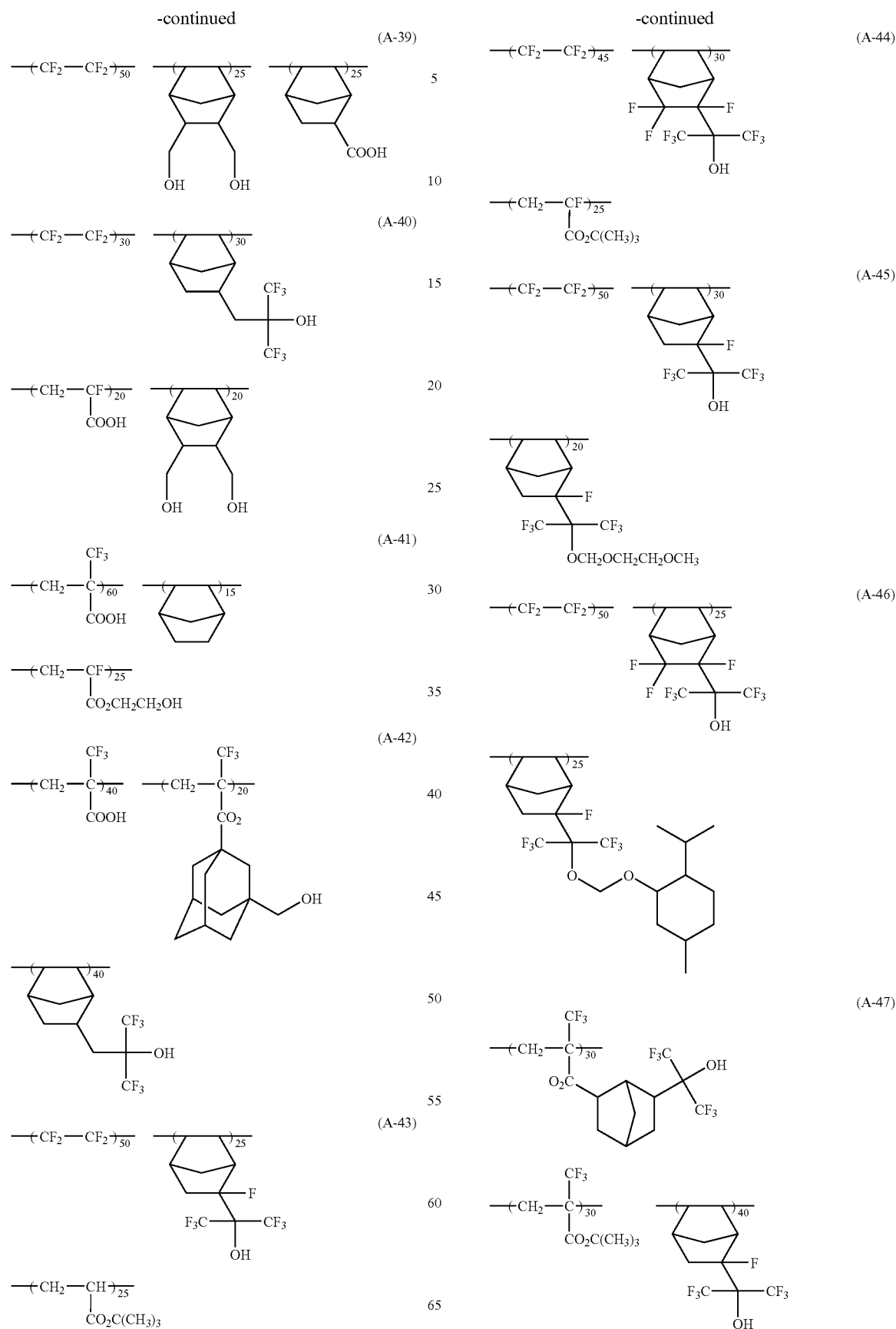

-continued

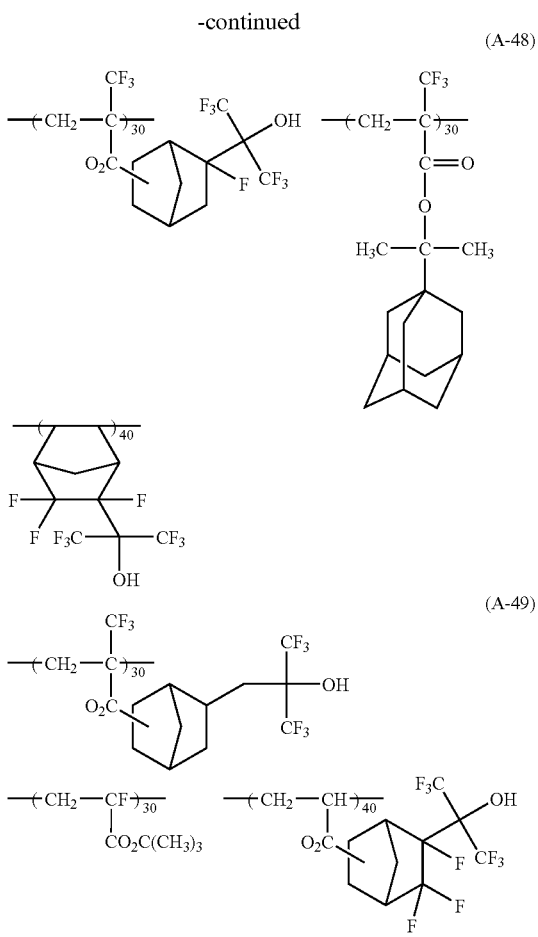

[2] Compound Generating an Acid Upon Irradiation with an Actinic Ray (Component B)

The positive resist composition of the present invention contains a compound generating an acid upon irradiation of an actinic ray, particularly, $F_2$ excimer laser light. This compound is not particularly limited, but a compound generating an organic sulfonic acid upon irradiation with an actinic ray (component B1), particularly $F_2$ excimer laser light, is preferably contained.

In particular, the component (B1) preferably contains one or more compound generating an organic sulfonic acid containing at least one fluorine atom under the action of an actinic ray and one or more compound generating an organic sulfonic acid not containing a fluorine atom under the action of an actinic ray.

Also, a compound generating a carboxylic acid under the action of an actinic ray (component B2) is preferably further contained. By combining the component (B2) with the component (B1), the coatability and contrast can be elevated.

In the components (B1) and (B2), the organic sulfonic acid and carboxylic acid each may be either aliphatic or aromatic.

In the component (B1), the sulfonic acid preferably has from 1 to 20 carbon atoms, more preferably from 2 to 16 carbon atoms, still more preferably from 3 to 12 carbon atoms.

The components (B1) and (B2) which are a compound generating an acid upon irradiation with an actinic ray can be selected from those generally used as the compound which decomposes upon irradiation with an actinic ray to generate an acid (photoacid generator).

More specifically, these components may be appropriately selected from photoinitiators for photocationic polymerization, photoinitiators for photoradical polymerization, photo-decoloring agents for dyes, photo-discoloring agents, compounds capable of generating an acid upon irradiation with known light used for microresist and the like (for example, ultraviolet or far ultraviolet light of 200 to 400 nm, preferably g line, h line, i line and KrF excimer laser light) or with ArF excimer laser light, $F_2$ excimer laser light, electron beam, X ray, molecular beam or ion beam, a radiation and a mixture thereof.

Examples of these compounds include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re27,992, JP-A-3-140140 (the term "JP-A" as used herein means an "unexamined published Japanese patent application"), etc., phosphonium salts described in D. C. Necker et al., *Macromolecules*, 17, 2468 (1984), C. S. Wen et al., *Teh, Proc. Conf. Rad. Curing ASIA*, p. 478, Tokyo, Oct. (1988), U.S. Pat. Nos. 4,069,055 and 4,069,056, etc., iodonium salts described in J. V. Crivello et al., *Macromolecules*, 10 (6) 1307 (1977), *Chem. & Eng. News*, Nov. 28, p. 31 (1988), European Patents 104,143, 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), European Patents 370,693, 161,811, 410,201, 339,049, 233, 567, 297,443 and 297,442, U.S. Pat. Nos. 4,933,377, 3,902, 114, 4,760,013, 4,734,444 and 2,833,827, German Patents 2,904,626, 3,604,580 and 3,604,581, etc., selenonium salts described in J. V. Crivello et al., *Macromolecules*, 10 (6), 1307 (1977), J. V. Crivello et al., *J. Polymer Sci.*, Polymer Chem. Ed., 17, 1047 (1979), etc., and arsonium salts described in C. S. Wen et al., *Teh, Proc. Conf. Rad. Curing ASIA*, p. 478, Tokyo, October (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photoacid generators having an o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388,343, U.S. Pat. Nos. 3,901,710 and 4,181,531, JP-A-60-198538, JP-A-53-133022, etc.; compounds which photochemically decompose to generate a sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199, 672, 84,515, 044,115, 618,564 and 0,101,122, U.S. Pat. Nos. 4,371,605 and 4,431,774, JP-A-64-18143, JP-A-2-245756, JP-A-3-140109, etc.; and disulfone compounds described in JP-A-61-166544, etc.

The combination of the components B1 and B2 is preferably the following combination.

This is a combination of, as the component B1, a compound capable of generating an aliphatic or aromatic sulfonic acid substituted by at least one fluorine atom upon irradiation with an actinic ray and a compound of generating an aliphatic or aromatic sulfonic acid not containing a fluorine atom, with as the component B2, an ionic compound having an aliphatic or aromatic carboxylic acid which may have a fluorine atom.

[a] The compound generating a fluorine-containing sulfonic acid upon irradiation with an actinic ray (and the ionic compound having a fluorine-containing sulfonic acid as anion) is described below.

Examples of this compound include a iodonium salt represented by the following formula (PAG3) and a sulfonium salt represented by the following formula (PAG4):

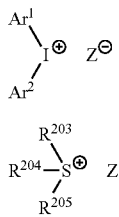

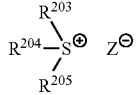

wherein $Ar^1$ and $Ar^2$ each independently represents an aryl group, $R^{203}$, $R^{204}$ and $R^{205}$ each independently represents an alkyl group or an aryl group, $Z^-$ represents a sulfonate anion having at least one fluorine atom, and two of $R^{203}$, $R^{204}$ and $R^{205}$, or $Ar^1$ and $Ar^2$ may combine through the single bond or a substituent.

The aryl group represented by $Ar^1$, $Ar^2$, $R^{203}$, $R^{204}$ and $R_{205}$ is preferably an aryl group having from 6 to 14 carbon atoms, an alkyl group is preferably an alkyl group having from 1 to 8 carbon atoms.

Preferred examples of the substituent include, for the aryl group, an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxyl group, a hydroxy group, a halogen atom and a phenylthio group, and for the alkyl group, an alkoxy group having from 1 to 8 carbon atoms, an aryl group having from 5 to 14 carbon atoms, an arylcarbonyl group having from 6 to 15 carbon atoms, a carboxyl group and a halogen atom.

The sulfonate anion represented by $Z^-$ is preferably an aliphatic hydrocarbon containing at least one fluorine atom and having from 1 to 20 carbon atoms, or an aromatic hydrocarbon containing at least one fluorine atom and having from 5 to 20 carbon atoms. These hydrocarbons each may have a substituent and examples of the substituent include an alkoxy group having from 1 to 10 carbon atoms, which may be fluorine-substituted, an alkoxycarbonyl group having from 2 to 11 carbon atoms, which may be fluorine-substituted, a phenylamino group, a phenylcarbonyl group, a halogen atom and a hydroxyl group. For the aromatic hydrocarbon, examples of the substituent further include an alkyl group having from 1 to 15 carbon atoms.

Specific examples of these salts are set forth below, however, the present invention is not limited thereto.

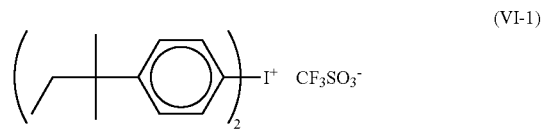

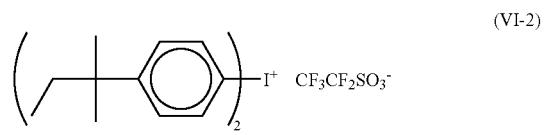

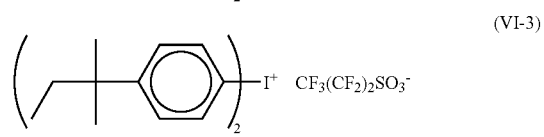

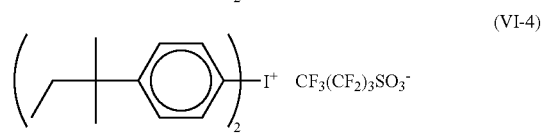

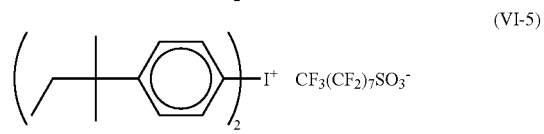

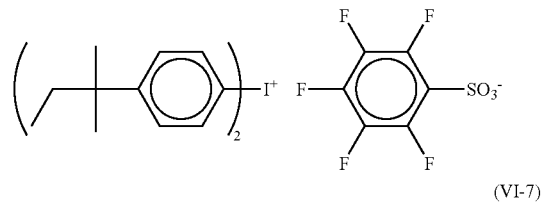

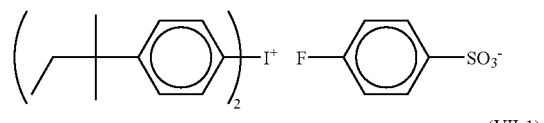

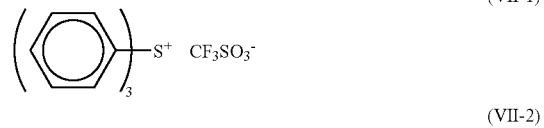

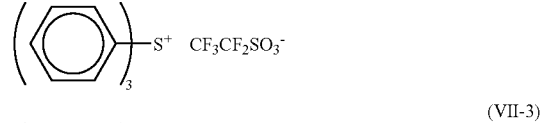

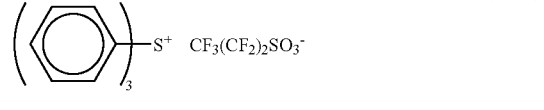

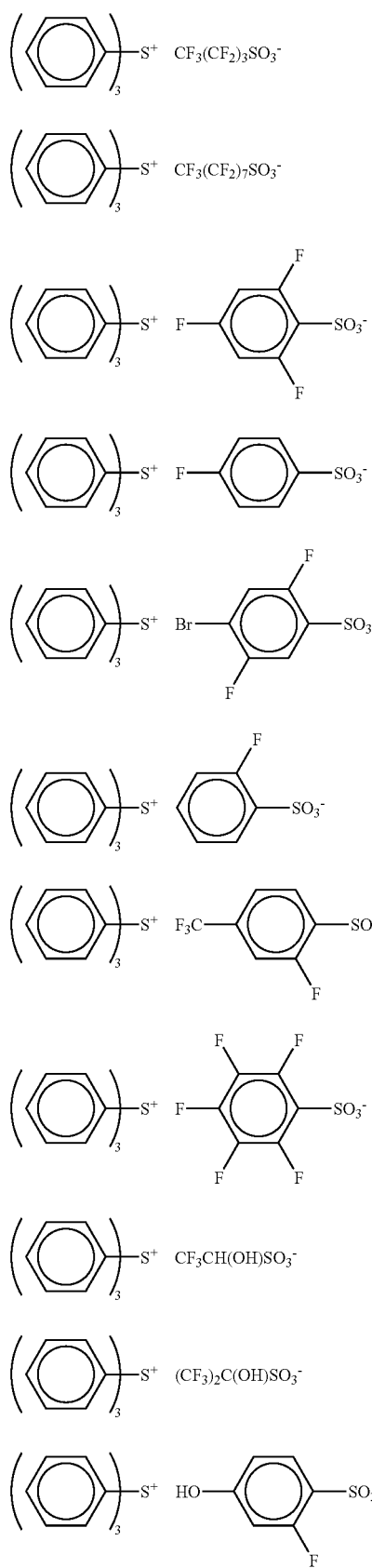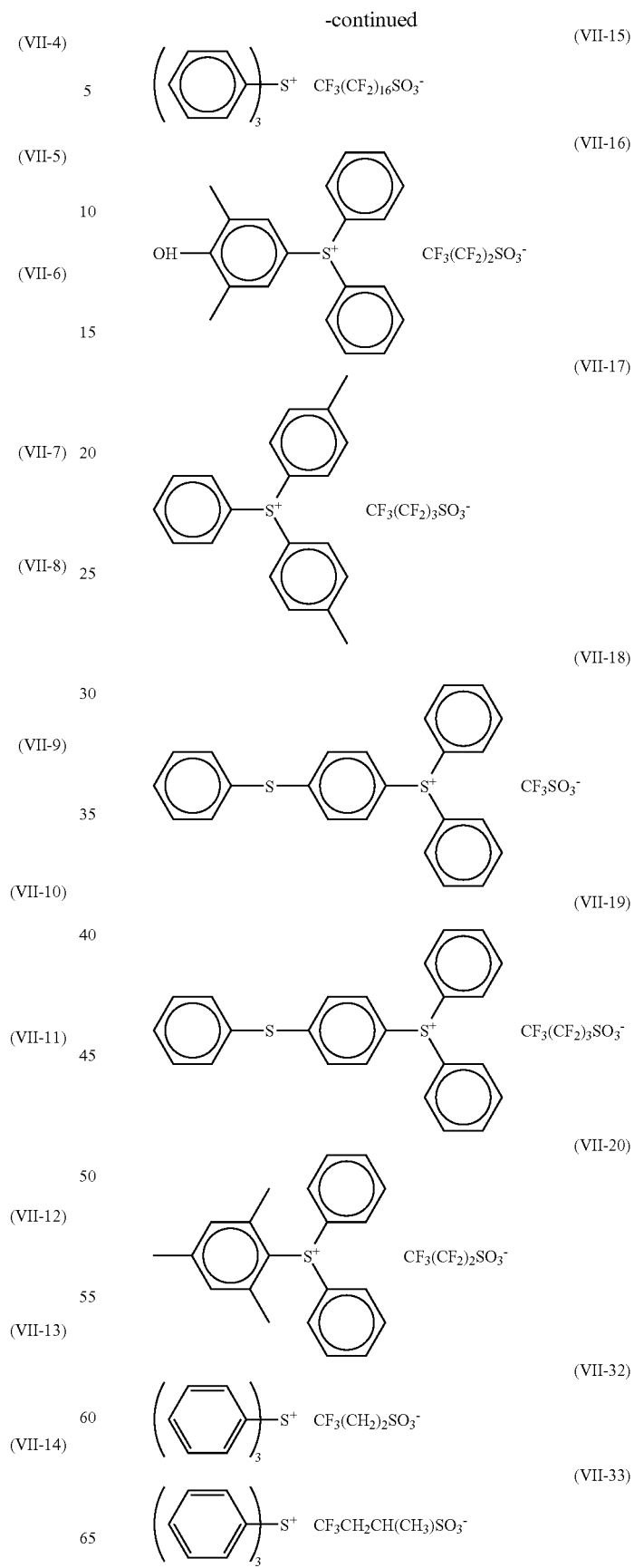

-continued

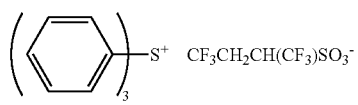 (VII-34)

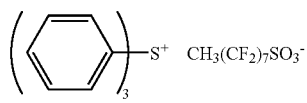 (VII-35)

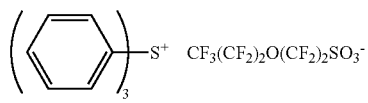 (VII-36)

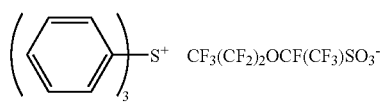 (VII-37)

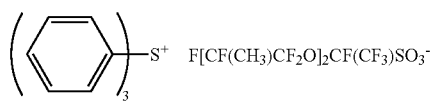 (VII-38)

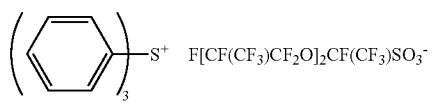 (VII-39)

[b] The compound generating a fluorine-free sulfonic acid upon irradiation with an actinic ray and the ionic compound having a fluorine-free sulfonic acid as anion include, for example, the iodonium salt and sulfonium salt represented by formulae (PAG3) and (PAG4) where $Z^-$ is a sulfonate anion not containing a fluorine atom.

Specific examples thereof include the compounds set forth below, however, the present invention is not limited thereto.

(PAG4-1)

(PAG4-2)

(PAG4-3)

-continued

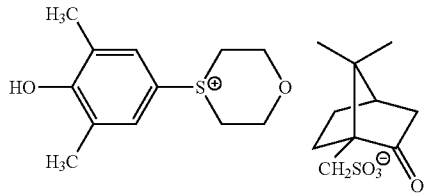 (PAG4-5)

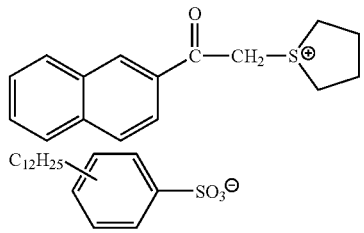 (PAG4-6)

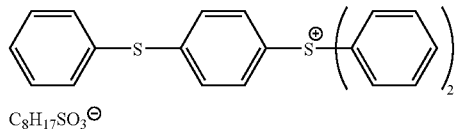 (PAG4-7)

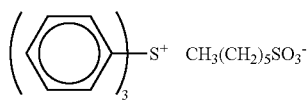 (PAG4-8)

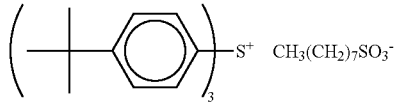 (PAG4-9)

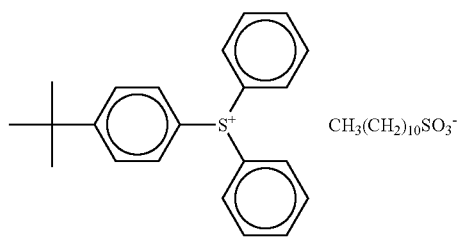 (PAG4-10)

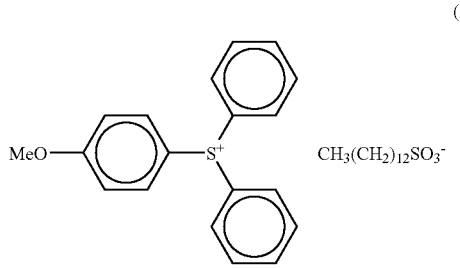 (PAG4-11)

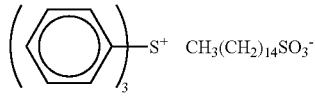 (PAG4-12)

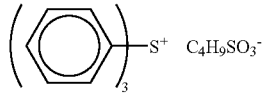 (PAG4-13)

A disulfone derivative represented by the following formula (PAG5) and an iminosulfonate derivative represented by formula (PAG6) may also be used.

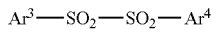
(PAG5)

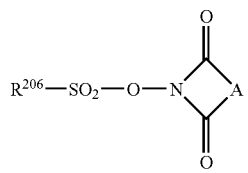
(PAG6)

wherein $Ar^3$ and $Ar^4$ each independently represents a substituted or unsubstituted aryl group, $R^{206}$ represents a substituted or unsubstituted alkyl group or an aryl group, and A represents a substituted or unsubstituted alkylene group, an alkenylene group or an arylene group.

Specific examples thereof include the compounds set forth below, however, the present invention is not limited thereto.

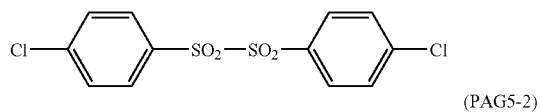
(PAG5-1)

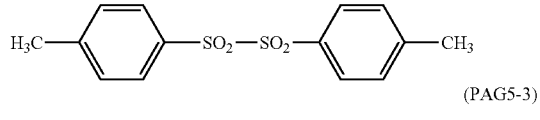
(PAG5-2)

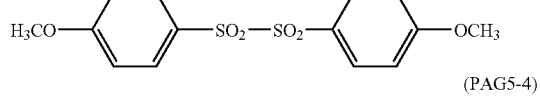
(PAG5-3)

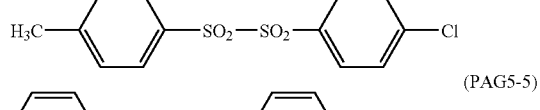
(PAG5-4)

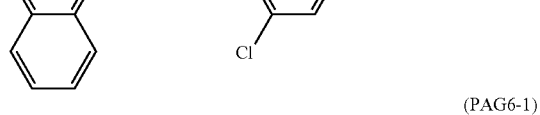
(PAG5-5)

(PAG6-1)

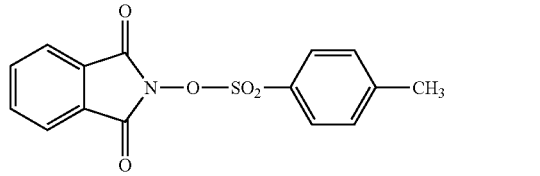
(PAG6-2)

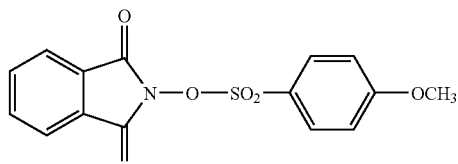
(PAG6-3)

(PAG6-4)

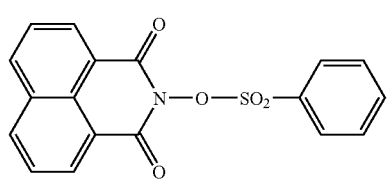

In addition, a diazodisulfone derivative represented by the formula (PAG7) may also be used.

(PAG7)

$$R-\underset{\underset{O}{\|}}{\overset{\overset{O}{\|}}{S}}-\overset{N_2}{\underset{\|}{C}}-\underset{\underset{O}{\|}}{\overset{\overset{O}{\|}}{S}}-R$$

wherein each R represents an alkyl group, a cycloalkyl group or an aryl group which may be substituted.

Specific examples thereof include the compounds set forth below, however, the present invention is not limited thereto.

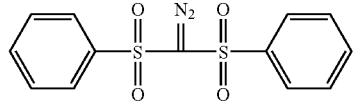
(PAG7-1)

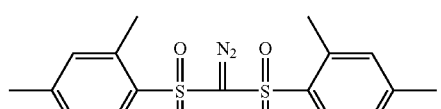
(PAG7-2)

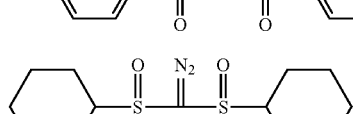
(PAG7-3)

(PAG7-4)

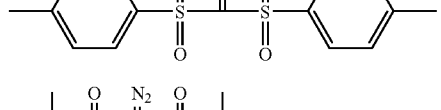
(PAG7-5)

The compounds described in [a] and [b] above can be synthesized by reacting an aromatic compound with use of a periodate and salt-exchanging the obtained iodonium salt with a corresponding sulfonic acid.

Also, the compounds can be synthesized by reacting an aryl Grignard's reagent such as aryl magnesium bromide with a substituted or unsubstituted phenylsulfoxide and salt-exchanging the obtained triarylsulfonium halide with a corresponding sulfonic acid. Furthermore, the compounds can be synthesized by a method of condensing and salt-exchanging a substituted or unsubstituted phenylsulfoxide and a corresponding aromatic compound with use of an acid catalyst such as methanesulfonic acid/diphosphorus pentoxide or aluminum chloride, or a method of condensing and salt-exchanging a diaryl iodonium salt and diaryl sulfide with use of a catalyst such as copper acetate.

The salt-exchanging can be performed by once synthesizing a halide salt and then converting it into a sulfonate with use of a silver reagent such as silver oxide, or by using an ion exchange resin. The sulfonic acid or sulfonate for use in the salt-exchanging may be a commercially available product or may be obtained by the hydrolysis or the like of a commercially available sulfonic acid halide.

[c] A compound generating a fluorine-containing carboxylic acid upon irradiation with an actinic ray and an ionic compound having a fluorine-containing carboxylic acid as anion are described.

Examples of the fluorine-substituted aliphatic carboxylic acid include a fluorine-substitution product of an aliphatic carboxylic acid such as acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid and tridecanoic acid. These carboxylic acids each may have a hydroxyl group, an alkoxy group or a halogen atom as the substituent. In particular, those containing a linking group such as oxygen atom, sulfur atom, carbonyl group, carboxyl group and sulfonyl group in the aliphatic chain are preferred.

Preferred examples of the fluorine-substituted aliphatic carboxylic acid include an aliphatic carboxylic acid represented by the following formula:

L—(CH$_2$)$_p$(CF$_2$)$_q$(CH$_2$)$_r$—COOH wherein L represents a hydrogen atom or a fluorine atom, p and r each independently represents an integer of 0 to 15 and q represents an integer of 1 to 15. The hydrogen atom or fluorine atom of the alkyl chain in this formula may be substituted by an alkyl group (preferably having from 1 to 5 carbon atoms) which may be substituted by a fluorine atom, an alkoxy group (preferably having from 1 to 5 carbon atoms) which may be substituted by a fluorine atom, or a hydroxyl group.

The fluorine-substituted aliphatic carboxylic acid is preferably a fluorine-substitution product of a saturated aliphatic carboxylic acid having from 2 to 20 carbon atoms, more preferably from 4 to 20 carbon atoms. By having 4 or more carbon atoms, diffusibility in the decomposing property of carboxylic acid generated decreases and the change in line width due to aging after exposure until heating can be more suppressed. In particular, a fluorine-substitution product of a linear or branched saturated aliphatic carboxylic acid having from 4 to 18 carbon atoms is preferred.

The fluorine-substituted aromatic carboxylic acid is preferably a fluorine-substitution product of an aromatic carboxylic acid having from 7 to 20 carbon atoms, more preferably from 7 to 15 carbon atoms, still more preferably from 7 to 11 carbon atoms. Specific examples thereof include a fluorine-substitution product of an aromatic carboxylic acid such as benzoic acid, substituted benzoic acid, naphthoic acid, substituted naphthoic acid, anthracenecarboxylic acid and substituted anthracenecarboxylic acid (examples of the substituent include an alkyl group, an alkoxy group, a hydroxyl group, a halogen atom, an aryl group, an acyl group, an acyloxy group, a nitro group, an alkylthio group and an arylthio group). Among these, a fluorine-substitution product of benzoic acid or substituted benzoic acid is preferred.

The fluorine atom-substituted aliphatic or aromatic carboxylic acid is an aliphatic or aromatic carboxylic acid where one or more hydrogen atom present in the skeleton except for the carboxyl group is substituted by a fluorine atom, preferably an aliphatic or aromatic carboxylic acid where all hydrogen atoms present in the skeleton except for the carboxyl group are substituted by a fluorine atom (that is, a perfluoro saturated aliphatic carboxylic acid or a perfluoro aromatic carboxylic acid). By this constitution, more excellent sensitivity is obtained.

The compound is preferably an onium salt compound (e.g., sulfonium salt, iodonium salt) having, as the counter anion, an anion of such a fluorine atom-substituted aliphatic or aromatic carboxylic acid, an imidocarboxylate compound having a carboxylic acid ester group, or a nitrobenzyl ester compound.

The compound is more preferably a compound represented by the following formula (I'), (II') or (III'). By using such a compound, more excellent effect is obtained in the sensitivity, resolution and exposure margin. This compound generates a saturated aliphatic or aromatic carboxylic acid substituted by at least one fluorine atom, corresponding to X$^-$ of formulae (I') to (III'), upon irradiation with an actinic ray and functions as a photoacid generator.

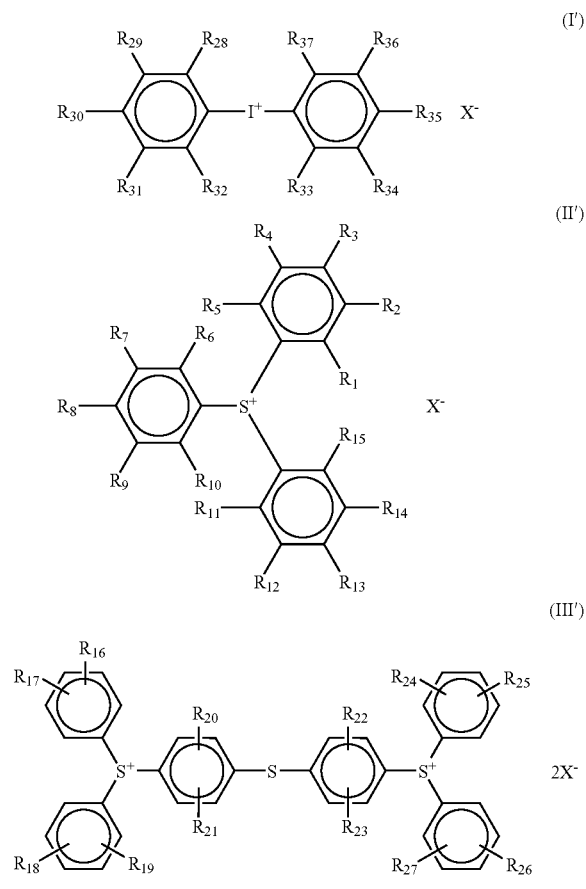

(wherein $R_1$ to $R_{37}$ each independently represents a hydrogen atom, an alkyl group, a cycloalkyl group, an alkoxy group, a cyclic alkoxy group, a hydroxy group, a halogen atom or an —S—$R_{38}$ group, $R_{38}$ represents an alkyl group, a cycloalkyl group or an aryl group, and X⁻ represents an anion of an aliphatic or aromatic carboxylic acid substituted by at least one fluorine atom).

X⁻ is preferably an anion of a perfluoro aliphatic or aromatic carboxylic acid, more preferably an anion of a fluorine-substituted alkylcarboxylic acid having 4 or more carbon atoms.

In formulae (I') to (III'), the linear or branched alkyl group represented by $R_1$ to $R_{38}$ includes a linear or branched alkyl group having from 1 to 4 carbon atoms, which may have a substituent, such as methyl group, ethyl group, propyl group, n-butyl group, sec-butyl group and tert-butyl group. The cyclic alkyl group includes a cyclic alkyl group having from 3 to 8 carbon atoms, which may have a substituent, such as cyclopropyl group, cyclopentyl group and cyclohexyl group.

The alkoxy group represented by $R_1$ to $R_{37}$ includes an alkoxy group having from 1 to 4 carbon atoms, such as methoxy group, ethoxy group, hydroxyethoxy group, propoxy group, n-butoxy group, isobutoxy group, sec-butoxy group and tert-butoxy group.

The halogen atom represented by $R_1$ to $R_{37}$ includes a fluorine atom, a chlorine atom, a bromine atom and an iodine atom.

The aryl group represented by $R_{38}$ includes an aryl group having from 6 to 14 carbon atoms, such as phenyl group, tolyl group, methoxyphenyl group and naphthyl group. The aryl group may have a substituent.

Preferred examples of the substituent include an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

The iodonium or sulfonium compound represented by formulae (II) to (III') for use in the present invention has, as the counter anion X⁻, an anion of a saturated aliphatic or aromatic carboxylic acid substituted by at least one fluorine atom. This anion is an anion (—COO—) resulting from desorption of a hydrogen atom of the carboxylic acid (—COOH).

Specific examples of these compounds are set forth below, however, the present invention is not limited thereto.

Specific Examples (I-1f) to (I-6f) of Photoacid Generator Represented by Formula (I'):

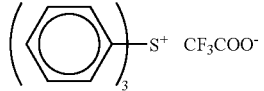
(I-1f)

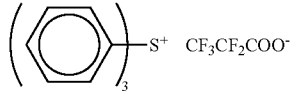
(I-2f)

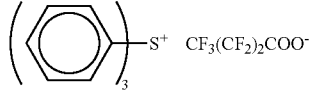
(I-3f)

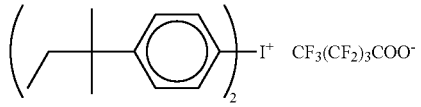
(I-4f)

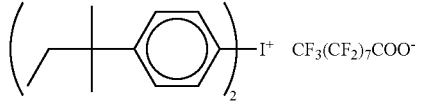
(I-5f)

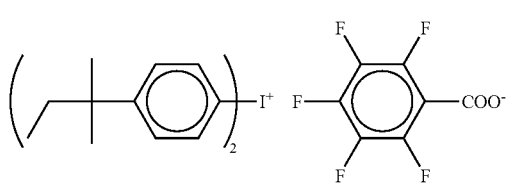
(I-6f)

Specific Examples (II-1f) to (II-13f) of Photoacid Generator Represented by Formula (II'):

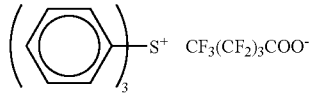
(II-1f)

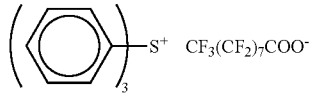
(II-2f)

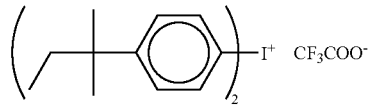
(II-3f)

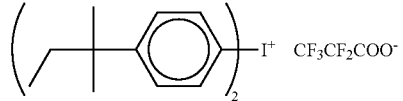
(II-4f)

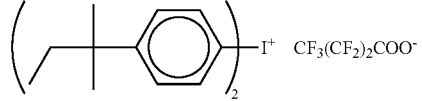
(II-5f)

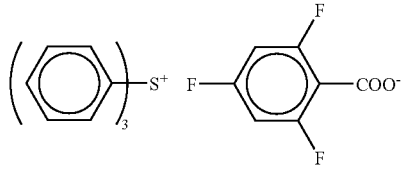
(II-6f)

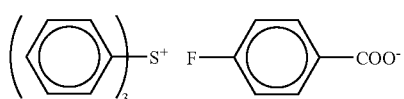
(II-7f)

Specific Examples (III-1f) to (III-3f) of Photoacid Generator Represented by Formula (III'):

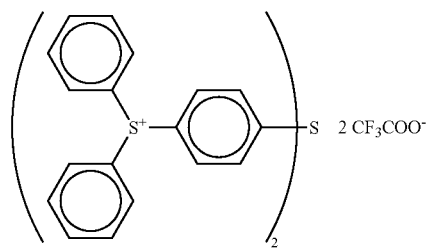
(III-1f)

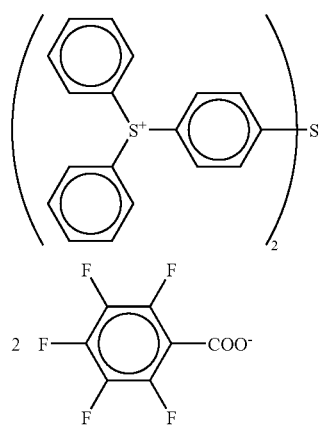
(III-2f)

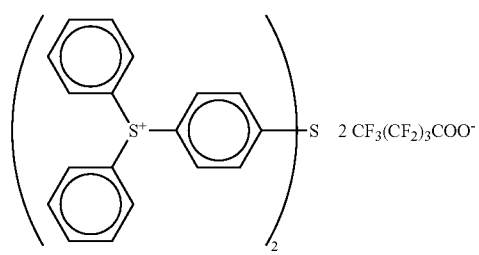
(III-3f)

Specific Examples (IV-1f), (IV-2f), (V-1f) and (V-2f) of Other Photoacid Generators:

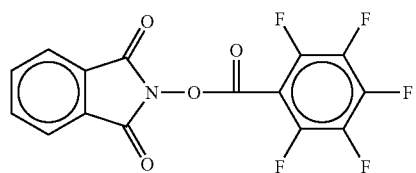
(IV-1f)

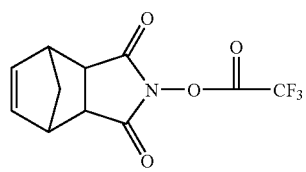
(IV-2f)

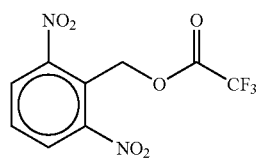
(V-1f)

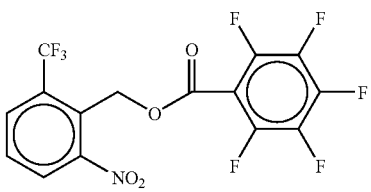
(V-2f)

The compound represented by formula (I') can be synthesized by reacting an aromatic compound with use of a periodate and salt-exchanging the obtained iodonium salt with a corresponding carboxylic acid.

The compounds represented by formulae (III) and (III') can be synthesized by reacting an aryl Grignard's reagent such as aryl magnesium bromide with a substituted or unsubstituted phenylsulfoxide and salt-exchanging the obtained triarylsulfonium halide with a corresponding carboxylic acid. These compounds can also be synthesized by a method of condensing and salt-exchanging a substituted or unsubstituted phenylsulfoxide and a corresponding aromatic compound with use of an acid catalyst such as methanesulfonic acid/diphosphorus pentoxide or aluminum chloride, or a method of condensing and salt-exchanging a diaryl iodonium salt and diaryl sulfide with use of a catalyst such as copper acetate.

The salt-exchanging can be performed by once synthesizing a halide salt and converting it into a carboxylate with use of a silver reagent such as silver oxide, or by using an ion exchange resin. The carboxylic acid or carboxylate for use in the salt-exchanging may be a commercially available product or may be obtained by hydrolysis of a commercially available carboxylic acid halide.

For the fluorine-substituted carboxylic acid as the anion moiety, a carboxylic acid derived from a fluoro-aliphatic compound produced by telomerization method (also called a telomer method) or an oligomerization (also called an oligomer method) is also preferably used. The production process of this fluoro-aliphatic compound is described, for example, in Nobuo Ishikawa (supervisor), *Fusso Kagobutsu no Gosei to Kino (Synthesis and Function of Fluorine Compounds)*, CMC, pp. 117-118 (1987), and Milos Hudlicky and Attila E. Pavlath, *Chemistry of Organic Fluorine Compounds II*, Monograph 187, pp. 747-752, American Chemical Society (1995). The telomerization is a method of radical-polymerizing a fluorine-containing vinyl compound such as tetrafluoroethylene by using an alkyl halide having a large chain transfer constant, such as iodide, as the telogen to synthesize a telomer (an example is shown in Scheme-1). In the synthesis by the telomer method, a mixture containing a plurality of compounds differing in the carbon chain length is obtained. This mixture may be used as it is or may be purified before use.

[d] Specific examples of the compound generating a fluorine-free carboxylic acid upon irradiation with an actinic ray and the ionic compound having a fluorine-free carboxylic acid as anion are described below, however, the present invention is not limited thereto.

Examples thereof include the compounds represented by the following formulae (AI) to (AV):

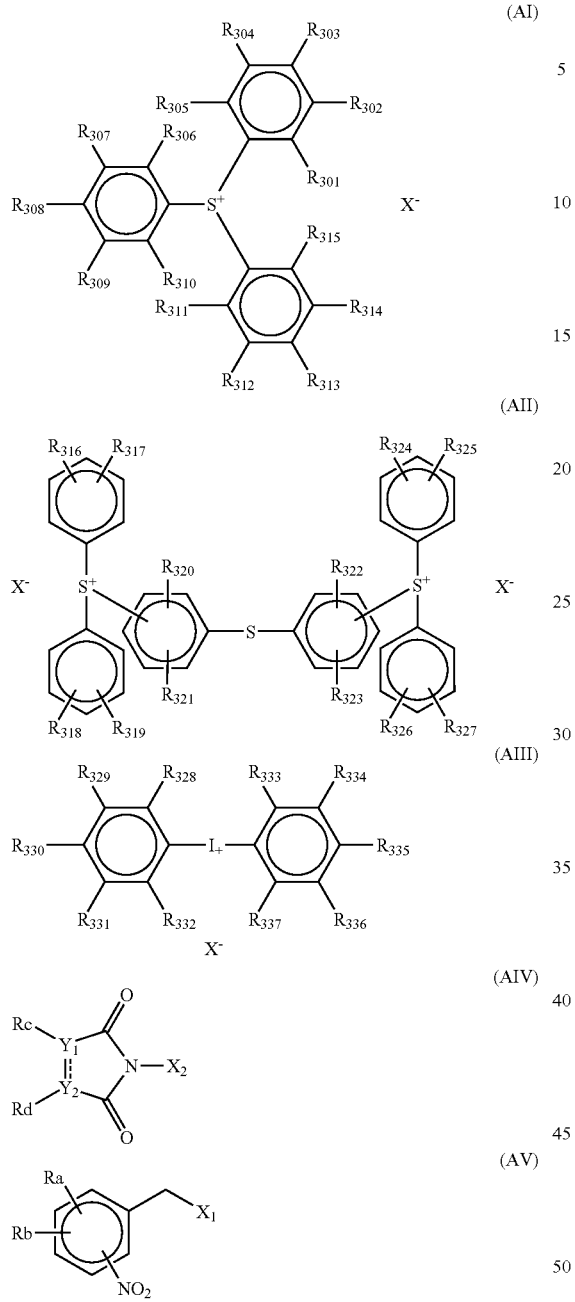
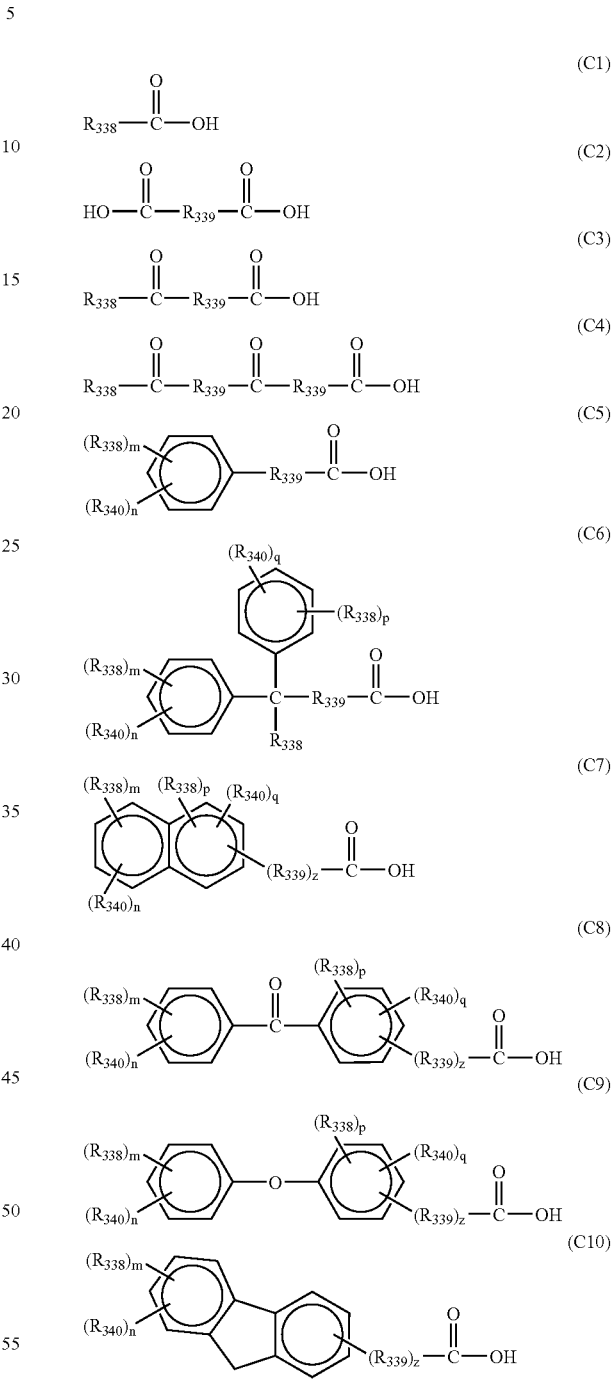

by the following formula, and $X_1$ and $X_2$ each independently represents a compound where the carboxyl group moiety of a carboxylic acid compound shown by the following formula is converted into an ester group:

wherein $R_{301}$ to $R_{337}$ each independently represents a hydrogen atom, an alkyl group, a cycloalkyl group, an alkoxy group, a cycloalkoxy group, a hydroxy group, a halogen atom or an —S—$R_0$ group, $R_0$ represents an alkyl group, a cycloalkyl group or an aryl group, Ra and Rb each independently represents a hydrogen atom, a nitro group, a halogen atom or an alkyl or alkoxy group which may have a substituent, Rc and Rd each independently represents a halogen atom or an alkyl or aryl group which may have a substituent, Rc and Rd may combine to form an aromacyclic, monocyclic or polycyclic hydrocarbon (the ring may contain an oxygen atom or a nitrogen atom), $Y_1$ and $Y_2$ each represents a carbon atom, the $Y_1$-$Y_2$ bond may be a single bond or a double bond, $X^-$ represents an anion of a carboxylic acid compound shown wherein $R_{338}$ represents a linear, branched or cyclic alkyl group having from 1 to 30 carbon atoms (the alkyl group may contain in the chain thereof an oxygen atom or a nitrogen atom), a linear, branched or cyclic alkenyl group having from 1 to 20 carbon atoms, a linear, branched or cyclic alkynyl group having from 1 to 20 carbon atoms, a linear, branched or cyclic alkoxyl group having from 1 to 20 carbon atoms, a group where at least a part of the hydrogen atom in the above-described alkyl group is substituted by a halogen atom and/or a hydroxyl group, a group where at least a part of the hydrogen atom in the above-described alkenyl group is substituted by a halogen atom and/or a hydroxyl group, or a substituted or unsubstituted aryl group having from 6 to 20 carbon atoms (examples of the substituent of the aryl group include an alkyl group, a nitro group, a hydroxyl group, an alkoxy group, an acyl group, an alkoxycarbonyl group and a halogen atom), $R_{339}$ represents a single bond, a linear, branched or cyclic alkylene group having from 1 to 20 carbon atoms (the alkylene group may contain in the chain thereof an oxygen atom or a nitrogen atom), a linear, branched or cyclic alkenylene group having from 1 to 20 carbon atoms, a group where at least a part of the hydrogen atom in the above-described alkylene group is substituted by a halogen atom and/or a hydroxyl group, a group where at least a part of the hydrogen atom in the above-described alkenylene group is substituted by a halogen atom, or an alkoxyalkylene group having from 2 to 20 carbon atoms, a plurality of $R_{338}$s or a plurality of $R_{339}$s may be the same or different, $R_{340}$ represents a hydroxyl group or a halogen atom, a plurality of $R_{340}$s may be the same or different, m, n, p and q each independently represents an integer of 0 to 3 satisfying the relationships of $m+n \leq 5$ and $p+q \leq 5$, and z represents 0 or 1.

In formulae (AI) to (AV), the linear or branched alkyl group represented by $R_{301}$ to $R_{337}$, Ra, Rb, Rc, Rd and $R_0$ includes a linear or branched alkyl group having from 1 to 4 carbon atoms, which may have a substituent, such as methyl group, ethyl group, propyl group, n-butyl group, sec-butyl group and tert-butyl group. The cyclic alkyl group includes a cyclic alkyl group having from 3 to 8 carbon atoms, which may have a substituent, such as cyclopropyl group, cyclopentyl group and cyclohexyl group.

The alkoxy group represented by $R_{301}$ to $R_{337}$, Ra and Rb includes an alkoxy group having from 1 to 4 carbon atoms, such as methoxy group, ethoxy group, hydroxyethoxy group, propoxy group, n-butoxy group, isobutoxy group, sec-butoxy group and tert-butoxy group.

The halogen atom represented by $R_{301}$ to $R_{337}$, Ra, Rb, Rc and Rd includes a fluorine atom, a chlorine atom, a bromine atom and an iodine atom.

The aryl group represented by $R_0$, Rc and Rd includes an aryl group having from 6 to 14 carbon atoms, which may have a substituent, such as phenyl group, tolyl group, methoxyphenyl group and naphthyl group.

Preferred examples of the substituent include an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

The aromacyclic, monocyclic or polycyclic hydrocarbon (the ring may contain an oxygen atom or a nitrogen atom) formed when Rc and Rd are combined includes a benzene structure, a naphthalene structure, a cyclohexane structure, a norbornene structure and an oxabicyclo structure.

The sulfonium or iodonium compound represented by formulae (AI) to (AIII) for use in the present invention contains, as the counter anion $X^-$, an anion ($-COO^-$) formed from a carboxyl group ($-COOH$) of at least one compound out of the carboxylic acid compounds represented by formulae (C1) to (C10).

The compound represented by formula (AIV) or (AV) for use in the present invention contains, as the substituent $X_1$ or $X_2$, a substituent resulting from conversion of the carboxyl group ($-COOH$) of at least one compound out of the carboxylic acid compounds represented by formula (C1) to (C10) into an ester group ($-COO-$).

The linear, branched or cyclic alkyl group having from 1 to 30 carbon atoms (the alkyl group may contain in the chain thereof an oxygen atom or a nitrogen atom) represented by $R_{338}$ includes, for example, methyl, ethyl, propyl, butyl, pentyl, hexyl, cyclohexyl, dodecyl, 1-ethoxyethyl and adamantyl.

The linear, branched or cyclic alkenyl group having from 1 to 20 carbon atoms includes, for example, ethenyl, propenyl, isopropenyl and cyclohexene.

The linear, branched or cyclic alkynyl group having from 1 to 20 carbon atoms includes, for example, acetylene and propenylene.

The linear, branched or cyclic alkoxy group having from 1 to 20 carbon atoms includes, for example, methoxy, ethoxy, propyloxy, butoxy, cyclohexyloxy, isobutoxy and dodecyloxy.

The substituted or unsubstituted aryl group having from 6 to 20 carbon atoms includes, for example, phenyl, naphthyl and anthranyl.

Examples of the substituent of the aryl group include an alkyl group, a nitro group, a hydroxyl group, an alkoxy group, an acyl group, an alkoxycarbonyl group and a halogen atom.

The linear, branched or cyclic alkylene group having from 1 to 20 carbon atoms (the alkylene group may contain in the chain thereof an oxygen atom or a nitrogen atom) represented by $R_{339}$ includes, for example, methylene, ethylene, propylene, butylene, isobutylene, ethoxyethylene and cyclohexylene.

The linear, branched or cyclic alkenylene group having from 1 to 20 carbon atoms includes, for example, vinylene and allylene.

Specific examples of these compounds are set forth below, however, the present invention is not limited thereto.

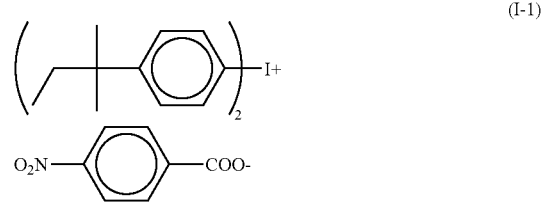

(I-1)

(I-2)

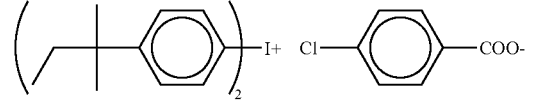

(I-3)

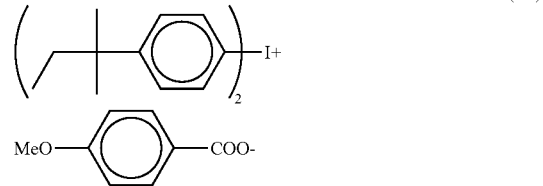

(I-4)

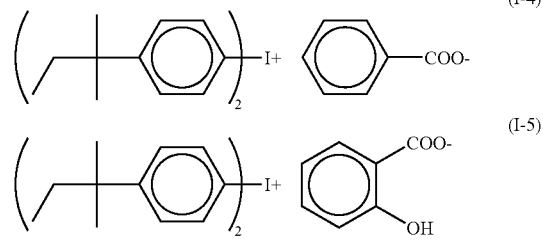

(I-5)

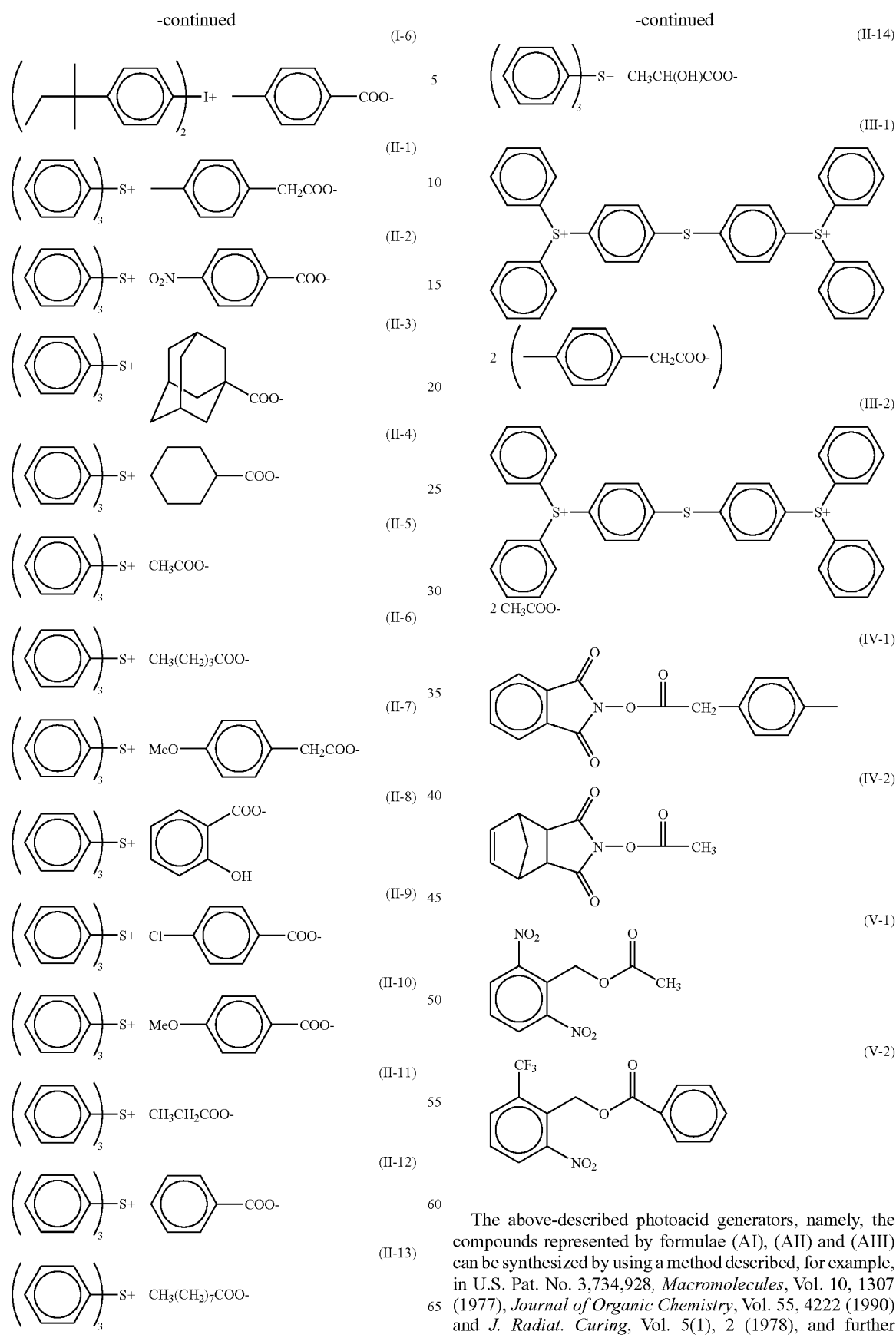
The above-described photoacid generators, namely, the compounds represented by formulae (AI), (AII) and (AIII) can be synthesized by using a method described, for example, in U.S. Pat. No. 3,734,928, *Macromolecules*, Vol. 10, 1307 (1977), *Journal of Organic Chemistry*, Vol. 55, 4222 (1990) and *J. Radiat. Curing*, Vol. 5(1), 2 (1978), and further exchanging the counter anion. The compounds represented by formulae (AIV) and (AV) can be obtained by reacting an N-hydroxyimide compound and carboxylic acid chloride under basic conditions or by reacting nitrobenzyl alcohol and carboxylic acid chloride under basic conditions.

The mass ratio of the component B1 and the component B2 added is usually from 1/1 to 50/1, preferably from 1/1 to 10/1, more preferably from 2/1 to 5/1.

The total amount of the component B is usually from 0.5 to 20 mass %, preferably from 0.75 to 15 mass %, more preferably from 1 to 10 mass %, based on the entire solid content of the composition.

As for each component B, a plurality of compounds may be contained.

[3] Non-polymer Dissolution Inhibitor (C)

The positive resist composition of the present invention contains a non-polymer dissolution inhibitor represented by formula (XA) or (XB).

The non-polymer dissolution inhibitor as used herein means a compound having a molecular weight of 3,000 or less in which at least two or more acid-decomposable groups are present and of which solubility in an alkali developer increases under the action of an acid.

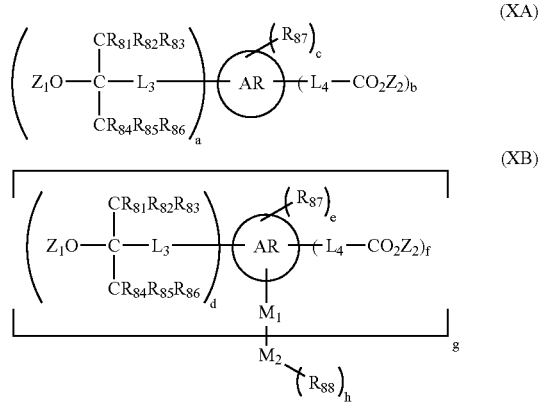

wherein

AR each independently represents an alicyclic hydrocarbon group having 7 or more carbon atoms, $R_{81}$ to $R_{86}$ each independently represents a hydrogen atom, a fluorine atom or an alkyl group, provided that at least one of $R_{81}$ to $R_{86}$ is a fluorine atom, $R_{87}$ and $R_{88}$ each independently represents a halogen atom, a hydroxy group, an alkoxy group, a cyano group or an alkyl group, $L_3$ and $L_4$ each independently represents a single bond or a divalent linking group, $Z_1$ and $Z_2$ each independently represents a hydrogen atom, an acid-decomposable group or a non-acid-decomposable group, provided that the compounds represented by formulae (XA) and (XB) each contains two or more acid-decomposable groups, $M_1$ represents a single bond or a divalent linking group, $M_2$ represents a (g+h)-valent linking group, a and b each independently represents an integer of 0 to 5, provided that a and b satisfy $2 \leq a+b \leq 10$, c represents an integer of 0 to 5, d and e each independently represents an integer of 0 to 5, provided that d and e satisfy $1 \leq d+e \leq 10$, f each independently represents an integer of 0 to 5, g represents an integer of 2 to 6, and h represents an integer of 0 to 5.

The alkyl group may have a substituent and is, for example, an alkyl group having from 1 to 8 carbon atoms and specific preferred examples thereof include a methyl group, an ethyl group, a propyl group, an n-butyl group, a sec-butyl group, a tert-butyl group, a hexyl group, a 2-ethylhexyl group and an octyl group.

The halogen atom includes a fluorine atom, a chlorine atom, a bromine atom and an iodine atom.

The alkoxy group is preferably an alkoxy group having from 1 to 8 carbon atoms and specific examples thereof include a methoxy group, an ethoxy group, a n-propoxy group, an iso-propoxy group, a butoxy group, a pentoxy group, an allyloxy group and an octoxy group. The alkoxy group is more preferably an alkoxy group having from 1 to 4 carbon atoms (e.g., methoxy, ethoxy, propoxy, butoxy).

Examples of the acid-decomposable group and non-acid-decomposable group are the same as those described above for $Y_0$ of formula (a) in the resin (A).

The divalent linking group includes, for example, an alkylene group, a cycloalkylene group, an arylene group, and a combination of such a group with an ether group, a thioether group, a carbonyl group, an ester group, an amido group, a sulfonamido group, a urethane group or a urea group. The alkylene group is preferably an alkylene group having from 1 to 8 carbon atoms and examples thereof include a methylene group, an ethylene group, a propylene group, a butylene group, a hexylene group and an octylene group. The cycloalkylene group is preferably a cycloalkylerie group having from 5 to 15 carbon atoms and examples thereof include a cyclopentylene group, a cyclohexylene group, a norbornane residue, an adamantane residue, a tricyclodecane residue and a tetracyclododecane residue. The arylene group is preferably an arylene group having from 6 to 15 carbon atoms and examples thereof include a phenylene group, a tolylene group and a naphthylene group.

The (g+h)-valent linking group is preferably a linear, branched or cyclic hydrocarbon residue having from 1 to 20 carbon atoms or an aromatic ring residue having from 6 to 20 carbon atoms. Such a group may have a substituent or may have —O—, —$CO_2$—, —CO—, —$SO_2$—, —SO— or the like between the carbon-carbon bond.

The alicyclic hydrocarbon group represented by AR may be monocyclic or polycyclic and specific examples thereof include those having an alicyclic structure containing 7 or more carbon atoms, such as monocyclo-, bicyclo-, tricyclo- or tetracyclo-structure. The number of carbon atoms is preferably from 7 to 30, more preferably from 7 to 20.

The compounds represented by formulae (XA) and (XB) each preferably contains two or more acid-decomposable groups. Examples of the acid-decomposable group are the same as those of the acid-decomposable group for $Y_0$ of formula (a) in the resin (A). Examples of the non-acid-decomposable group are the same as those of the non-acid-decomposable group for $Y_0$ of formula (a) in the resin (A).

Specific examples of the alicyclic structure are set forth below, however, the present invention is not limited thereto.

(1)

-continued
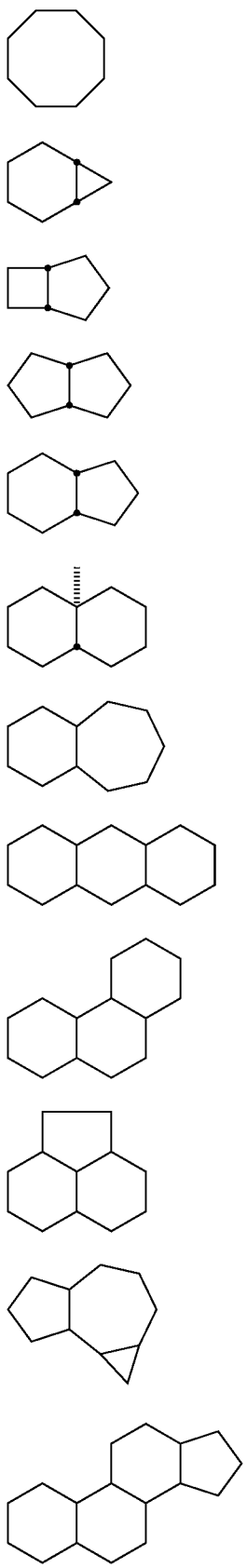
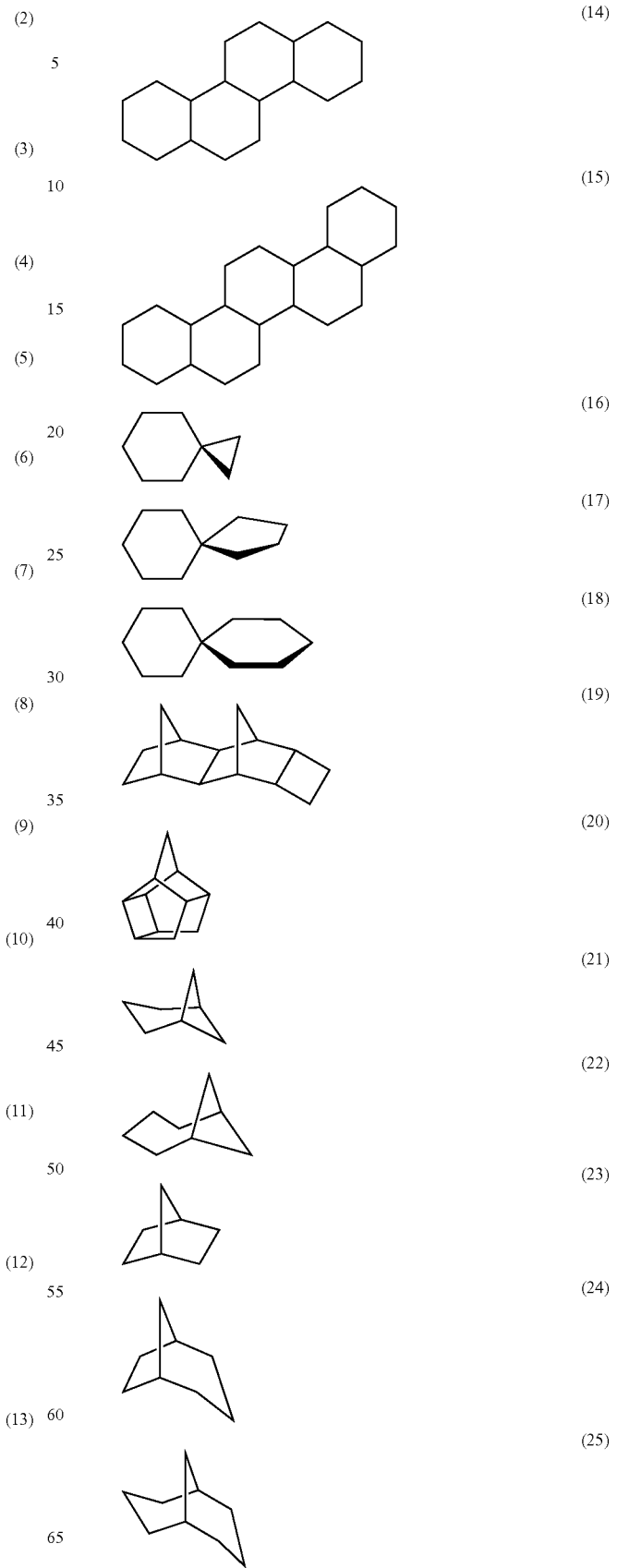

-continued
(26) 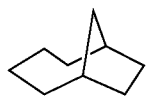
(27) 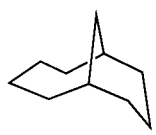
(28) 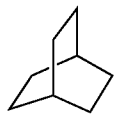
(29) 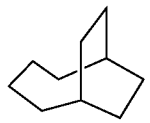
(30) 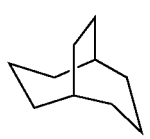
(31) 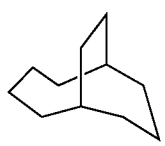
(32) 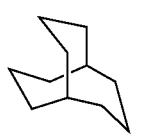
(33) 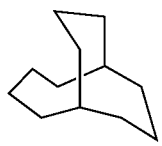
(34) 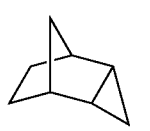
(35) 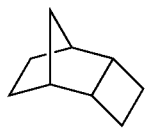
(36) 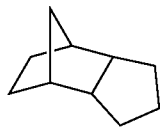
(37) 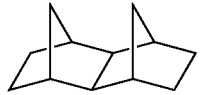
-continued
(38) 
(39) 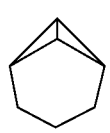
(40) 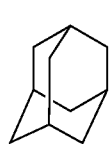
(41) 
(42) 
(43) 
(44) 
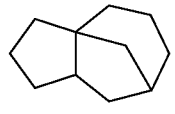
Among these alicyclic structures, preferred are (19), (23), (35) and (40), more preferred are (23) and (40).
Specific examples of the compound represented by formula (XA) are set forth below, however, the present invention is not limited to these specific examples.
XA-1
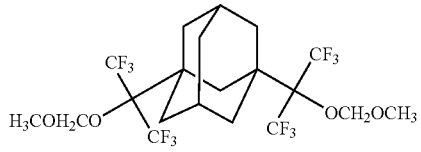
XA-2
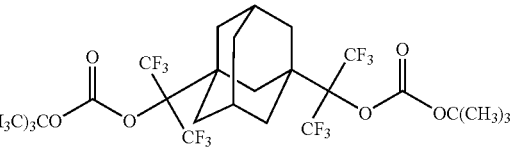

-continued
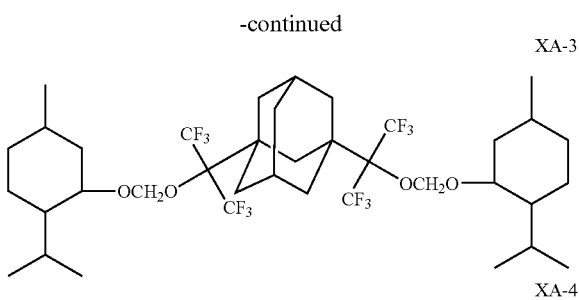
XA-3
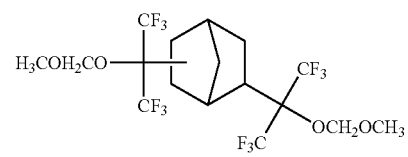
XA-4
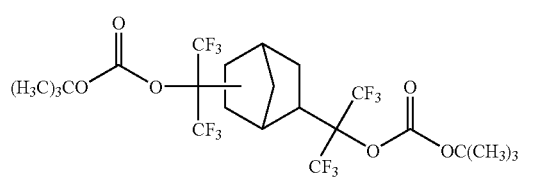
XA-5
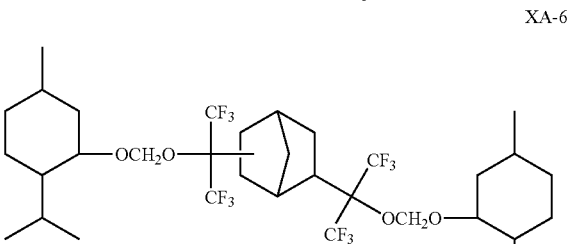
XA-6
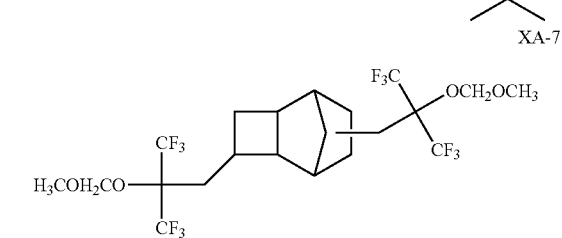
XA-7
-continued
XA-8
XA-9
XA-10
XA-11
Specific examples of the compound represented by formula (XB) are set forth below, however, the present invention is not limited to these specific examples.
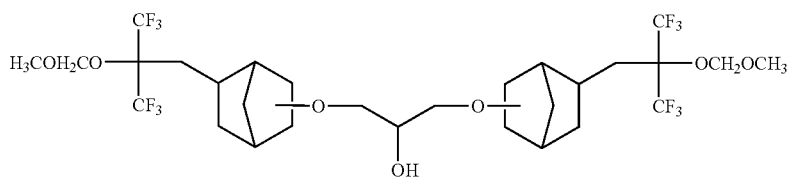
XB-1
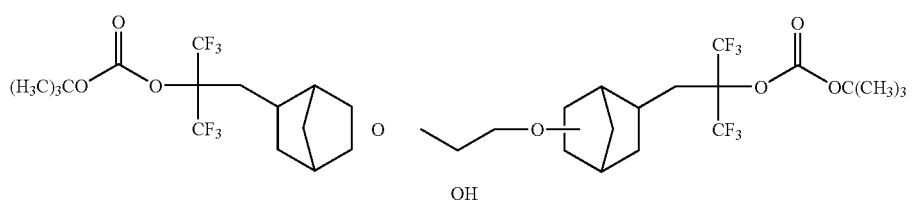
XB-2

-continued
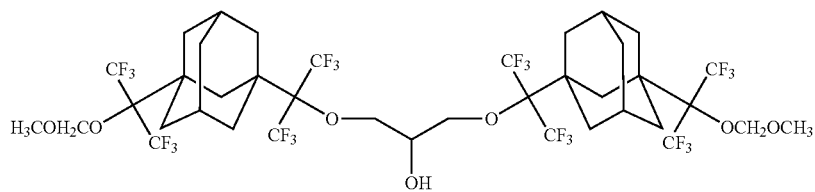
XB-3
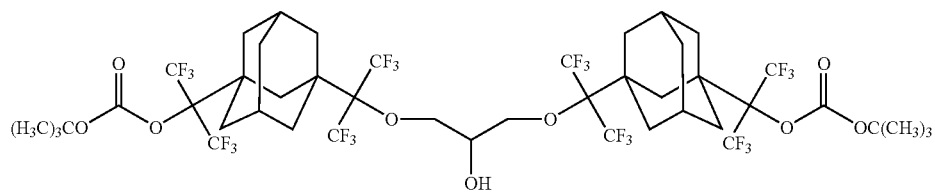
XB-4
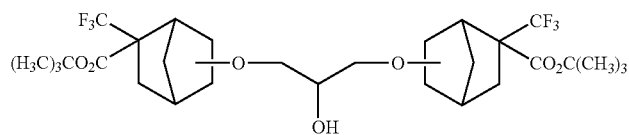
XB-5
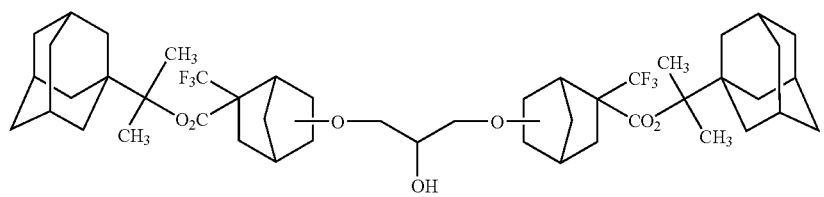
XB-6
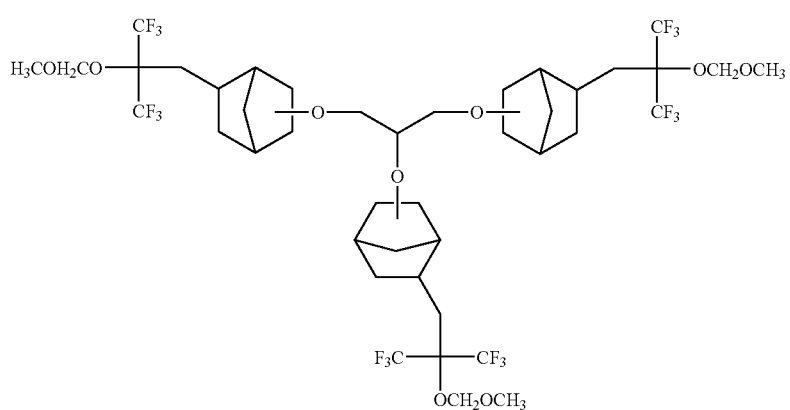
XB-7

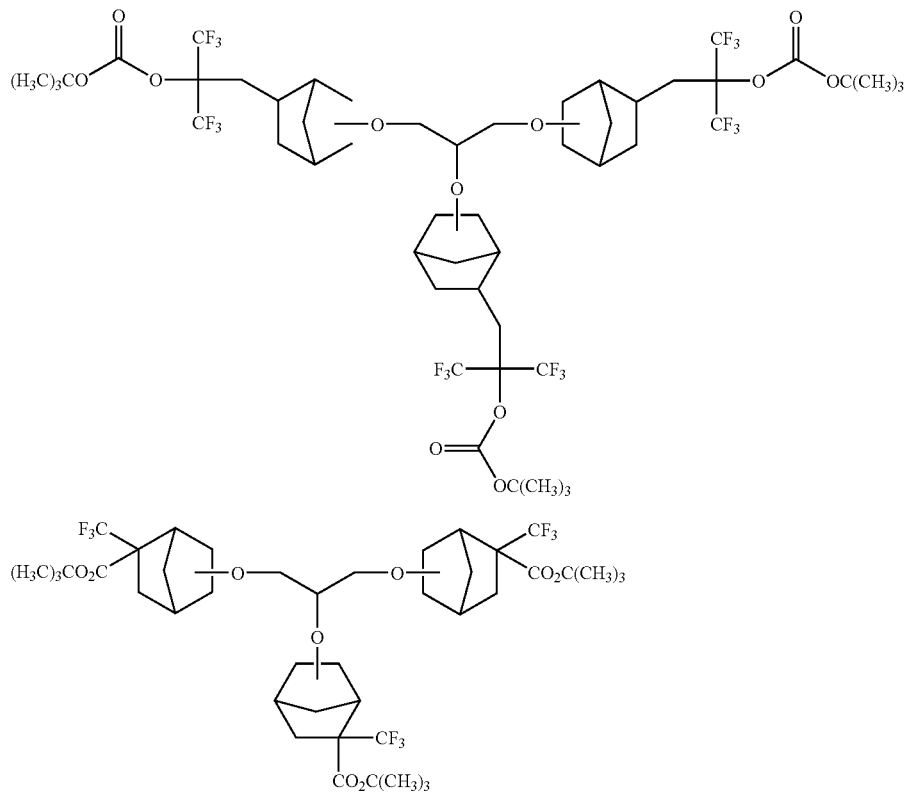

The non-polymer dissolution inhibitor (C) preferably contains a fluorine atom in its molecule. The number of fluorine-atoms contained in one molecule is preferably from 1 to 40, more preferably from 3 to 35, still more preferably from 5 to 30.

The amount of the non-polymer dissolution inhibitor (C) added is preferably from 3 to 50 mass %, more preferably from 5 to 40 mass %, still more preferably from 7 to 30 mass %, based on the polymer in the composition.

The non-polymer dissolution inhibitor (C) can be synthesized by protecting an easily available compound containing a plurality of alkali-soluble groups in one molecule with an acid-decomposable group according to a usual method or by connecting a plurality of easily available compounds each containing at least one alkali-soluble group in one molecule according to a usual method to synthesize a matrix molecule and then protecting it with an acid-decomposable group according to a usual method. The non-polymer dissolution inhibitor can also be synthesized by connecting a plurality of compounds each containing an alkali-soluble group which is previously protected with an acid-decomposable group.

[4] Fluorine- and/or Silicon-containing Surfactant (D)

The positive resist composition of the present invention preferably further contains (D) any one fluorine- and/or silicon-containing surfactant (a fluorine-containing surfactant, a silicon-containing surfactant or a surfactant containing both a fluorine atom and a silicon atom), or two or more thereof.

When the positive resist composition of the present invention contains this surfactant (D), a resist pattern with good sensitivity and resolution and less failure of adhesion and development can be obtained on use of an exposure light source of 250 nm or less, particularly 220 nm or less.

Examples of this surfactant (D) include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include fluorine-containing surfactants and silicon-containing surfactants, such as EFtop EF301 and EF303 (produced by Shin-Akita Kasei K. K.), Florad FC430 and 431 (produced by Sumitomo 3M Inc.), Megafac F171, F173, F176, F189 and $R_{08}$ (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, surfactants using a polymer having a fluoro-aliphatic group, which is derived from a fluoro-aliphatic compound produced by telomerization (also called telomer method) or oligomerization (also called oligomer method), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) group and block-linked poly(oxyethylene and oxypropylene) group. Furthermore, the copolymer of a fluoro-aliphatic group-containing monomer and a (poly(oxyalkylene)) acrylate (or methacrylate) may be not only a two-component copolymer but also a three or more component copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F-178, F-470, F-473, F-475, F-476 and F-472 (produced by Dainippon Ink & Chemicals, Inc.), copolymers of an acrylate (or methacrylate) having $C_6F_{13}$ group and a (poly(oxyalkylene)) acrylate (or methacrylate), copolymers of an acrylate (or methacrylate) having $C_6F_{13}$ group, a (poly(oxyethylene)) acrylate (or methacrylate) and a (poly(oxypropylene)) acrylate (or methacrylate), copolymers of an acrylate (or methacrylate) having $C_8F_{17}$ group and a (poly(oxyalkylene)) acrylate (or methacrylate), and copolymers of an acrylate (or methacrylate) having $C_8F_{17}$ group, a (poly(oxyethylene)) acrylate (or methacrylate) and a (poly(oxypropylene)) acrylate (or methacrylate).

The amount of the surfactant (D) used is preferably from 0.0001 to 2 mass %, more preferably from 0.001 to 1 mass %, based on the entire amount of the positive resist composition (excluding the solvent).

[5] Acid Diffusion Inhibitor (E)

In the composition of the present invention, an acid diffusion inhibitor is preferably added so as to prevent fluctuation in performance (formation of T-top shape of pattern, change in sensitivity, change in line width of pattern) due to aging after the irradiation of an actinic ray until the heat treatment, fluctuation in performance due to aging after coating, and excessive diffusion of acid (deterioration of resolution) at the heat treatment after the irradiation of an actinic ray. The acid diffusion inhibitor is an organic basic compound, for example, an organic base compound containing basic nitrogen, and a compound where the pKa value of the conjugate acid is 4 or more is preferably used.

Specific examples thereof include the following structures (A) to (E).

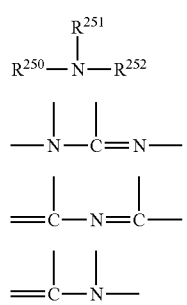

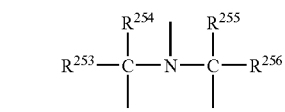

In these formulae, $R_{250}$, $R_{251}$ and $R_{252}$ may be the same or different and each represents a hydrogen atom, an alkyl group having from 1 to 20 carbon atoms, a cycloalkyl group having from 1 to 20 carbon atoms or a substituted or unsubstituted aryl group having from 6 to 20 carbon atoms, and $R^{251}$ and $R^{252}$ may combine with each other to form a ring.

The alkyl group may be unsubstituted or may have a substituent and the alkyl group having a substituent is preferably an aminoalkyl group having from 1 to 6 carbon atoms or a hydroxyalkyl group having from 1 to 6 carbon atoms.

$R^{253}$, $R^{254}$, $R^{255}$ and $R^{256}$ may be the same or different and each represents an alkyl group having from 1 to 6 carbon atoms.

The compound is more preferably a nitrogen-containing basic compound having two or more nitrogen atoms differing in the chemical environment within one molecule, still more preferably a compound containing both a substituted or unsubstituted amino group and a nitrogen atom-containing ring structure, or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include guanidine, 1,1-dimethylguanidine, 1,1,3,3-tetraitiethylguanidine, imidazole, 2-metilylirirdazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methyl-pyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine, however, the present invention is not limited thereto.

These nitrogen-containing basic compounds are used individually or in combination of two or more thereof.

The ratio of the acid generator and the organic basic compound used in the composition is preferably (acid generator)/(organic basic compound) (by mol)=2.5 to 300. By setting this molar ratio to 2.5 or more, high sensitivity is obtained and by setting to 300 or less, thickening of the resist pattern in aging after exposure until heat treatment can be reduced and the resolution can be increased. The (acid generator)/(organic basic compound) ratio (by mol) is more preferably from 5.0 to 200, still more preferably from 7.0 to 150.

The composition of the present invention is dissolved in a solvent capable of dissolving the above-described components and then coated on a support. Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used individually or in combination.

In the production or the like of a precision integrated circuit device, the step of forming a pattern on a resist film is performed by coating the positive resist composition of the present invention on a substrate (for example, silicon/silicon dioxide-coated transparent substrate such as glass substrate and ITO substrate), irradiating an actinic ray with use of an image-drawing apparatus, and then subjecting the resist film to heating, development, rinsing and drying, whereby a good resist pattern can be formed.

The alkali developer which can be used for the positive resist composition of the present invention is an aqueous solution of alkalis including inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide and tetraethylammonium hydroxide, and cyclic amines such as pyrrole and piperidine. Furthermore, to this aqueous solution of an alkali, an alcohol such as isopropyl alcohol and a surfactant such as nonionic surfactant may be added each in an appropriate amount.

Among these alkali developers, preferred is an aqueous solution of a quaternary ammonium salt, more preferred is an aqueous solution of tetramethylammonium hydroxide or choline.

The alkali concentration of the alkali developer is usually from 0.1 to 20 mass %.

The pH of the alkali developer is usually from 10.0 to 15.0.

EXAMPLE

The present invention is described in greater detail below by referring to Examples, however, the present invention is not limited thereto.

Synthesis Example of Resin

Synthesis Example 1 (Synthesis of Resin (A-1))

A 1 L-volume autoclave was charged with a 1,1,2-trichloro-trifluoroethylene 150-ml solution containing 15.4 g (0.10 mol) of bis(hydroxymethyl)norbornene and 19.4 g (0.10 mol) of tert-butyl norbornene-2-carboxylate and pressurized to 200 psi in a nitrogen atmosphere. Thereto, 20 g (0.20 mol) of tetrafluoroethylene was further injected and heated at 50° C. under stirring. Into this reaction solution, a 1,1,2-trichloro-trifluoroethylene 15-ml solution containing 1.2 g of di(4-tert-butylcyclo-hexyl)peroxydicarbonate was injected over 20 minutes and stirring was further continued for 20 hours. After the completion of reaction, the reaction solution was poured in 2 L of methanol while vigorously stirring and a white resin was precipitated. The precipitated resin was separated by filtration and dried in a vacuum to obtain 23.5 g of Resin (1). The molecular weight of Resin (1) as measured by GPC was 8,500 in terms of the weight average molecular weight (Mw) and the content of the component having a molecular weight of 1,000 or less was 15 mass %. The obtained Resin (1) was dissolved in acetone and after adding hexane to precipitate a resin and then removing the supernatant, the remaining solution was dried under reduced pressure to obtain Resin (A-1) of the present invention. The molecular weight of Resin (A-1) was 13,400 in terms of the weight average molecular weight and the content of the component having a molecular weight of 1,000 or less was 10 mass %.

Synthesis Example 2 (Synthesis of Resin (A-17))

A reaction vessel was charged with 11.05 g (0.06 mol) of 2-hydroxyethyl 2-tifluoromethylacrylate and 7.77 g (0.04 mol) of tert-butyl 5-norbornene-2-carboxylate and after purging the reaction system with nitrogen, 0.248 g (0.001 mol) of polymerization initiator V-65 (produced by Wako Pure Chemical Industries, Ltd.) was added. The resulting solution was stirred under heat at 65° C. while passing nitrogen to the reaction system and after 2 hours, 4 hours, 6 hours and 8 hours, 0.248 g of V-65 was added. The stirring under heat was performed for 20 hours in total. The resulting reaction solution was cooled to room temperature and added dropwise in 2 L of hexane. Then, the powder was collected by filtration and dried under reduced pressure at 50° C. to obtain 10.54 g of powder (yield: 56%). The weight average molecular weight of the obtained powder as measured by gel permeation chromatography (GPC) was 10,300 and the dispersity was 1.44. Also, as a result of analysis by 1H-NMR, 13C-NMR and 19F-NMR, the compositional ratio of 2-hydroxyethyl 2-trifluoromethylacrylate/tert-butyl 5-norbornene-2-carboxylate was 60/40.

Resins (A-2) to (A-4), (A-18) to (A-19), (A-26), (A-39) and (A-41) to (A-49) of the present invention were obtained in the same manner. The weight average molecular weight and dispersity of each resin obtained are shown below.

TABLE 1

| Resin | Weight Average Molecular Weight | Dispersity |
|---|---|---|
| A-1 | 13400 | 1.51 |
| A-2 | 11200 | 1.41 |
| A-3 | 11300 | 1.54 |
| A-4 | 9700 | 1.42 |
| A-17 | 10300 | 1.44 |
| A-18 | 11500 | 1.47 |
| A-19 | 8900 | 1.53 |
| A-26 | 9800 | 1.46 |
| A-39 | 10200 | 1.51 |
| A-41 | 9900 | 1.48 |
| A-43 | 8700 | 1.48 |
| A-46 | 9600 | 1.49 |
| A-48 | 8500 | 1.47 |
| A-49 | 9600 | 1.55 |

Synthesis Example of Non-Polymer Dissolution Inhibitor

Synthesis Example 3 (Synthesis of Dissolution Inhibitor (XB-5))

In 150 g of tetrahydrofuran, 147.9 g (0.564 mol) of tert-butyl 5-norbornene-2-trifluoromethyl-2-carboxylate was dissolved with stirring. While cooling the resulting solution, 750 ml of borane-tetrahydrofuran complex (1.0M solution) was added dropwise over 1 hour. After the dropwise addition, the solution was further stirred for 2 hours and then, 282 g of an aqueous sodium hydroxide solution (40 wt %) was added. Furthermore, 241.2 g of hydrogen peroxide (aqueous 30 wt % solution) was added dropwise over 1 hour and after the dropwise addition, the solution was further stirred for 3 hours. The resulting solution was neutralized with an aqueous HCl solution and then subjected to liquid separation by adding 600 g of ethyl acetate. The organic layer was dehydrated by using 50 g of magnesium sulfate and after removing the solvent by distillation, the product was purified by silica gel chromatography to obtain 134.37 g of Intermediate (M-1) (yield: 85%). (M-1)

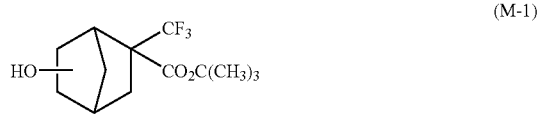

(2) Synthesis of Non-Polymer Dissolution Inhibitor (XB-5)

In a dried and nitrogen-purged reaction vessel, 500 ml of dehydrated tetrahydrofuran and 16 g (0.4 mol) of sodium hydroxide (60%) were added and cooled to 0° C. with stirring. Thereto, a dehydrated tetrahydrofuran solution (200 ml) containing 112.11 g (0.4 mol) of Intermediate (M-1) was added dropwise over 1 hours and after the dropwise addition, the solution was further stirred for 1 hour. Subsequently, a dehydrated tetrahydrofuran solution (200 ml) containing 27.40 g (0.2 mol) of epibromohydrin was added dropwise and after the dropwise addition, the reaction solution was further stirred for 3 hours while elevating the temperature to room temperature. Thereafter, the reaction solution was neutralized by adding an HCl solution and then subjected to liquid separation by adding ethyl acetate/water. The organic layer was dehydrated by using magnesium sulfate and after removing the solvent by distillation, the product was purified by silica gel chromatography to obtain 77.70 g of Non-Polymer Dissolution Inhibitor (XB-5) (yield: 63%).

Dissolution inhibitors of the present invention each was prepared in the same manner.

Examples 1 to 14 and Comparative Example 1

A polymer solution obtained by dissolving a resin (1.2 g), an acid generator (0.030 g), a surfactant (100 ppm based on the resin solution), an organic basic compound (0.0012 g) and a non-polymer dissolution inhibitor in 19.6 g of a solvent as shown in Table 2 was filtered through a 0.1-μm Teflon filter to prepare a positive resist solution.

Evaluation of Exposure (ArF):

The thus-prepared positive resist solution was applied by using a spin coater on a silicon wafer coated with an antireflective film (DUV42-6, produced by Brewer Science Inc.) and dried under heat at 120° C. for 60 seconds to obtain a positive resist film having a film thickness of 0.1 μm. The obtained resist film was pattern-exposed by using an ArFμ stepper and using a line-and-space mask (line/space=1/1) and immediately after exposure, heated on a hot plate at 130° C. for 90 seconds. Thereafter, the resist film was developed with an aqueous 2.38 wt % tetramethylammonium hydroxide solution at 23° C. for 60 seconds, rinsed with pure water for 30 seconds and then dried. The obtained resist pattern was evaluated on the resist performances by the following methods.

[Evaluation of Top Profile]

The top of the line pattern with a line width of 0.15 μm was observed by cross-section SEM (scanning electron microscope) and out of the top surface of pattern, the length of the portion in parallel to the substrate was measured. A length closer to 0.15 μm is better.

[Evaluation of Scumming]

The scumming was evaluated by the degree of remaining scum (development residue) in the resist pattern with a line width of 0.15 μm. No residue was rated A, a fairly large residue was rated C, and the residue intermediate therebetween was rated B.

TABLE 2

| | Resin | Acid Generator (weight ratio) | Solvent (weight ratio) | Dissolution Inhibitor (mass % based on resin) | Basic Compound | Surfactant | Top Profile (μm) | Scum |
|---|---|---|---|---|---|---|---|---|
| Example 1 | A-1 | VII-2 | S-2 | XB-5 (25.0) | N-2 | D-1 | 0.146 | A |
| Example 2 | A-2 | VII-2 | S-2/S-3 (80/20) | XA-7 (20.5) | N-2 | D-2 | 0.138 | A |
| Example 3 | A-3 | VII-11/I-4f (95/5) | S-2 | XA-8 (15.0) | N-1 | D-2 | 0.145 | A |

TABLE 2-continued

| | Resin | Acid Generator (weight ratio) | Solvent (weight ratio) | Dissolution Inhibitor (mass % based on resin) | Basic Compound | Surfactant | Top Profile (μm) | Scum |
|---|---|---|---|---|---|---|---|---|
| Example 4 | A-4 | VII-36 | S-2/S-1 (80/20) | XA-10 (18.0) | N-2 | D-1 | 0.145 | A |
| Example 5 | A-17 | VII-3 | S-2 | XB-2 (23.0) | N-3 | D-2 | 0.146 | A |
| Example 6 | A-18 | VII-36/I-1f (90/10) | S-2 | XB-4 (25.0) | N-3 | D-2 | 0.137 | A |
| Example 7 | A-19 | VII-2 | S-2 | XB-8 (16.5) | N-2 | D-2 | 0.146 | A |
| Example 8 | A-26 | VII-2 | S-2 | XB-9 (22.0) | N-3 | D-1 | 0.144 | A |
| Example 9 | A-39 | VII-3 | S-2/S-3 (80/20) | XA-5 (30.5) | N-1 | D-1 | 0.139 | A |
| Example 10 | A-41 | VII-11 | S-2 | XB-3 (30.0) | N-2 | D-1 | 0.142 | A |
| Example 11 | A-43 | VII-2 | S-2 | XB-5 (25.0) | N-2 | D-1 | 0.145 | A |
| Example 12 | A-46 | VII-3 | S-2/S-3 (80/20) | XA-8 (15.0) | N-3 | D-2 | 0.138 | A |
| Example 13 | A-48 | VII-2 | S-2 | XA-10 (10.0) | N-2 | D-2 | 0.138 | A |
| Example 14 | A-49 | VII-36 | S-2/S-1 (80/20) | XA-8 (15.0) | N-3 | D-1 | 0.142 | A |
| Comparative Example 1 | A-1 | VII-2 | S-2 | X0 (20.0) | N-2 | D-1 | 0.047 | C |

In Table 2, the symbols indicate the followings.
N-1: hexamethylenetetramine
N-2: 1,5-diazabicyclo[4.3.0]-5-nonene
N-3: 1,8-diazabicyclo[5.4.0]-7-undecene
D-1: Megafac F176 (produced by Dainippon Ink & Chemicals, Inc.) (fluorine-containing surfactant)
D-2: Megafac R08 (produced by Dainippon Ink & Chemicals, Inc.) (surfactant containing fluorine and silicon)
S-1: methyl lactate
S-2: propylene glycol monomethyl ether acetate
S-3: propylene glycol monomethyl ether (X0)

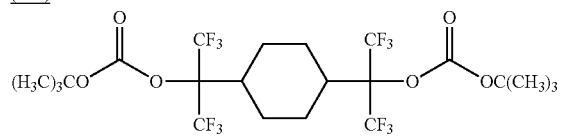

As seen from the results in Table 2, the composition of the present invention gives an excellent top profile and less causes scumming.

According to the present invention, a positive resist composition exhibiting sufficiently high transmittance on use of a light source of 157 nm and being improved in the top profile and inhibition of scumming can be provided.

The entire disclosure of each and every foreign patent application from which the benefit of foreign priority has been claimed in the present application is incorporated herein by reference, as if fully set forth.

What is claimed is:

1. A positive resist composition comprising:
   (A) a fluorine atom-containing resin;
   (B) a compound generating an acid upon irradiation with an actinic ray; and
   (C) a non-polymer dissolution inhibitor represented by one of formula (XA) and formula (XB):

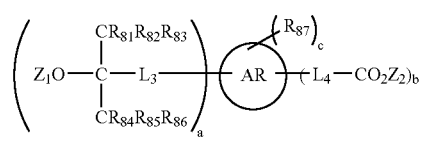

-continued

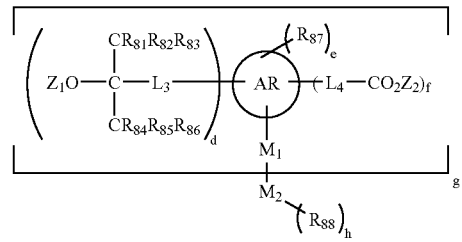

wherein the compound of formula (XA) is a fluorine-containing compound,

AR each independently represents an alicyclic hydrocarbon group having 7 or more carbon atoms selected from the group consisting of structures (a), (b), (c) and (d):

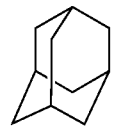

-continued

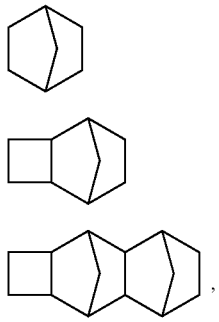

$R_{81}$ to $R_{86}$ each independently represents a hydrogen atom, a fluorine atom or an alkyl group, provided that at least one of $R_{81}$ to $R_{86}$ is a fluorine atom, $R_{87}$ and $R_{88}$ each independently represents a halogen atom, a hydroxy group, an alkoxy group, a cyano group or an unsubstituted alkyl group, $L_3$ in formula (XA) represents a single bond, an alkylene group, a cycloalkylene group, an arylene group or a combination of such a group with a thioether group, a carbonyl group, an ester group, an amido, group a sulfonamido group, a urethane group or a urea group, and $L_3$ in formula (XB) and $L_4$ in formulas (XA) and (XB) each independently represents a single bond or a divalent linking group, $Z_1$ and $Z_2$ each independently represents a hydrogen atom, an acid-decomposable group or a non-acid-decomposable group, provided that the compounds represented by formulae (XA) and (XB) each contains two or more acid-decomposable groups, $M_1$ represents a single bond or a divalent linking group, $M_2$ represents a (g+h)-valent linking group, a represents an integer of 1 to 5 and b represents an integer of 0 to 5, provided that a and b satisfy $2 \leq a+b \leq 10$, c represents an integer of 0 to 5, d and e each independently represents an integer of 0 to 5, provided that d and e satisfy $1 \leq d+e \leq 10$, f each independently represents an integer of 0 to 5, g represents an integer of 2 to 6, and h represents an integer of 0 to 5.

2. The positive resist composition according to claim 1, wherein the resin (A) is soluble in an alkaline developer.

3. The positive resist composition according to claim 1, wherein the resin (A) is a resin which decomposes under the action of an acid to increase a solubility of the resin (A) in an alkali developer.

4. The positive resist composition according to claim 1, wherein the resin (A) comprises a repeating unit containing a group represented by formula (a):

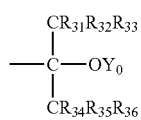

wherein $R_{31}$ to $R_{36}$ each independently represents a hydrogen atom, a fluorine atom or an alkyl group, provided that at least one of $R_{31}$ to $R_{36}$ is a fluorine atom or an alkyl group in which at least one of the hydrogen atoms has been substituted by a fluorine atom, and one of $R_{31}$ to $R_{36}$ may form a single bond or a carbon chain to be connected to a main chain of the resin (A); and $Y_0$ represents a hydrogen atom or an organic group.

5. The positive resist composition according to claim 1, wherein the resin (A) has a repeating unit containing one of (a) a carboxyl group and (b) a group where a carboxyl group is protected by an acid-decomposable group.

6. The positive resist composition according to claim 1, wherein the resin (A) comprises at least one repeating unit selected from the group consisting of repeating units represented by the formulae (I) to (XII):

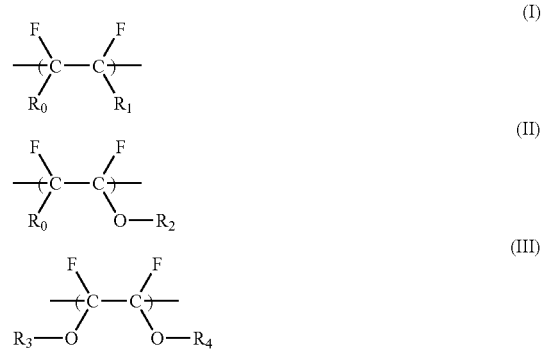

wherein $R_0$ and $R_1$ are the same or different and each represents a hydrogen atom, a fluorine atom, an alkyl group, a cycloalkyl group or an aryl group;

$R_2$ to $R_4$ are the same or different and each represents an alkyl group, a cycloalkyl group or an aryl group; and $R_0$ and $R_1$, $R_0$ and $R_2$, or $R_3$ and $R_4$ may combine to form a ring,

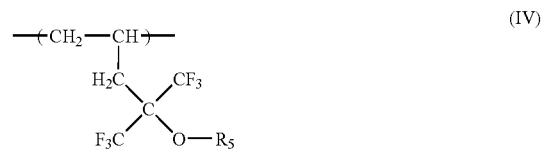

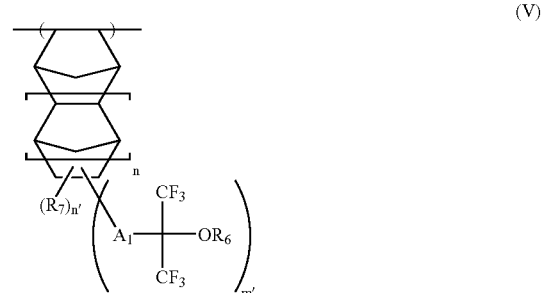

wherein $R_5$ represents a hydrogen atom, an alkyl group, a cycloalkyl group, an acyl group, an alkoxycarbonyl group or an acid-decomposable group;

$R_6$ represents a hydrogen atom, an alkyl group, a cycloalkyl group, an acyl group, an alkoxycarbonyl group or an acid-decomposable group;

$R_7$ each independently represents a halogen atom, an alkyl group, a cycloalkyl group or an alkoxy group;

n represents 0 or 1;
n' represents an integer of 0 to 7;
m' represents an integer of 1 to 5;
$A_1$ represents a single bond, a divalent alkylene, alkenylene, cycloalkylene or arylene group, —O—CO—$R_{22}$—, —CO—O—$R_{23}$— or —CO—N($R_{24}$)—$R_{25}$—;
$R_{22}$, $R_{23}$ and $R_{25}$ each represents a single bond or a divalent alkylene, alkenylene, cycloalkylene or arylene group which may have an ether group, an ester group, an amido group, a urethane group or a ureido group; and
$R_{24}$ represents a hydrogen atom, an alkyl group, a cycloalkyl group, an aralkyl group or an aryl group,

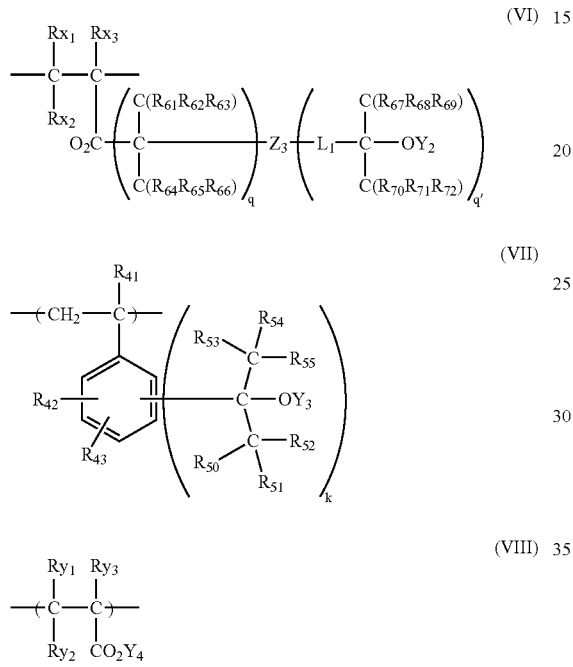

wherein in formula (VI),
$Rx_1$ to $Rx_3$ each independently represents a hydrogen atom, a fluorine atom, a chlorine atom, a cyano group or an alkyl group where at least one hydrogen atom is substituted by a fluorine atom;
$R_{61}$ to $R_{66}$ each independently represents a hydrogen atom, a fluorine atom or an alkyl group, provided that at least one of $R_{61}$ to $R_{66}$ is a fluorine atom;
$R_{67}$ to $R_{72}$ each independently represents a hydrogen atom, a fluorine atom or an alkyl group, provided that at least one of $R_{67}$ to $R_{72}$ is a fluorine atom;
$Z_3$ represents a benzene residue, a cyclohexane residue, an adamantane residue or a norbornane residue;
$L_1$ represents a single bond or a divalent linking group;
q represents 0 or 1;
q' represents an integer of 1 to 5; and
$Y_2$ represents a hydrogen atom or an organic group,
in formula (VII),
$R_{41}$ represents a hydrogen atom, a halogen atom, a cyano group or an alkyl group;
$R_{42}$ and $R_{43}$ each independently represents a hydrogen atom, a halogen atom, a hydroxyl group, a cyano group, an alkoxy group, an acyl group, an alkyl group, an alkenyl group, an aralkyl group or an aryl group;
$R_{50}$ to $R_{55}$ each independently represents a hydrogen atom, a fluorine atom or an alkyl group, provided that at least one of $R_{50}$ to $R_{55}$ is a fluorine atom or an alkyl group where at least one hydrogen atom is substituted by a fluorine atom;
k represents an integer of 1 to 5; and
$Y_3$ represents a hydrogen atom or an organic group, and
in formula (VIII),
$Ry_1$ to $Ry_3$ each independently represents a hydrogen atom, a fluorine atom, a chlorine atom, a cyano group or an alkyl group where at least one hydrogen atom is substituted by a fluorine atom;

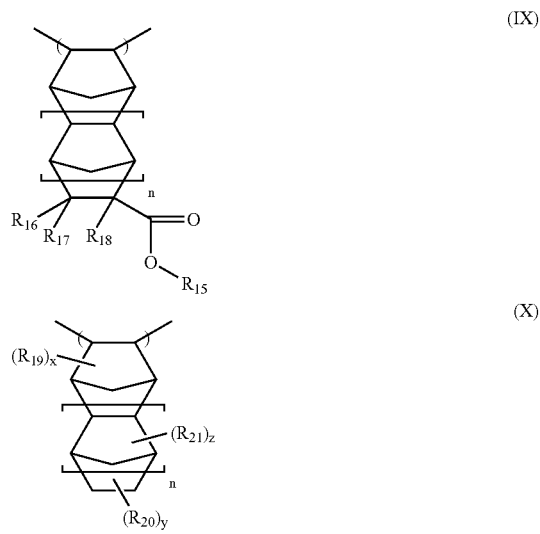

wherein
$R_{15}$ represents a hydrogen atom, a hydroxyalkyl group, an alkyl group having a fluorine atom, a cycloalkyl group having a fluorine atom, an alkenyl group having a fluorine atom, an aralkyl group having a fluorine atom, an aryl group having a fluorine atom, or an acid-decomposable group;
$R_{16}$, $R_{17}$ and $R_{18}$ are the same or different and each represents a hydrogen atom, a halogen atom, a cyano group, an alkyl group, an alkoxy group or —CO—O—$R_{15}$;
$R_{19}$, $R_{20}$ and $R_{21}$ are the same or different and each represents a hydrogen atom, a fluorine atom, an alkyl group having a fluorine atom, a cycloalkyl group having a fluorine atom, an alkenyl group having a fluorine atom, an aralkyl group having a fluorine atom, an aryl group having a fluorine atom, an alkoxy group having a fluorine atom, or a hydroxyalkyl group, provided that at least one of $R_{19}$, $R_{20}$ and $R_{21}$ is a group except for a hydrogen atom;
n represents 0 or 1; and
x, y and z each represents an integer of 0 to 4;

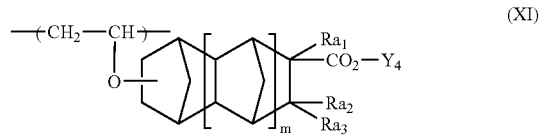

-continued (XII)

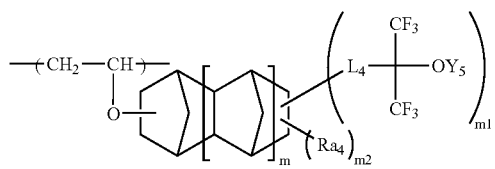

wherein in formula (XI),
$Ra_1$ to $Ra_3$ each independently represents a hydrogen atom, a halogen atom, a hydroxyl group, a cyano group, an alkyl group, an aryl group, an alkoxy group or an aralkyl group;
$Y_4$ represents a hydrogen atom or an organic group; and
m represents 1 or 2; and
in formula (XII),
$Ra_4$ each independently represents a hydrogen atom, a halogen atom, a hydroxyl group, a cyano group, an alkyl group, an aryl group, an alkoxy group or an aralkyl group,
$Y_5$ represents a hydrogen atom or an organic group;
$L_4$ represents a single bond or a divalent linking group;
m represents 1 or 2;
m1 represents an integer of 1 to 5; and
m2 represents an integer of 0 to 7.

7. The positive resist composition according to claim 1, further comprising (E) a basic compound.

8. The positive resist composition according to claim 1, wherein the compound (B) comprises (B1) a compound generating an organic sulfonic acid under the action of an actinic ray.

9. The positive resist composition according to claim 8, wherein the compound (B1) comprises (a) a compound generating an organic sulfonic acid containing at least one fluorine atom under the action of an actinic ray and (b) a compound generating an organic sulfonic acid containing no fluorine atom under the action of an actinic ray.

10. The positive resist composition according to claim 8, wherein the component (B) further comprises (B2) a compound generating a carboxylic acid under the action of an actinic ray.

11. The positive resist composition according to claim 1, further comprising a surfactant.

12. The positive resist composition according to claim 1, further comprising a solvent.

13. The positive resist composition according to claim 12, wherein the solvent comprises propylene glycol monomethyl ether acetate.

14. The positive resist composition according to claim 13, wherein the solvent comprises propylene glycol monomethyl ether.

15. A method of forming a resist pattern comprising:
coating the positive resist composition according to claim 1 on a substrate, to form a resultant coating;
irradiating the resultant coating with an actinic ray, to form a irradiated coating; and
developing the irradiated coating.

16. The positive resist composition according to claim 1, wherein $L_3$ in formula (XA) or (XB) represents an alkylene group, a cycloalkylene group or an arylene group.

17. A positive resist composition comprising:
(A) a fluorine atom-containing resin;
(B) a compound generating an acid upon irradiation with an actinic ray;

(C) a non-polymer dissolution inhibitor represented by one of formula (XA) and formula (XB); and
a mixed solvent comprising propylene glycol monomethyl ether acetate and propylene glycol monomethyl ether:

(XA)

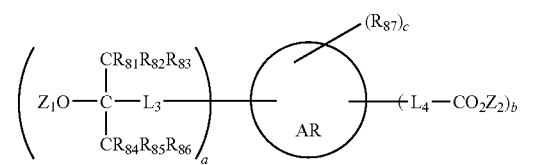

(XB)

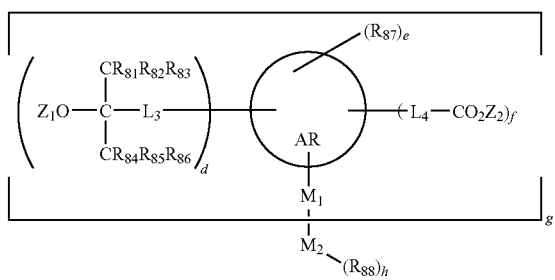

wherein
the compound of formula (XA) is a fluorine-containing compound,
AR each independently represents an alicyclic hydrocarbon group having 7 or more carbon atoms,
$R_{81}$ to $R_{86}$ each independently represents a hydrogen atom, a fluorine atom or an alkyl group, provided that at least one of $R_{81}$ to $R_{86}$ is a fluorine atom,
$R_{87}$ and $R_{88}$ each independently represents a halogen atom, a hydroxy group, an alkoxy group, a cyano group or an unsubstituted alkyl group,
$L_3$ and $L_4$ each independently represents a single bond or a divalent linking group,
$Z_1$ and $Z_2$ each independently represents a hydrogen atom, an acid-decomposable group or a non-acid-decomposable group, provided that the compounds represented by formulae (XA) and (XB) each contains two or more acid-decomposable groups,
$M_1$ represents a single bond or a divalent linking group,
$M_2$ represents a (g+h)-valent linking group,
a represents an integer of 1 to 5 and b represents an integer of 0 to 5, provided that a and b satisfy $2 \leq a+b \leq 10$,
c represents an integer of 0 to 5,
d and e each independently represents an integer of 0 to 5, provided that d and e satisfy $1 \leq d+e \leq 10$,
f each independently represents an integer of 0 to 5,
g represents an integer of 2 to 6, and
h represents an integer of 0 to 5.

18. A method of forming a resist pattern comprising:
coating the positive resist composition according to claim 17 on a substrate, to form a resultant coating;
irradiating the resultant coating with an actinic ray, to form an irradiated coating; and developing the irradiated coating.

19. A positive resist composition comprising:
(A) a fluorine atom-containing resin;
(B) a compound generating an acid upon irradiation with an actinic ray;
(C) a non-polymer dissolution inhibitor represented by one of formula (XA) and formula (XB); and a mixed solvent comprising propylene glycol monomethyl ether acetate and propylene glycol monomethyl ether:

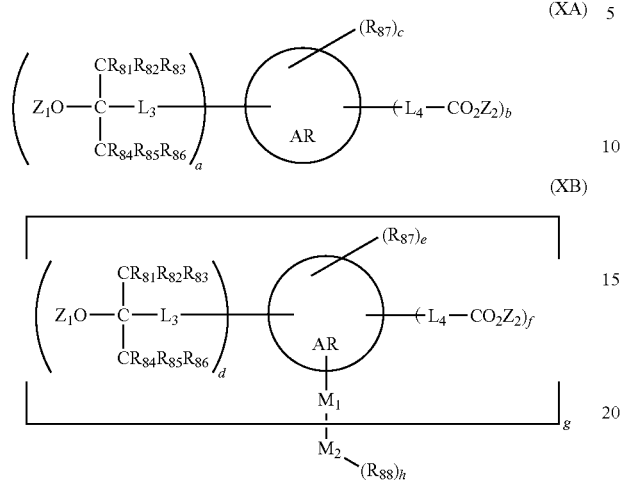

wherein
the compound of formula (XA) is a fluorine-containing compound,
AR each independently represents an alicyclic hydrocarbon group having 7 or more carbon atoms,
$R_{81}$ to $R_{86}$ each independently represents a hydrogen atom, a fluorine atom or an alkyl group, provided that at least one of $R_{81}$ to $R_{86}$ is a fluorine atom,
$R_{87}$ and $R_{88}$ each independently represents a halogen atom, a hydroxy group, an alkoxy group, a cyano group or an alkyl group,
$L_3$ and $L_4$ each independently represents a single bond or a divalent linking group,
$Z_1$ and $Z_2$ each independently represents a hydrogen atom, an acid-decomposable group or a non-acid-decomposable group, provided that the compounds represented by formulae (XA) and (XB) each contains two or more acid-decomposable groups,
$M_1$ represents a single bond or a divalent linking group,
$M_2$ represents a branched or cyclic hydrocarbon residue having 1-20 carbon atoms or an aromatic ring residue having 6-20 carbon atoms, in which such groups may be substituted by —O—, —$CO_2$—, —CO—, —$SO_2$—, or —SO— between the carbon-carbon bond,
a represents an integer of 1 to 5 and b represents an integer of 0 to 5, provided that a and b satisfy $2 \leq a+b \leq 10$,
c represents an integer of 0 to 5,
d and e each independently represents an integer of 0 to 5, provided that d and e satisfy $1 \leq d+e \leq 10$,
f each independently represents an integer of 0 to 5,
g represents an integer of 2 to 6, and
h represents an integer of 0 to 5.

20. A method of forming a resist pattern comprising:
coating the positive resist composition according to claim 19 on a substrate, to form a resultant coating;
irradiating the resultant coating with an actinic ray, to form an irradiated coating; and developing the irradiated coating.

21. A positive resist composition comprising:
(A) a fluorine atom-containing resin;
(B) a compound generating an acid upon irradiation with an actinic ray; and
(C) a non-polymer dissolution inhibitor represented by one of formula (XA) and formula (XB):

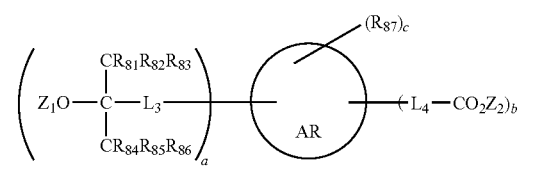

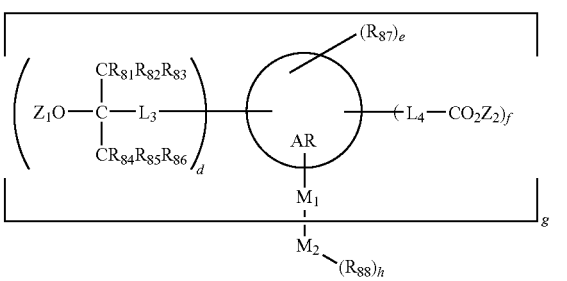

wherein
the compound of formula (XA) is a fluorine-containing compound,
AR each independently represents an alicyclic hydrocarbon group having 7 or more carbon atoms,
$R_{81}$ to $R_{86}$ each independently represents a hydrogen atom, a fluorine atom or an alkyl group, provided that at least one of $R_{81}$ to $R_{86}$ is a fluorine atom,
$R_{87}$ and $R_{88}$ each independently represents a halogen atom, a hydroxy group, an alkoxy group, a cyano group or an unsubstituted alkyl group,
$L_3$ in formulas (XA) and (XB) represents an alkylene group, a cycloalkylene group, or an arylene group, and
$L_4$ in formulas (XA) and (XB) each independently represents a single bond or a divalent linking group,
$Z_1$ and $Z_2$ each independently represents a hydrogen atom, an acid-decomposable group or a non-acid-decomposable group, provided that the compounds represented by formulae (XA) and (XB) each contains two or more acid-decomposable groups,
$M_1$ represents a single bond or a divalent linking group,
$M_2$ represents a (g+h)-valent linking group,
a represents an integer of 1 to 5 and b represents an integer of 0 to 5, provided that a and b satisfy $2 \leq a+b \leq 10$,
c represents an integer of 0 to 5,
d and e each independently represents an integer of 0 to 5, provided that d and e satisfy $1 \leq d+e \leq 10$,
f each independently represents an integer of 0 to 5,
g represents an integer of 2 to 6, and
h represents an integer of 0 to 5.

* * * * *